(12) United States Patent
Löper et al.

(10) Patent No.: US 11,257,974 B2
(45) Date of Patent: Feb. 22, 2022

(54) SILICON HETEROJUNCTION SOLAR CELLS AND METHODS OF MANUFACTURE

(71) Applicant: ECOLE POLYTECHNIQUE FÉDÉRALE DE LAUSANNE (EPFL), Lausanne (CH)

(72) Inventors: Philipp Löper, Basel (CH); Andrea Ingenito, Neuchâtel (CH); Christophe Ballif, Neuchâtel (CH); Gizem Nogay, Neuchâtel (CH)

(73) Assignee: ECOLE POLYTECHNIQUE FÉDÉRALE DE LAUSANNE (EPFL), Lausanne (CH)

( * ) Notice: Subject to any disclaimer, the term of this patent is extended or adjusted under 35 U.S.C. 154(b) by 198 days.

(21) Appl. No.: 16/468,159

(22) PCT Filed: Nov. 13, 2017

(86) PCT No.: PCT/EP2017/078999
§ 371 (c)(1),
(2) Date: Jun. 10, 2019

(87) PCT Pub. No.: WO2018/108403
PCT Pub. Date: Jun. 21, 2018

(65) Prior Publication Data
US 2020/0075789 A1    Mar. 5, 2020

(30) Foreign Application Priority Data

Dec. 12, 2016 (EP) ..................... 16203360
Dec. 12, 2016 (EP) ..................... 16203362
Apr. 18, 2017 (EP) ..................... 17166961

(51) Int. Cl.
*H01L 31/0747* (2012.01)
*H01L 31/0216* (2014.01)
(Continued)

(52) U.S. Cl.
CPC .... *H01L 31/0747* (2013.01); *H01L 31/02167* (2013.01); *H01L 31/022475* (2013.01); *H01L 31/202* (2013.01); *H01L 31/208* (2013.01)

(58) Field of Classification Search
CPC .......... H01L 31/0747; H01L 31/02167; H01L 31/022475; H01L 31/202; H01L 31/208
See application file for complete search history.

(56) References Cited

U.S. PATENT DOCUMENTS 9,246,033 B2 * 1/2016 Hekmatshoar-Tabari ...................
B82Y 20/00
2007/0068571 A1 * 3/2007 Li ....................... H01L 31/0488
136/258
(Continued)

FOREIGN PATENT DOCUMENTS

WO    2017182472    10/2017

OTHER PUBLICATIONS

Feldmann Frank et al, "Tunnel oxide passivated contacts as an alternative to partial rear contacts", Solar Energy Materials and Solar Cells, Elsevier Science Publishers, Amsterdam, NL, (Jul. 10, 2014), vol. 131, doi:10.1016/J.SOLMAT.2014.06.015, ISSN 0927-0248, pp. 46-50, XP029075025 [A] 1,17 the whole document DOI: http://dx.doi.org/10.1016/j.solmat.2014.06.015.
(Continued)

*Primary Examiner* — Golam Mowla
(74) *Attorney, Agent, or Firm* — Duane Morris LLP; Gregory M. Lefkowitz

(57) ABSTRACT

The present invention relates to a solar cell comprising a heterojunction photoelectric device comprising, a front electrode layer, a back electrode layer comprising a metallic contact layer, a light-absorbing silicon layer arranged between said front electrode and said back electrode layers and a doped silicon-based layer arranged between said light-absorbing silicon layer and said back electrode layer,
(Continued)

characterized in that said heterojunction photoelectric device further comprises a wide band gap material layer having an electronic band gap greater than 1.4 eV, said wide band gap material layer being applied on a surface of the light-absorbing silicon layer between said light-absorbing silicon layer and said doped silicon-based layer. The present heterojunction layer or stack of layers is compatible with thermal annealing and firing processes at T above 600° C.

23 Claims, 46 Drawing Sheets

(51) Int. Cl.
*H01L 31/0224* (2006.01)
*H01L 31/20* (2006.01)

(56) References Cited

U.S. PATENT DOCUMENTS

| | | | |
|---|---|---|---|
| 2011/0277825 A1* | 11/2011 | Fu | H01L 31/202 136/255 |
| 2013/0014811 A1* | 1/2013 | Bedell | H01L 31/03046 136/255 |
| 2013/0220417 A1* | 8/2013 | Baba | H01L 31/02167 136/258 |
| 2013/0247965 A1* | 9/2013 | Swanson | H01L 31/072 136/252 |
| 2015/0214393 A1* | 7/2015 | Hayashida | H01L 31/0747 136/256 |

OTHER PUBLICATIONS

Feldmann Frank et al, "Passivated rear contacts for high-efficiency n-type Si solar cells providing high interface passivation quality and excellent transport characteristics", Solar Energy Materials and Solar Cells, (Jan. 1, 2014), vol. 120, doi: 10.1016/J.SOLMAT.2013. 09.017, ISSN 0927-0248, pp. 270-274, XP028775081 [A] 1,17 the whole document DOI: http://dx.doi.org/10.1016/j.solmat.2013.09. 017.

Stuckelberger et al, "Passivating electron contact based on highly crystalline nanostructured silicon oxide layers for silicon solar cells", Solar Energy Materials and Solar Cells, Elsevier Science Publishers, Amsterdam, NL, (2016), vol. 158, pp. 2-10.

Nemeth et al, "Polycrystalline silicon passivated tunneling contacts for high efficiency silicon solar cells", Journal of Materials Research, US, (2016), vol. 31, No. 06, pp. 671-681.

Kaining et al, "Silicon heterojunction solar cell with amorphous silicon oxide buffer and microcrystalline silicon oxide contact layers", Physica Status Solidi. Rapid Research Letters, DE, (2012), vol. 6, No. 5, pp. 193-195.

Feldmann et al, "Carrier-selective contacts for Si solar cells", Applied Physics Letters, A I P Publishing LLC, US, vol. 104, No. 18, (2014).

Stuckelberger et al, "Passivating contacts for silicon solar cells with 800° C. stability based on tunnel-oxide and highly crystalline thin silicon layer", 2016 IEEE 43rd Photovoltaic Specialists Conference (PVSC), IEEE, (2016), pp. 2518-2521.

Kobayashi et al, "Light-induced performance increase of silicon heterojunction solar cells", Appl. Phys. Lett. 109, 153503, (2016).

Nogay et al, "Silicon-Rich Silicon Carbide Hole-Selective Rear Contacts for Crystalline-Silicon-Based Solar Cells", ACS Applied Materials & Interfaces, (2016), vol. 8, pp. 35660-35667.

Cliff et al, "The quantitative analysis of thin specimens", J. Microsc., (1975), vol. 103, pp. 203-207.

Beyer, "Diffusion and evolution of hydrogen in hydrogenated amorphous and microcrystalline silicon", Sol. Energy Mater. Sol. Cells, (2003), vol. 78, pp. 235-267.

Cuevas, "Physical model of back line-contact front-junction solar cells", J. Appl. Phys. 113, 164502, (2013).

Street, "Hydrogenated Amorphous Silicon" Cambridge University Press—Technology & Engineering, (2005), p. 20.

Beyer, "Hydrogen incorporation, stability and release effects in thin film silicon", Phys. Status Solidi A, 213, No. 7, (2016), 1661-1674.

User Manual, "Sentaurus Device", Version Y-2006.06, Synopsys, Inc. (2006).

\* cited by examiner

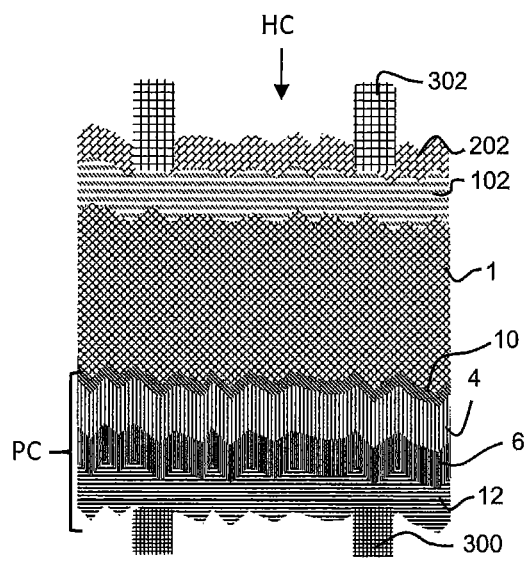
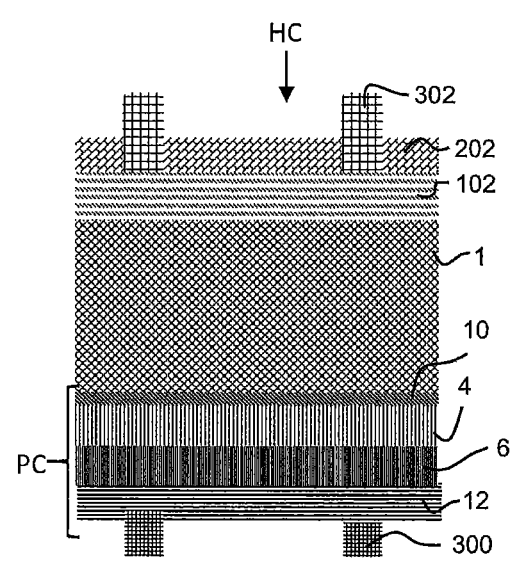
Fig. 2A
Fig. 2B
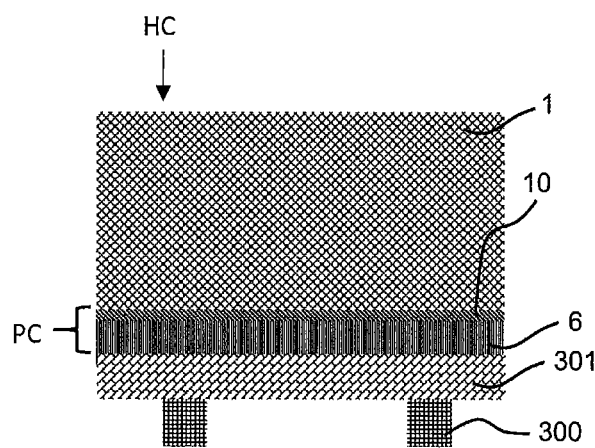
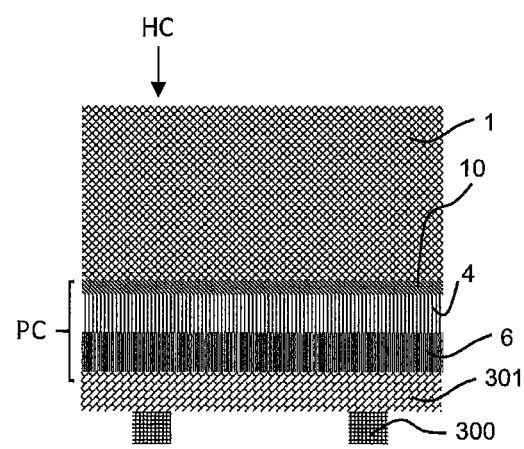
Fig. 5A
Fig. 5B

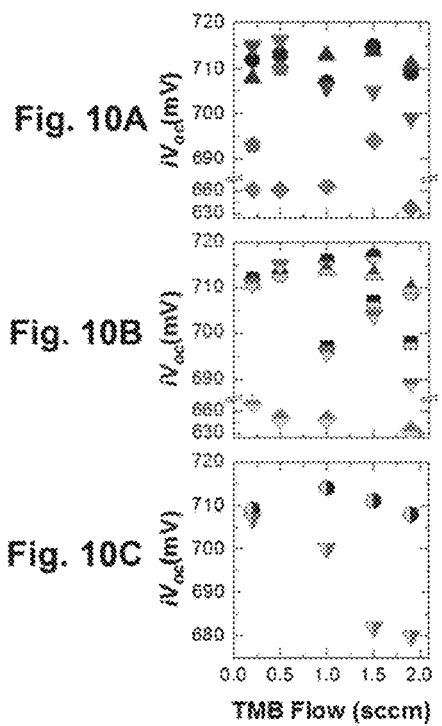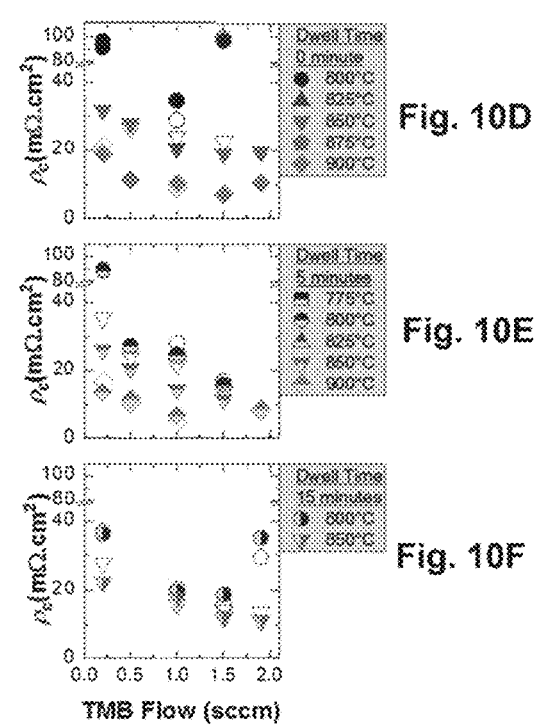

800 °C ; 5 min

800 °C ; 5 min

Co-diffused
800 °C ; 5 min

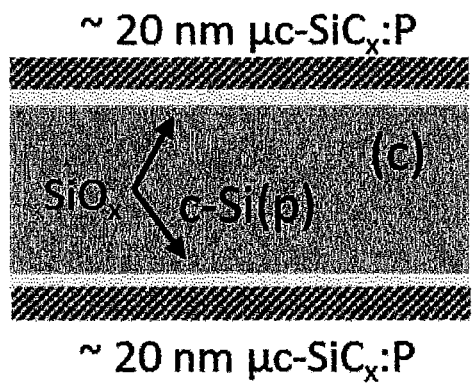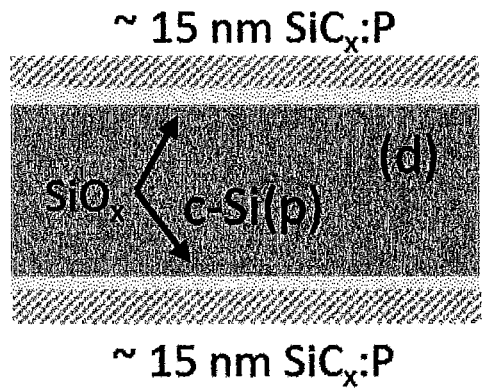
Fig. 19C      Fig. 19D
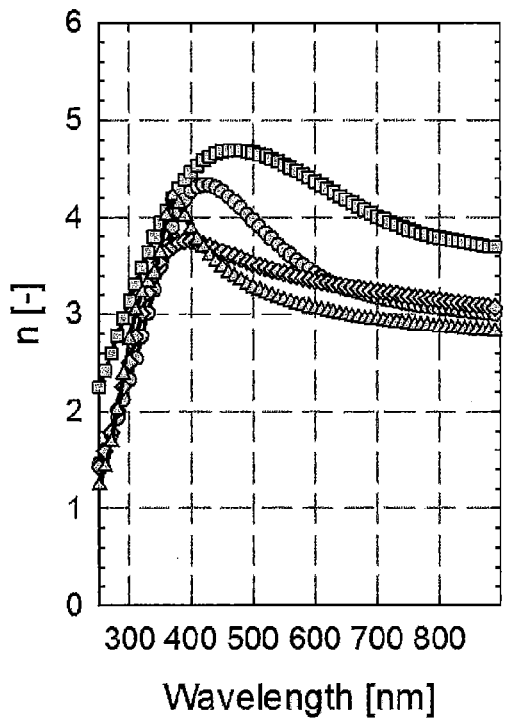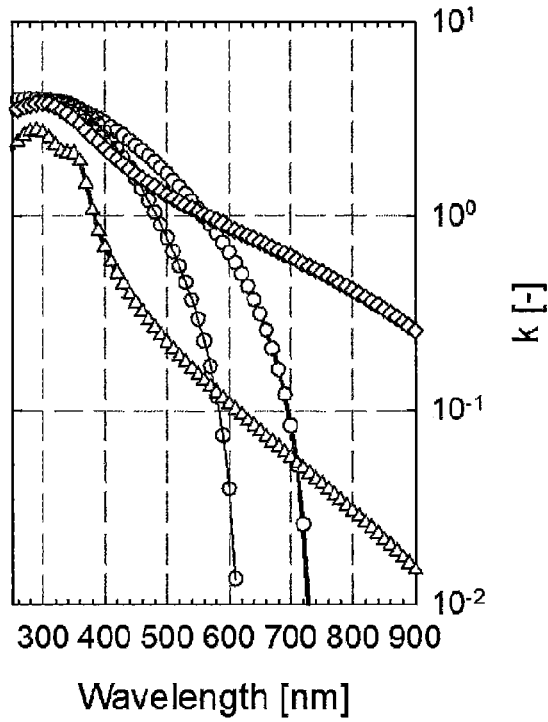
Fig. 20A

Table 2.
| Layer | $J_{loss}$ [mA/cm²] |
|---|---|
| SiC$_x$:P ($r$=0.8); 800 °C | 2.6 |
| SiC$_x$:P ($r$=0.8); 900 °C | 1.3 |
| µc-SiC$_x$:P ($r$=0.01); 800 °C | 2.4 |
| µc-SiC$_x$:P ($r$=0.01); 900 °C | 0.9 |
Fig. 20B
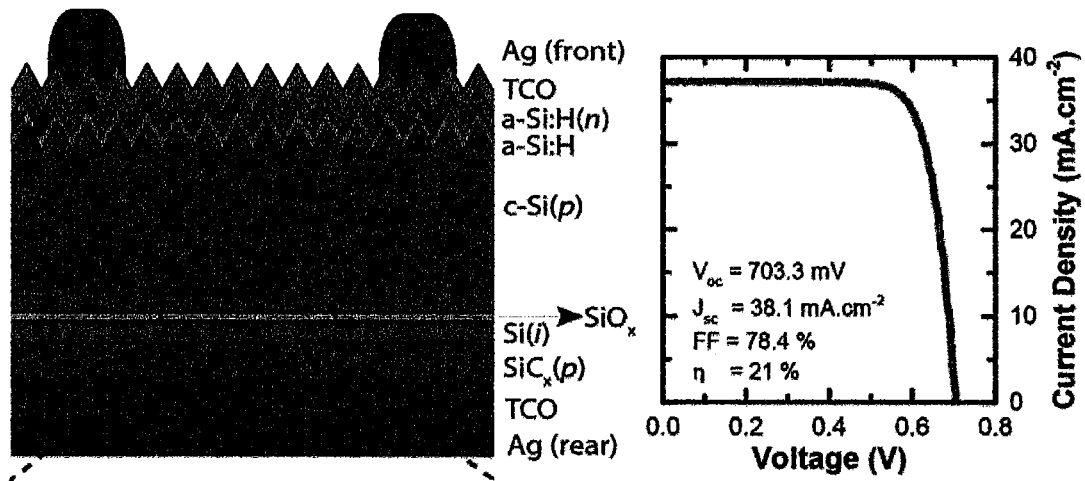
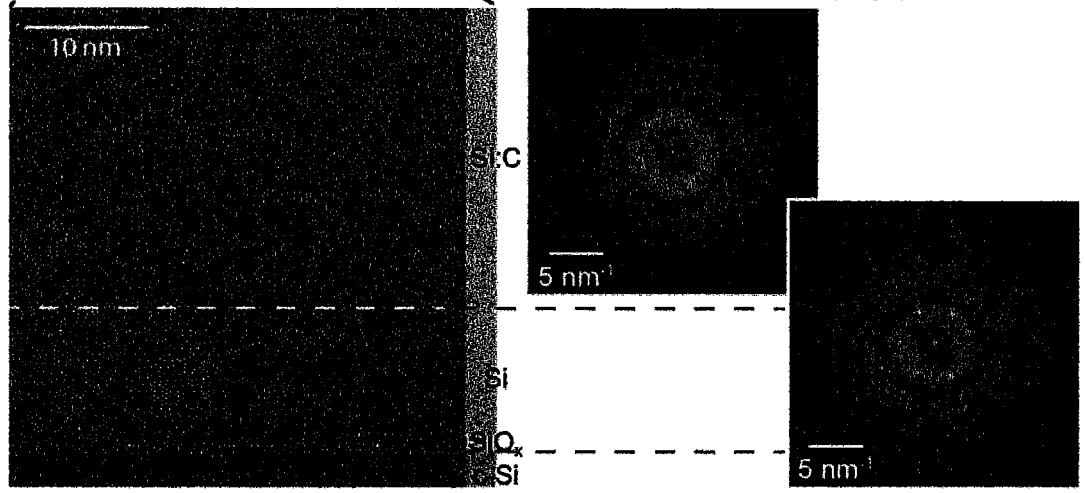
Fig. 21

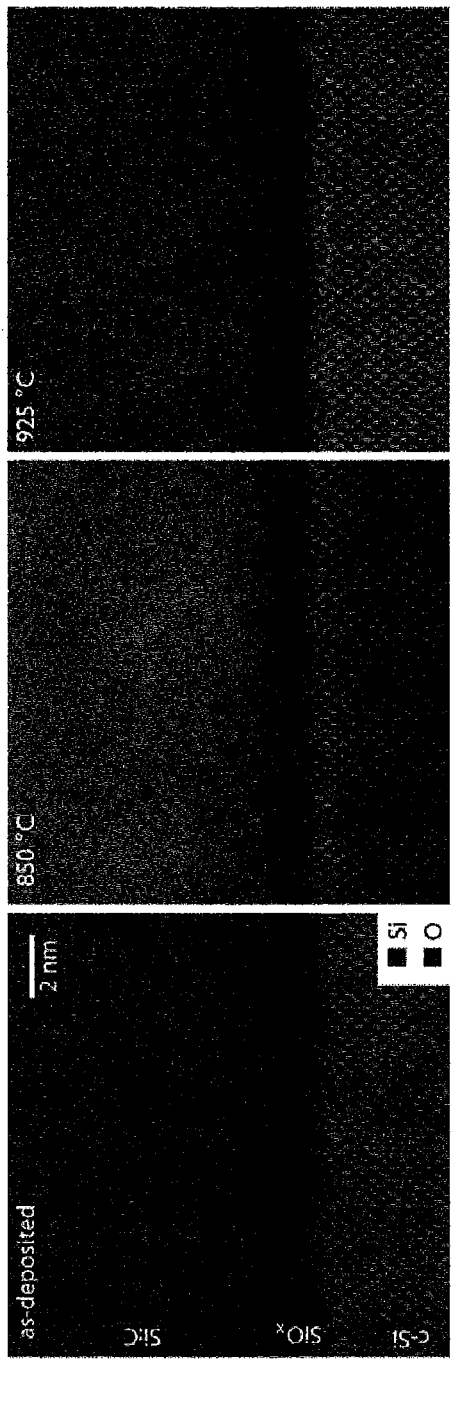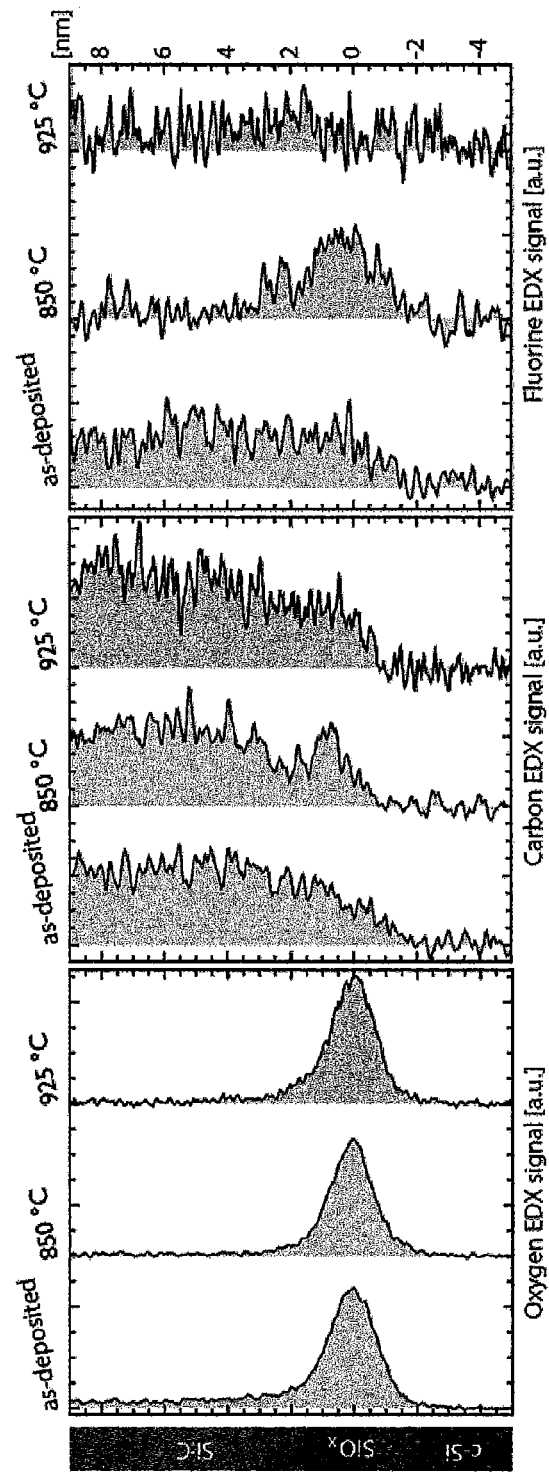
Fig. 27

SILICON HETEROJUNCTION SOLAR CELLS AND METHODS OF MANUFACTURE

CROSS-REFERENCE TO RELATED APPLICATIONS

This application is a § 371 national stage entry of International Application No. PCT/EP2017/078999, filed on Nov. 13, 2017, which claims priority to European Patent Applications No. 16203360.9, filed Dec. 12, 2016; No. 16203362.5, filed Dec. 12, 2016, and No. 17166961.7, filed Apr. 18, 2017, the entire contents of which are incorporated herein by reference.

TECHNICAL FIELD

The present invention relates to the field of solar cells. More particularly, the present invention relates to a photovoltaic solar cell comprising a heterojunction silicon based photovoltaic device comprising a heterojunction obtained from a low cost metallization fabrication method.

PRIOR ART

Today's solar cell production is dominated by two major silicon solar cell structures. These are aluminium-back surface field (Al-BSF) solar cells and the quickly emerging passivated emitter and rear solar cells (PERC), together accounting for more than 90% of the world production in 2016. PERC cells, represented in FIG. 1A, are very similar to Al-BSF cells, but have improved performance due to a dielectric layer on the rear side of the cell, i.e. on the side of the cell farthest from that being most irradiated by impinging light. The dielectric layer passivates the silicon wafer surface and acts as internal mirror. The fabrication of PERC solar cells starts with boron B-doped wafers (p-type) that are wet-chemically textured and cleaned, and usually relies on at least one high-temperature step. The at least one high temperature step comprises the diffusion of the n-type front contact in an atmosphere of $POCl_3$ at temperatures of ca. 850° C. This step massively improves the lifetime of minority charge carriers in many silicon materials, for example in multi-crystalline silicon material, which is linked to gettering of impurities. For the avoidance of doubts, the terms "multicrystalline material" shall be understood here as referring to any material consisting of more than one crystal grain, in case of the material being a silicon wafer to multicrystalline, polycrystalline, quasi-monocrystalline, and other type of silicon wafers. After applying a silicon nitride ($SiN_x$) anti-reflection coating to the front, the rear side is cleaned and coated with a dielectric layer (for example AlOx/SiNx stack) for surface passivation. Passivation of the silicon wafer or at least a surface portion thereof is acknowledged in the field of solar cell design and manufacturing to improve the minority charge carrier lifetime of the silicon wafer. Because non-conductive the rear passivation layer needs to be patterned. After this step, front- and back-metallization is applied by screen-printing of silver- and aluminium-pastes, respectively. Subsequently, a second high-temperature step, also referred to as "co-firing", is employed. During this second high temperature step the glass frit of the front metallization first sinters through the $SiN_x$ anti-reflection coating to establish the front contact. Secondly, passivating species, for example any of hydrogen, deuterium, tritium, neutral or charged is released from the $SiN_x$ layer and partly diffuses into the silicon wafer where it passivates broken silicon bonds and other defects, which is highly beneficial in case of multicrystalline wafers but also for monocrystalline material. The firing step requires rapid ramping (and cooling) to a peak temperature, typically a few seconds at 750° C.≤T≤850° C. This co-firing step is critical for contact formation and has massively contributed to increase throughput and decrease cost of industrial wafer based c-Si solar cells (Al-BSF and PERC), making this technology mainstream in the photovoltaic market.

However, the performance of PERC solar cells is inherently limited by the two dimensional charge carrier flow defined by the rear geometry and by charge carrier recombination at the direct metal-silicon contacts (black arrows in FIG. 1A) [Cuevas, A. Physical model of back line-contact front-junction solar cells. 164502, (2014), DOI:10.1063/1.4800840].

In fact, surface recombination velocity is extremely high ($>10^5$ cm/s) at such direct metal-Si contacts, leading to a drop in the minority charge carriers quasi-Fermi levels and consequently to a voltage loss, which can be higher than 60 mV. In order to avoid such voltage (and thus efficiency) loss, the interface between the absorber (Si wafer) and the metal has to be electrically passivated (FIG. 1B). Thin buffer layers suppress the recombination of minority charge carriers by displacing the metal contact from the Si wafer. At the same time, the buffer layer is sufficiently conductive to extract the majority charge carriers, which are selectively contacted by a doped layer on top.

A prime example of passivated contacts is found in a-Si:H/c-Si heterojunction (SHJ) solar cells, pioneered by Sanyo/Panasonic over the past 2 decades ("Heterojunction with Intrinsic Thin layer", HIT™), and continuously optimized until reaching efficiencies up to 24.7% in 2013. The wafer surface passivation of silicon heterojunction solar cells relies on saturation of dangling bonds by amorphous silicon, more specifically by hydrogen contained in the amorphous silicon layers. The hydrogen content is typically between 8% and 40% [R. A. Street, Hydrogenated Amorphous Silicon, Cambridge University Press, 1991, https://doi.org/10.1017/CBO9780511525247]. The large amount of hydrogen results in lower mass density compared to de-hydrogenated silicon, and also a decreased refractive index.

Even though impressive results have been obtained with SHJ solar cells, they feature several major drawbacks.

Upon heating a-Si:H layers, hydrogen effuses. As hydrogen dissolves suddenly from the Si atoms of the a-Si:H layer, diffusion through the silicon layer can limit the effusion, which can lead to the formation of blisters.

Additionally, hydrogen effusion becomes an irreversible process when the SHJ layers are annealed at temperature higher than 350° C., and introducing hydrogen after deposition or re-introducing hydrogen after effusion cannot restore an initial good electrical quality, but leads to bad electrical quality [J. Shi, Appl. Phys. Lett. 109, 153503153503 (2016); 10.1063/1.4964835].

As already mentioned above, cost-effective industrial metallization schemes are mainly based on firing-through of high temperature Ag-pastes or by plating of Ni/Cu. In both cases process temperature are well above 250° C. and thus incompatible with SHJ. In more details, Ag-based metallization require a firing through step, few seconds at 750° C.≤T≤850° C. While Ni/Cu metallization then requires a sintering step at around 350° C. to form a silicide. In addition, surface passivation by amorphous silicon further requires locally very flat surfaces. Usually solar cell surfaces are textured with pyramids to enhance light trapping, for example random pyramids, the edges of the pyramids need to be rounded and their sidewalls polished in order to smoothen the surface to attain good surface passivation.

Another drawback of this passivating contact technology arises from parasitic light absorption in the a-Si:H films and transparent conductive oxides (TCOs), which induces current losses of about 3 mA/cm². These parasitic absorption effects cannot be reduced any more by further decreasing the film thickness because minimal layer thickness is needed to ensure sufficient later conductivity.

Hence, production of SHJ cells requires investing in a completely new manufacturing line and interconnection technology to the low temperature metallization that is not proven in the field for decades. This leaves out to cell manufactures the option to upgrade existing tools. Within the uncertain financial times for the photovoltaic industry, this translates into a too high investment risk representing the main hurdle for adopting of this cell technology.

An attractive industrial solution would be to combine the highly transparent front side structure of a PERC or Al-BSF solar cell with a novel rear passivating contact with passivation properties as good as SHJ and that are stable to high temperature thermal treatments used for fabrication of industrial metallization schemes. Additionally, when reducing recombination rate of the rear passivating contact, front side recombination at the homo-junction contact becomes dominant. To mitigate such losses, highly-transparent and temperature stable passivating contacts for front side are required. In this case, the high temperature treatment would also increase layer crystallinity thus reduce optical parasitic absorption compared to SHJ. This passivating contact technology, thus, will offer to solar cell manufacturers the option of introducing high efficiency passivating contact concepts on at least one side of the solar cell without the need of radically change their production lines.

DISCLOSURE OF THE INVENTION

According to a first aspect the present invention relates to a solar cell comprising a heterojunction photoelectric device comprising, a first electrode layer, a second electrode layer comprising a metallic contact layer, a light-absorbing silicon layer arranged between said first electrode and said second electrode layers and a passivating and conductive stack comprising at least one doped silicon-based layer arranged between said light-absorbing silicon layer and at least one of the first and second electrode layer, characterized in that the passivating and conductive stack further comprises at least one wide band gap material layer having an electronic band gap greater than 1.4 eV, said wide band gap material layer being applied on a surface of the light-absorbing silicon layer between said light-absorbing silicon layer and said doped silicon-based layer, thereby forming a heat-resistant heterojunction contact, said heat resistant heterojunction being arranged for at least maintaining its passivating and conductive properties after thermal treatment thereof above 600° C.

In the context present invention, the terms "conductive stack" shall be construed as a layer stack in a heterojunction solar cell having specific contact resistivity ranging from 1 and $10^4$ m ohm·Cm².

The solar cell of the invention therefore comprises a heat-resistant heterojunction contact at any of the rear side, the front side, or both the rear side and the front side of the cell, or two heterojunction contacts on the same side, preferably the rear side, of the solar cell, i.e. between the light absorbing silicon layer and the metallization layer, offering greater surface passivation than known solar cells, boosting the open-circuit voltage (Voc) potential from 680 mV to 740 mV, while PERC cells are limited to 660 mV and up to 680 mV.

In the context of the present invention the light absorbing silicon layer can be made of n-type or p-type or intrinsic silicon with resistivity comprised between 0.1 and 1000 ohm·cm.

In the present invention, the terms "heat-resistant heterojunction contact" shall be understood as any heterojunction contact in a solar cell structure capable to at least maintain or improve its passivating and conductivity properties when exposed to thermal treatments.

Thermal treatments in the context of the present invention shall comprise as "firing" thermal treatment when based on heating and/or cooling ramps above 20° C./s at temperatures of 600° C. to 1000° C. and dwell time of 1 s to 10 min. Thermal treatments shall also comprise "thermal annealing" when based on heating and/or cooling ramps between 1 and 100° C./min, at temperatures of 600° C. to 1000° C. and dwell time of 1 min to 60 min.

In a first embodiment of the inventive solar cell, an interface between said passivating and conductive stack and the light absorbing silicon layer has a very abrupt or shallow distribution of doping profile, said passivating and conductive stack and thermal treatment being configured such that to prevent dopants to diffuse from the passivating and conductive stack to the light absorbing silicon.

The terms "very abrupt or so-called shallow distribution" shall be understood in the context of the invention as the intensity [counts/s] of the dopants into the light absorbing silicon decays over at least one orders of magnitude within a distance of less than 20 nm, preferably less than 10 nm, further preferably less than 5 nm.

In a second embodiment the light absorbing silicon layer comprises a doped region with sheet resistance between 1 and $10^5$ ohm/square at an interface between said passivating and conductive stack and the light absorbing silicon layer, said doped region being obtained by diffusion of dopants from any of the layers forming the passivating and conductive stack into to the light absorbing silicon layer during said thermal treatment.

In a preferred embodiment, the heat resistant heterojunction is applied on a rear side of the solar cell.

In preferred embodiments, the wide band gap material layer has a thickness of at most 20 nm, preferably between 0.5 nm and 2 nm.

In various embodiments, the wide band gap material layer comprises a dielectric material, which is advantageously chosen among any of the following materials: SiOx, SiCx, SiNx, SiOxNy, SiOxCy, SiCxNy, SiOxCyNz, AlOx, HfOx, AlHfOx, AlNx, TiNx, ZrOx, Y2Ox, AlSiOx, HfSiOx, AlHfSiOx, where x, y, and z are entire numbers, and which can be amorphous or crystalline.

Advantageously, any Si-based materials containing O, N, or C in any composition forming the wide band gap material layer may also contain further elements, and can be amorphous or crystalline.

In preferred embodiments, the passivating and conductive stack has an effective refractive index lower than that of amorphous silicon at a wavelength 633 nm. For the avoidance of doubts, the terms "effective refractive index" means the refractive index of the passivating and conductive stack determined according to an effective medium approximation method.

Further, any of the previously recited wide band gap preferred materials may contain hydrogen, fluorine, phosphorous, boron, and other elements, and preferably containing at least one of hydrogen or fluorine.

In a preferred embodiment of the invention, the wide band gap material layer is made of SiOx, where x is being chosen between 0.5 and 2.

In another preferred embodiment of the invention the doped silicon-based layer has an atomic percent concentration of hydrogen of less than 5% as the number of hydrogen atoms per unit volume divided by the total number of all atoms per unit volume of the doped silicon-based layer, i.e. meaning a hydrogen concentration, which is more than one order of magnitude lower than the hydrogen concentration of a-Si:H, which is typically in the range 8%-40% [Beyer 2016, 10.1002/pssa.201532976]. More generally speaking, it is preferred that the doped Si-based layer or a part of it is being more transmissive than silicon itself for molecular or atomic hydrogen.

In other embodiments the passivating and conductive stack of the invention further comprises a buffer layer arranged between said wide band gap material layer and said doped silicon-based layer, which buffer layer is preferably itself also a silicon-based layer and can be doped or intrinsic.

Various materials can be chosen to realize the buffer layer but it is preferred according to the invention the said buffer layer is made of at least one of the materials chosen among Si, SiCx, SiNx, SiOx, SiCxNy, SiCxOy, SiNxOy, SiCxNyOz or a combination thereof.

The inventors of the current invention have identified that appropriately chosen material for the wide band gap layer can advantageously provide passivation of the light-absorbing silicon surface without requiring further re-hydrogenation of the light-absorbing silicon surface and or wide band gap layer after thermal treatment. This holds for the case with and also without buffer layer, directly or indirectly between the doped-silicon based layer and the light absorbing silicon.

In addition, where said light-absorbing silicon surface is not passivated enough after thermal treatment the passivating and conductive stack and/or the capping layer may comprise(s) passivating species to passivate defects within the said passivating and conductive stack and/or at the interface between said passivating and conductive stack and said light absorbing silicon layer, said passivating species being releasable upon said thermal treatment.

In particular, the inventors have found out that addition of fluorine to the layer stack can enhance passivation even without further hydrogenation. Such fluorine can be added already in the growth of the layer stack during manufacturing of the solar cell structure, for example using a fluorine compound as precursor gas or target, or afterwards for example by implantation.

Adding fluorine already in the growth of the layer stack is especially advantageous because this reduces the total number of process steps. In addition, during thermal treatment, the fluorine can be redistributed and can diffuse to the interface between the light absorbing silicon layer and the wide band gap material layer, enhancing passivation.

Hydrogen can also have other effects: Molecular or atomic hydrogen can bond to dopant impurities, deactivating the dopant, and hydrogen can bond to fixed charges and influence the fixed charge density. Importantly, both effects can influence the band bending in the light-absorbing silicon. According to the invention hydrogenation is utilized to influence doping, fixed charges, or band bending.

According to another characteristic of the invention a transparent conductive oxide layer may be arranged between said doped silicon-based layer and said metallic layer.

In another preferred embodiment of the solar cell of the invention the surface of the light absorbing silicon layer whereupon the wide band gap material layer is applied may be structured, i.e. showing a determined and controlled surface pattern or structure providing determined texture and/or roughness of the surface. Any kind of surface texture and/or roughness of the light absorbing silicon layer may be contemplated in the context of the invention, in particular nanoscale texturing to create surface roughness at atomic level.

In other preferable embodiments the wide band gap material layer may comprise through-holes extending from said first surface to said second surface.

Additionally, in any embodiment of the invention the solar cell may also comprise a capping layer arranged between said doped silicon-based layer and said metallic contact layer of the second electrode.

In alternative embodiments of the present invention, the wide band gap layer, the buffer layer or the silicon-based doped layer may be comprise a so-called heterogeneous layer as described in co-pending PCT application WO 2017182472, the content of which is herewith fully incorporated by reference.

In a further embodiment the passivating and conductive stack and/or the capping layer may comprise(s) passivating species as defined above to passivate defects within the said passivating and conductive stack and/or at the interface between said passivating and conductive stack and said light absorbing silicon layer, said passivating species being releasable upon said thermal treatment.

According to a second object, the present invention also relates to a method for manufacturing a solar cell as previously presented, said method comprising a step of depositing a passivating and conductive stack comprising a wide band gap material layer on a surface of a light absorbing silicon layer, a step of depositing a doped silicon based layer on said wide band gap material layer and then at least one thermal treatment of the stack formed thereby at above 600° C. in order to releases passivating species from the said passivating and conductive stack and/or at an interface between said passivation stack and said light absorbing silicon layer. Additionally, the thermal treatment increases crystallinity of the silicon-based doped layer enhancing its optical and electrical properties.

Preferably, the wide band gap material layer has an electronic band gap greater than 1.4 eV before and after thermal treatment.

Preferably, the electronic band gap of the wide band gap material layer varies less than 20% during or after said thermal treatments.

Preferably, the thermal treatment comprises a firing step of the solar cell at temperatures above 600° C. and with at temperature ramp rates of more than 20 K/s and dwell time at maximum temperature below 10 s (rapid thermal annealing).

Such thermal treatment thereby allows for reducing hydrogen content of the doped silicon-based layer because the elevated temperatures cause the rupture of hydrogen bonds. In a preferred embodiment, the combination of thermal treatment and the passivating and conductive layer stack prevent in-diffusion of dopant impurities form the silicon-based layer through the wide band gap layer to the light-absorbing silicon layer.

In preferred embodiments, either during the first treatment or another thermal treatment, the hydrogen content of the wide band gap material layer or the light absorbing silicon layer interface is increased with respect to the state of the respective layer before that thermal treatment. Thermal treatment can result in a gradual decrease of the layer stack crystallinity when moving towards the side of the layer stack facing away from the light absorbing silicon.

Finally, the method of the invention may further comprise the steps of:

forming a capping layer between said doped silicon-based layer of the passivating and conductive stack and said metallic contact layer; and thermally treating the passivating and conductive stack and the capping layer in order to release passivating species from any of the passivating and conductive stack and the capping layer to passivate defects within the said passivating and conductive stack and/or at the interface between said passivating and conductive stack and said light absorbing silicon layer.

PRESENTATION OF DRAWINGS

Various embodiments of the present invention will now be described in relation to the appended drawings, among which:

FIGS. 1A and 1B represent various solar cell structures known from the prior art, FIGS. 2 A and B represents first embodiments of a solar cell according to the invention, FIG. 3A to 3C represent the influence of a capping layer to control transmission of a passivation component such as hydrogen or fluorine and density of fixed charges within the passivating and conductive stack structure of a solar cell according to the invention;

FIGS. 5A and 5B represent a third embodiment of a passivating and conductive stack for a solar cell structure according to the invention;

Figure 9A:
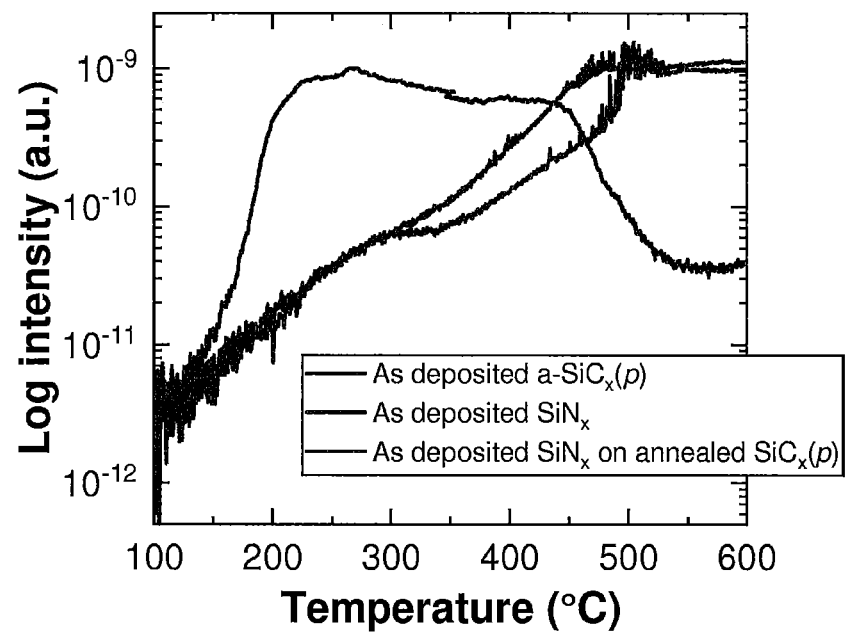
Figure 9B:
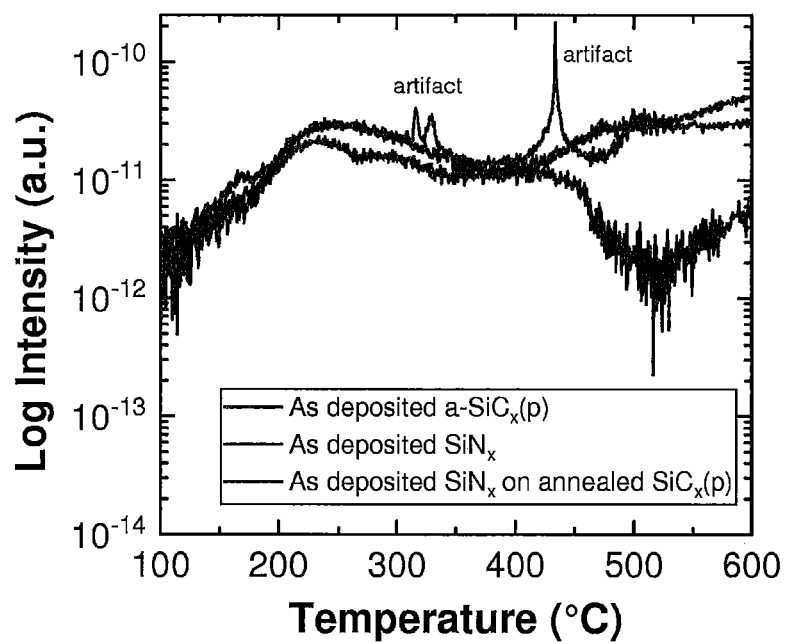
Figure 11:
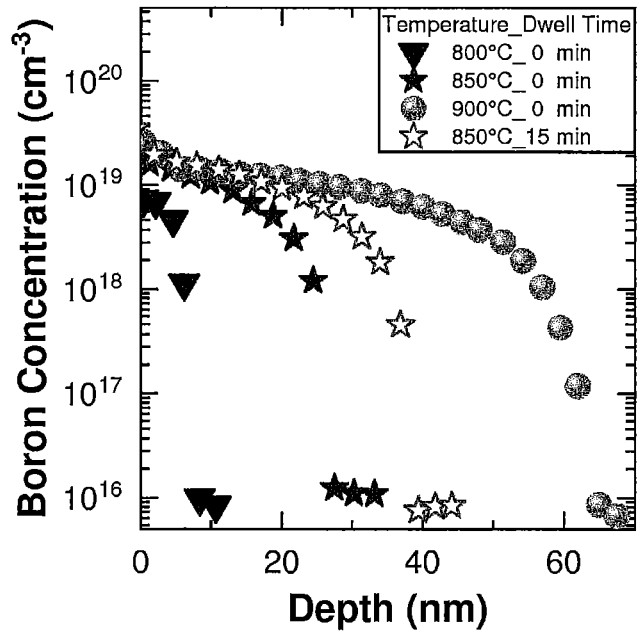
Figures 23A, 23B, 23C:
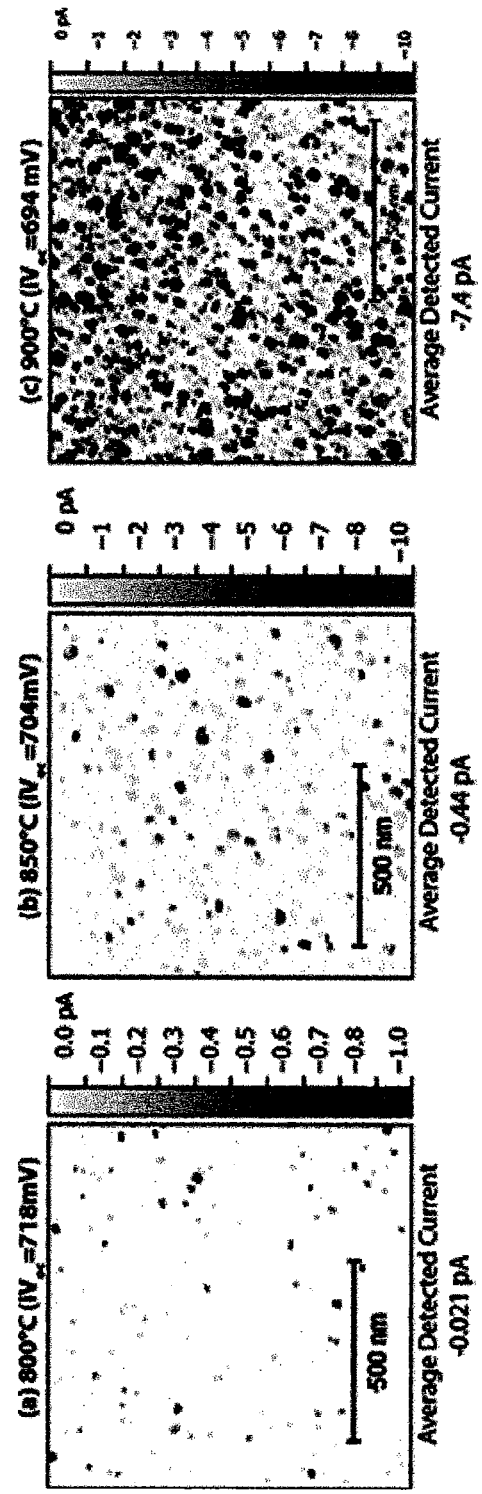
Figures 24A, 24B:
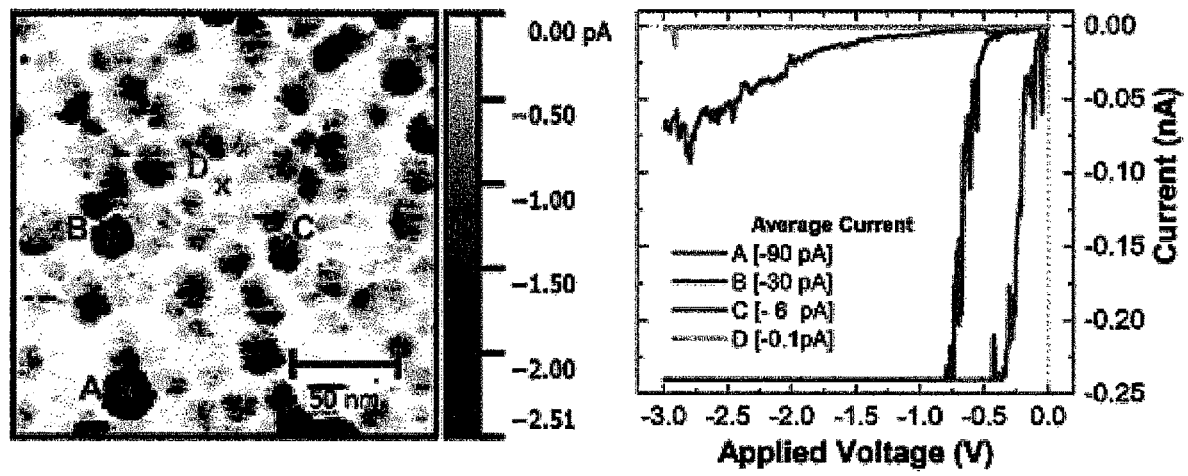

FIGS. 9A and 9B represent, in the first example of the contact structure of the solar cell of the invention, thermal desorption spectroscopy (TDS) spectra of as deposited a-SiCx (p) on SiOx/c-Si, SiNx on c-Si, and SiNx on SiCx (p)/SiOx/c-Si, with the SiCx(p) previously annealed at 800° C., respectively for m/Z=2 ($H_2$), and mass separated ions (m/z) m/Z=18 ($H_2O$), obtained by heating the sample at a ramping rate of 20° C./min after a vacuum of $5.25 \times 10^{-10}$ Torr was reached in the measurement chamber;

FIGS. 10A to 10C represent, for the first example of the contact structure of the solar cell of the invention, implied open circuit voltage (iVoc) values for samples produced by varying the trimethylboron (TMB) flow during the doped layer deposition from 0.2 standard cubic centimeters per minute (sccm) to 1.9 sccm and annealed at temperatures range of 775° C. to 900° C. with various annealing dwell times of 0 minute, 5 minutes, and 15 minutes and using heating and cooling ramps of 10 and 2° C./min, respectively;

FIGS. 10D to 10F represent for the first example of the contact structure of the solar cell of the invention measured specific contact resistivity values as a function of TMB flow used during the deposition of the SiCx(p) for different thermal annealing dwell temperatures and dwell times of 0 minute, 5 minutes, and 15 minutes;

FIG. 11 show the doping profile within the c-Si wafer in of the first example of the solar cell of the invention measured by Electrochemical Capacitance-Voltage (ECV) for different thermal annealing dwell temperatures and dwell times for the contact that was produced with the TMB flow of 1.5 sccm on top of chemical SiOx and 10 nm thick intrinsic Si interlayer;

FIG. 12A-12D represents output characteristics of the hybrid solar cells in the first example of the invention exhibiting the boron doped layer produced with the TMB flow of either 1.5 or 1.9 sccm and thermal anneal at dwell temperatures of 800° C., 825° C., and 850° C.;

FIGS. 13 to 20 represent various configurations and measurement results for a wide-band gap silicon carbide for front side carrier selective contacts as a second example of the invention:

FIG. 21 represent the solar cell hybrid structure, TEM image of the Si/SiCx(p) layer stack after thermal annealing and external parameters of the cell;

FIG. 22A-D report the conductive atomic force microscope (c-AFM) of the Si/SiCx(p) layer stack after thermal annealing at 850° C. and different TMB flows;

FIG. 23A reports the c-AFM of the Si/SiCx(p) with TMB flow of 1.5 sccms in the as-deposited state; B, C and D after thermal annealing of 800 C, 850 and 925° C.;

FIG. 24A-24B. TEM and EDX maps of the Si/SiCx(p) layer stack after annealing at 850 and 925° C.

Figure 25A:
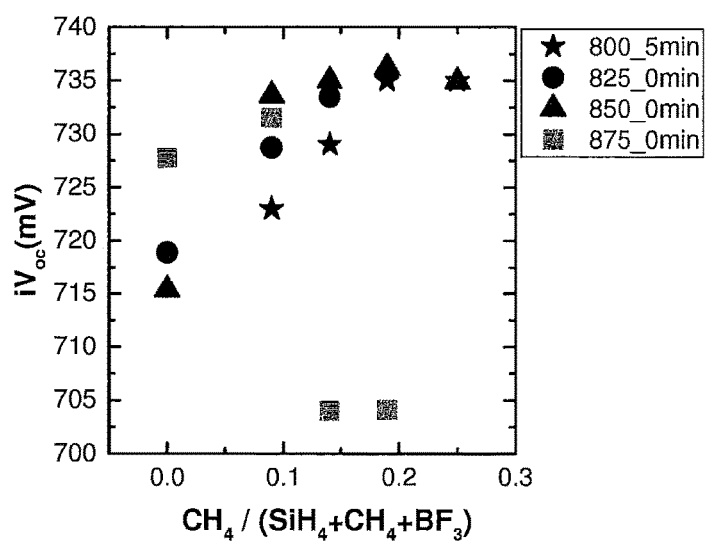
Figure 25B:
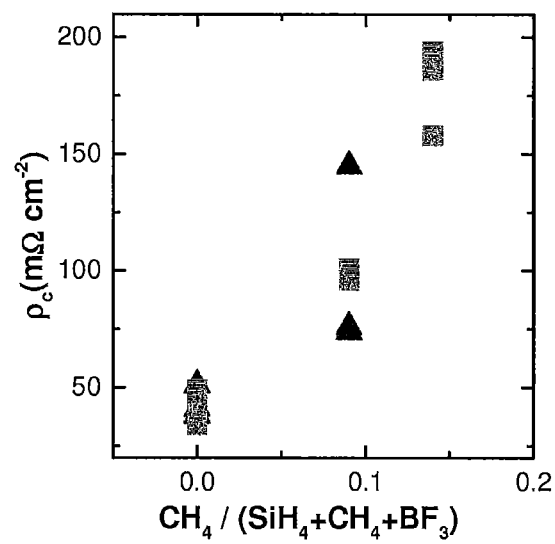

FIG. 25A shows the implied open circuit voltage as a function of process gasses flux ratio ($CH_4/(SiH_4+CH_4+BF3)$) and effect of fluorine as passivating agent in a solar cell according to the invention;

FIG. 25B show the related specific contact resistivities for the selected samples from the same sample set.

Figure 26:
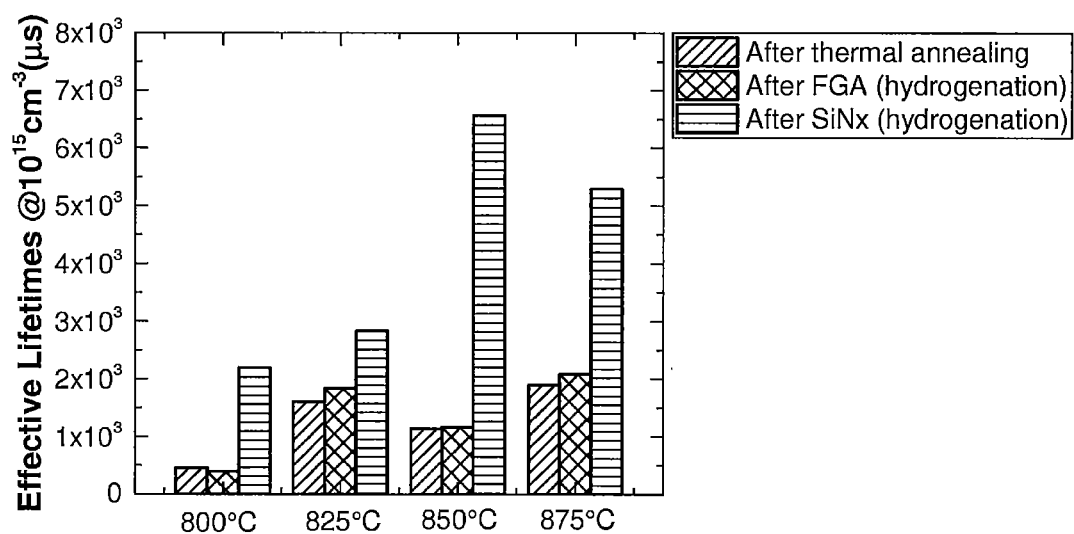
Figure 28A:
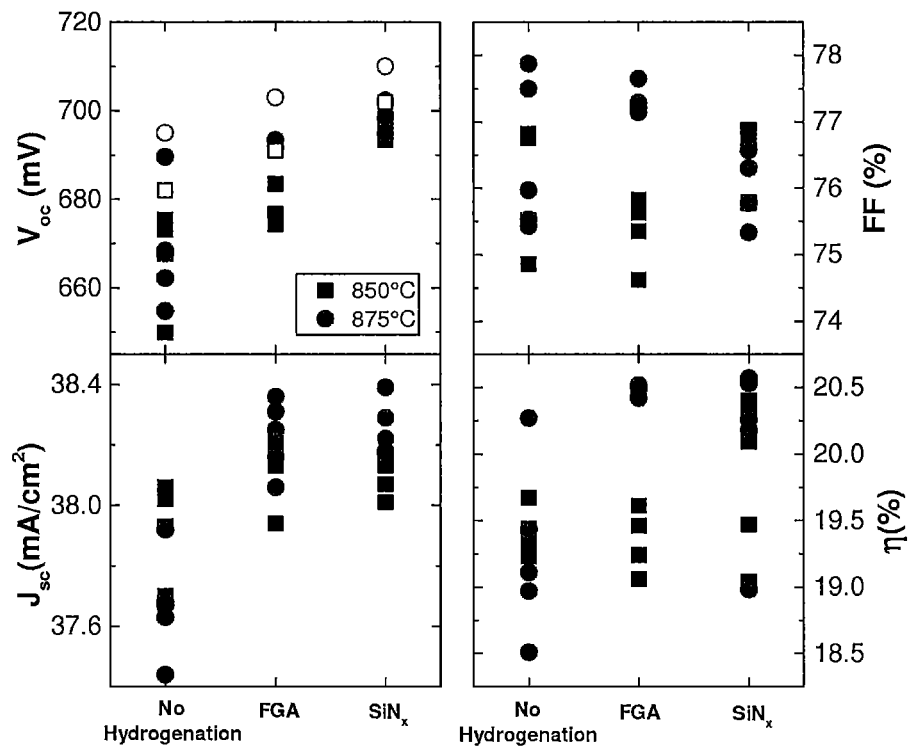
Figure 28B:
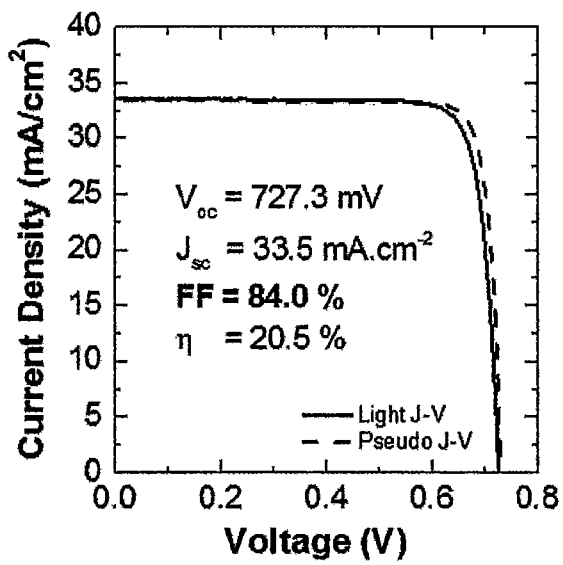
Figure 29:
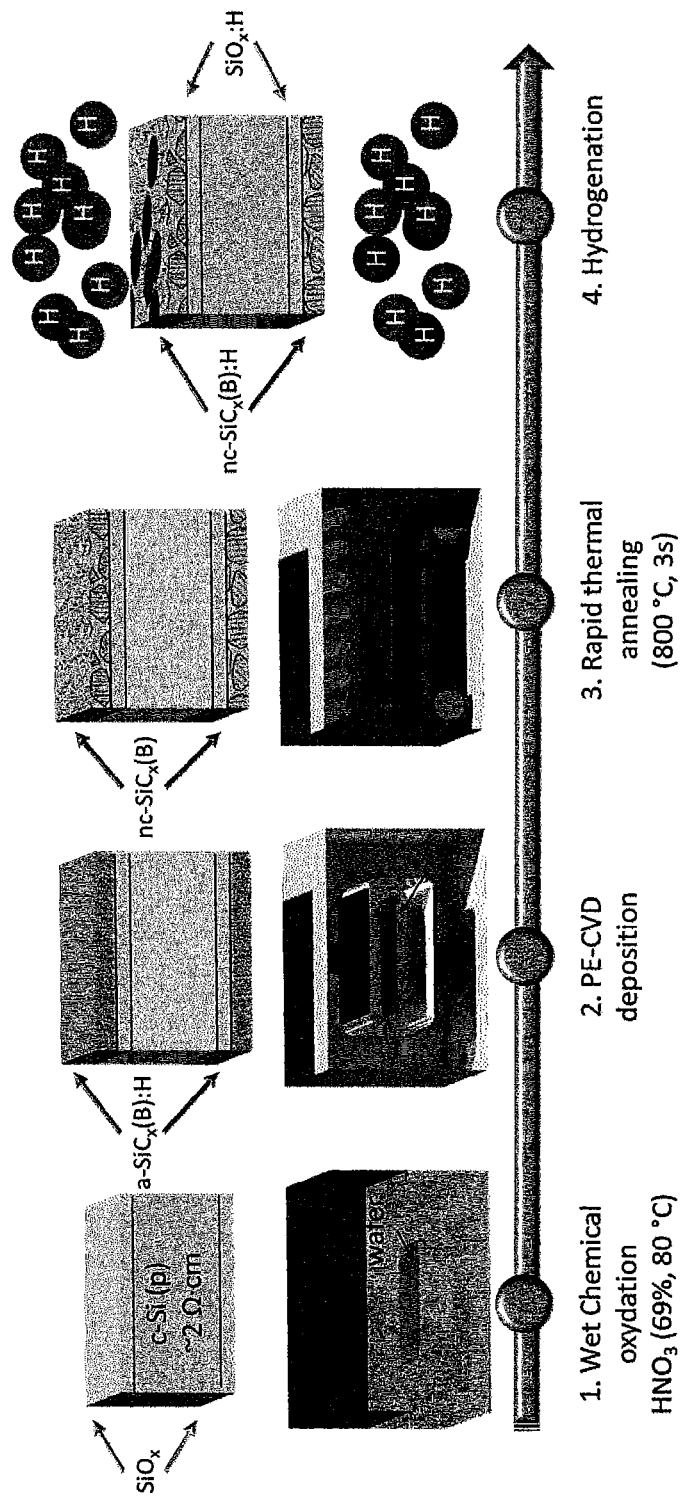
Figure 30:
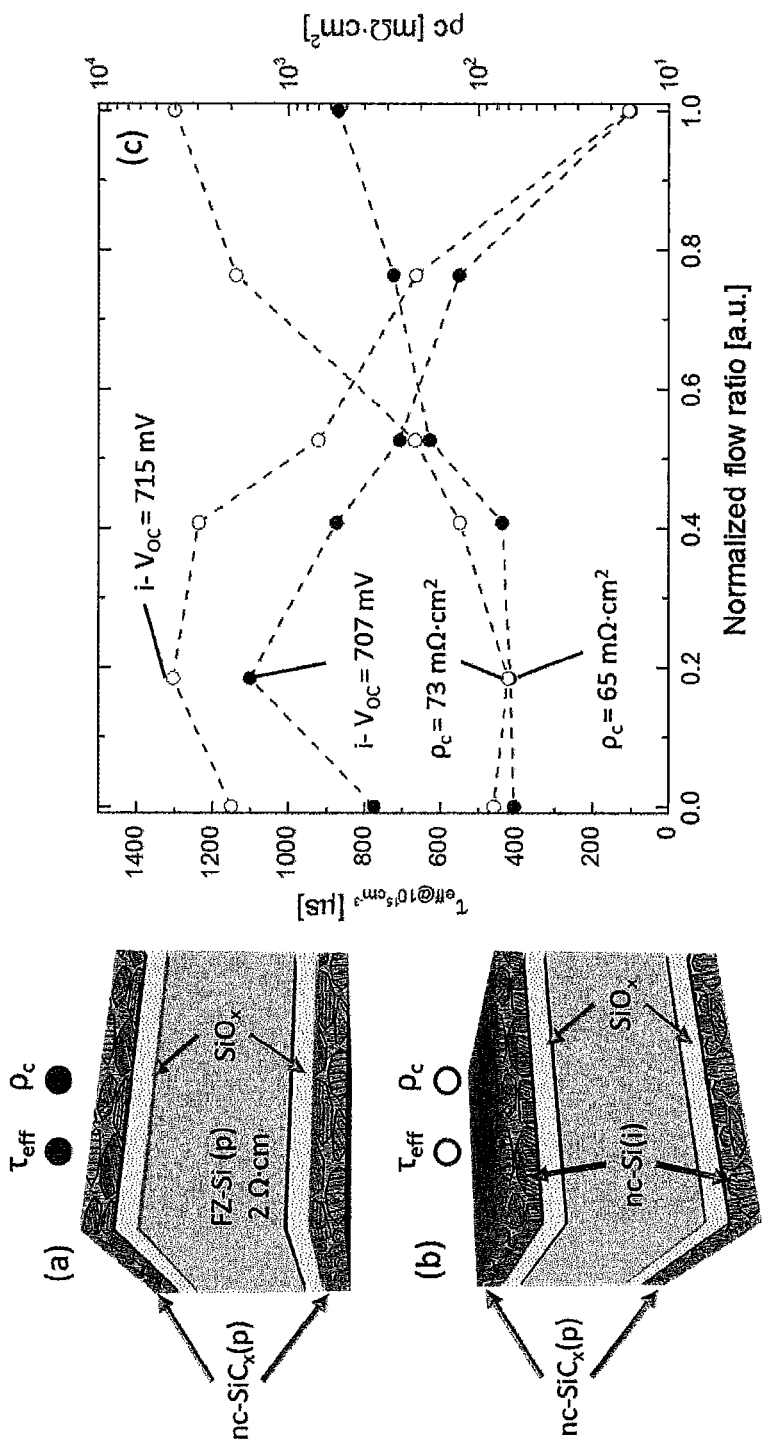
Figure 31:
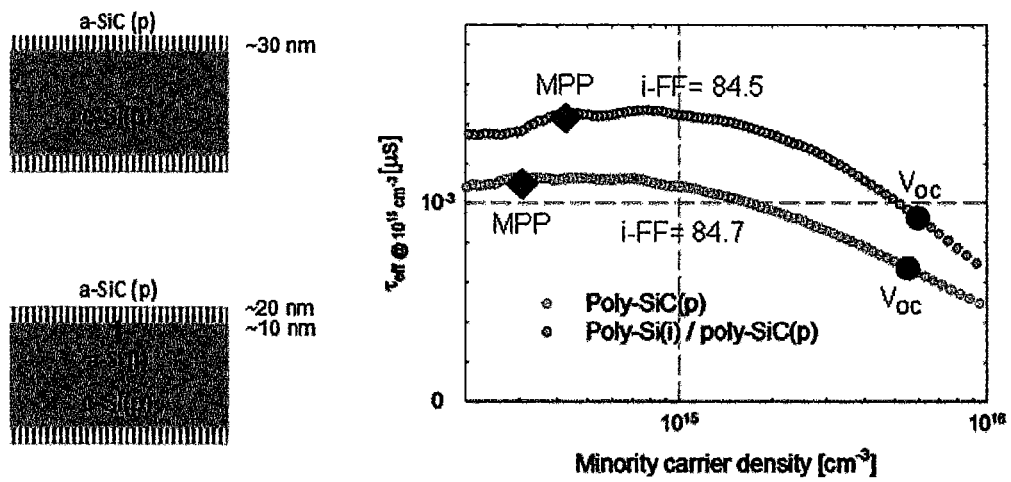
Figures 33A, 33B, 33C, 33D:
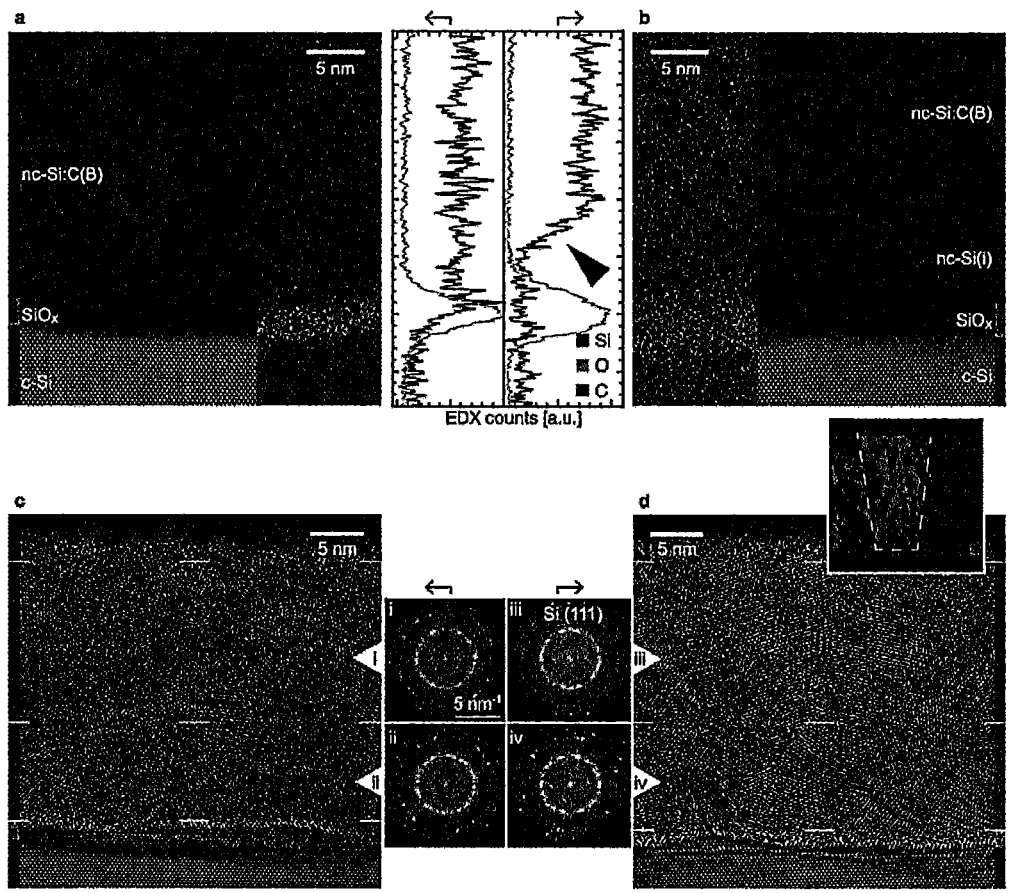
Figures 32A, 32B, 32C:
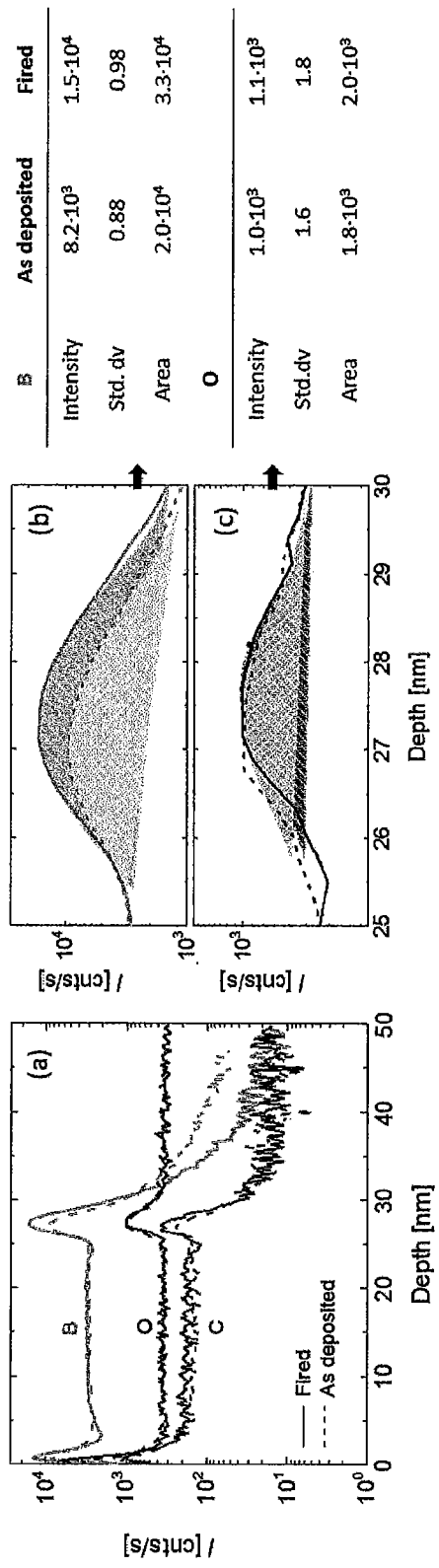
Figures 32D, 32E, 32F:
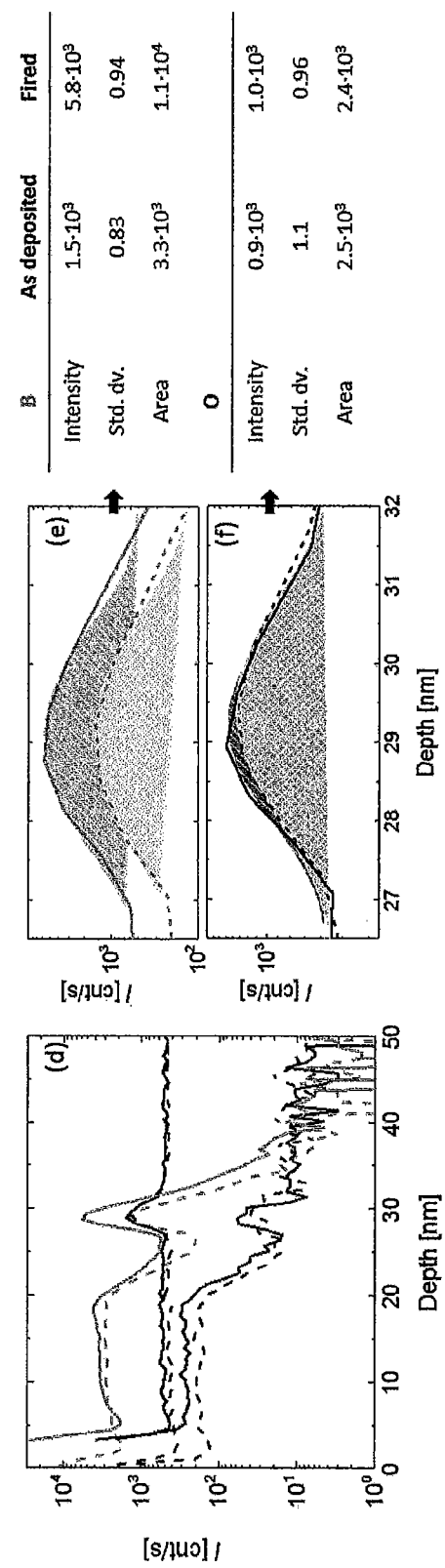
Figure 34:
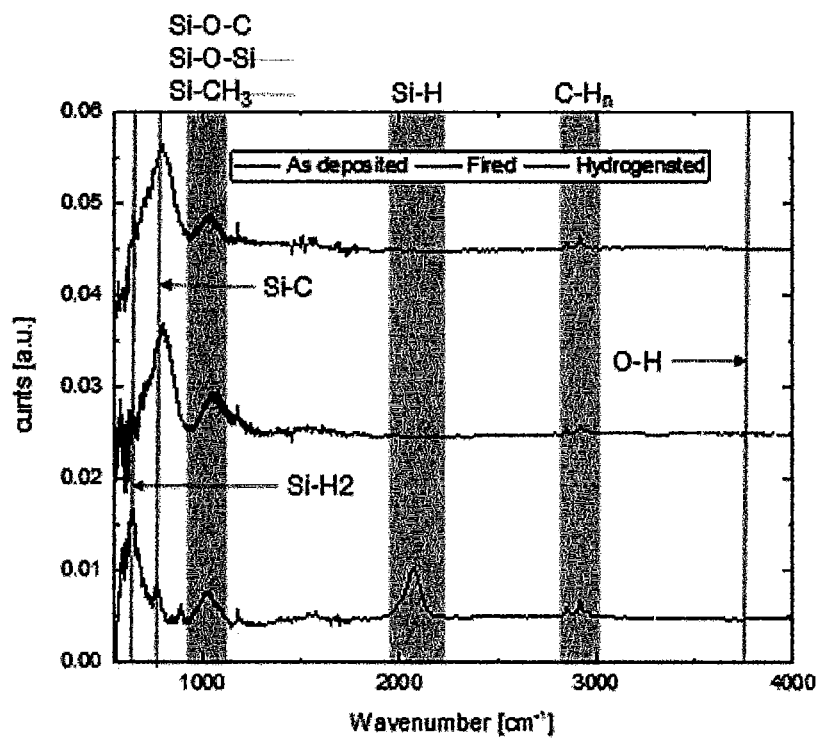
Figure 35:
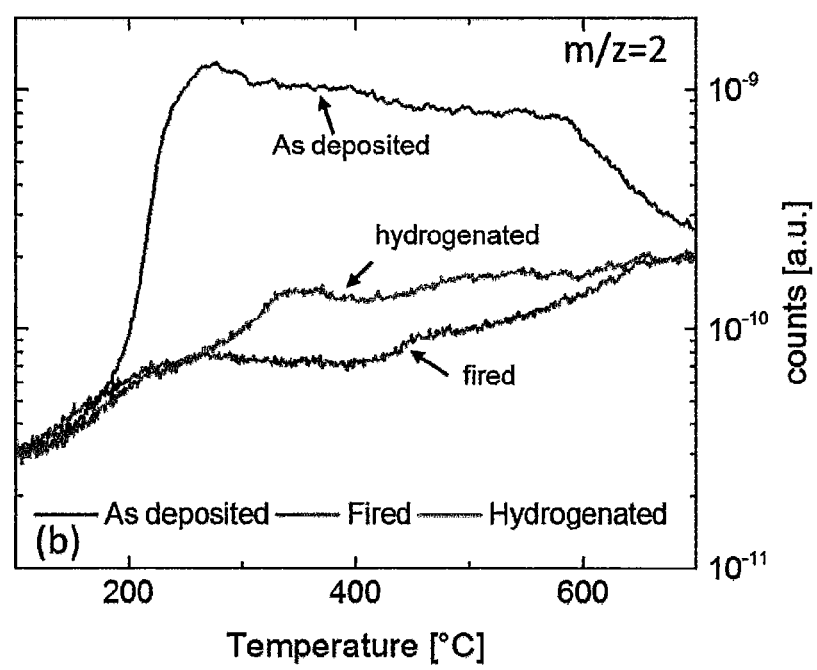
Figure 36:
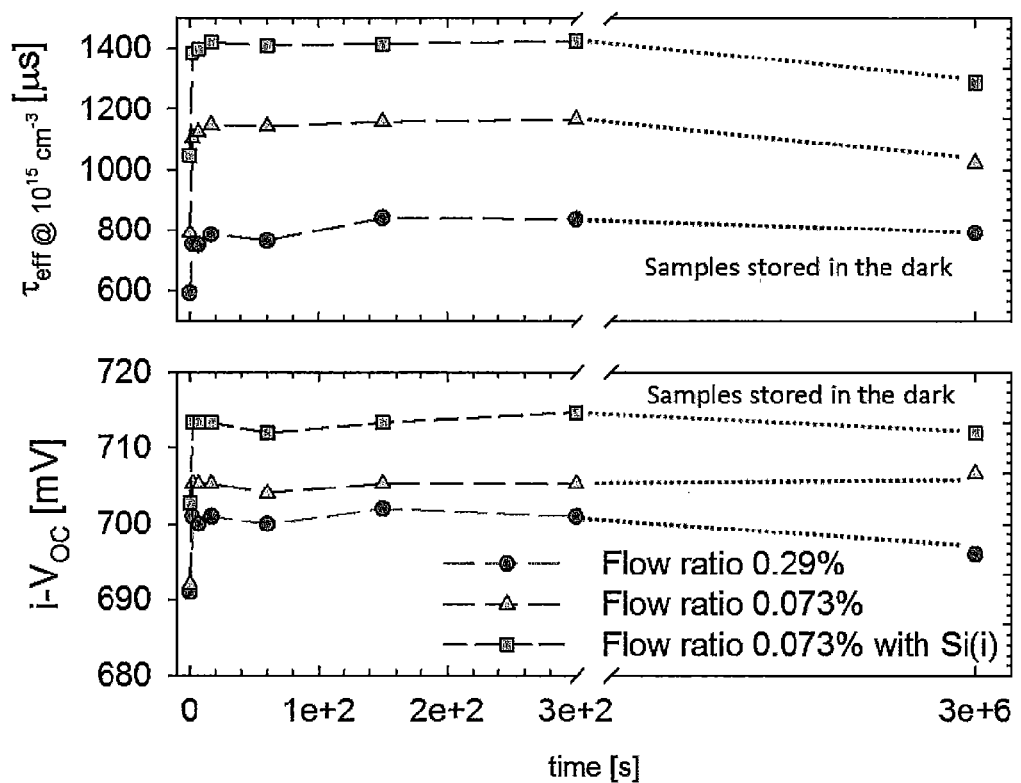
Figure 37A:
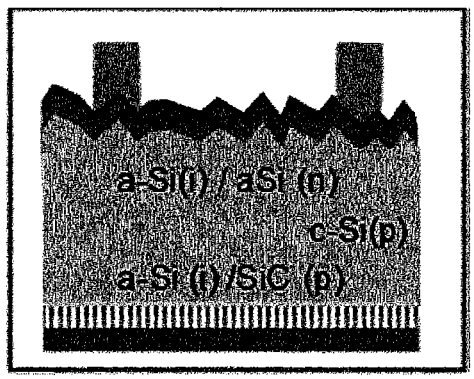
Figure 37B:
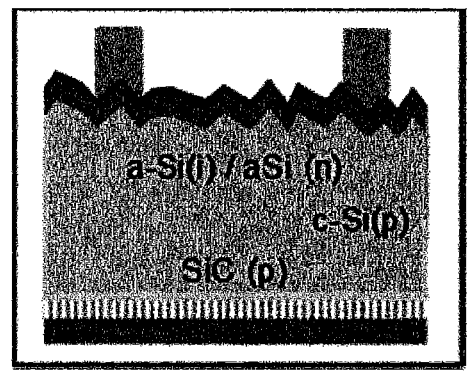
Figure 37C:
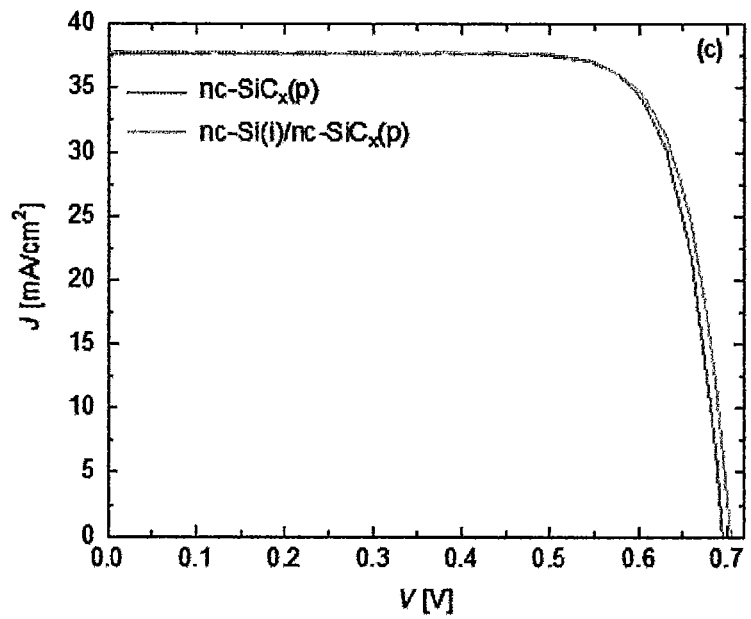

FIG. 26 shows the lifetime evolution of the sample produced with CH4/(SiH4+CH4+BF3) ratio of 0.1 and thermal annealing at different temperatures from 800° C. to 875°;

FIG. 27 reveals the scanning transmission electron microscopy images with Energy-dispersive X-ray spectroscopy (EDX) mapping for Si, O and F atoms for SiCx doped with BF3 in the as-deposited state, after thermal anneal at 850 and 925° C. for 5 min;

FIG. 28A represents cell parameters obtained using fluorinated dopant source ($BF_3$) for hole selective contact fabricated with a thermal anneal with and without post-hydrogenation;

FIG. 28B represents the cell parameters for the best cell;

FIG. 29 represents the process flow for the fabrication of the symmetrical structure used for the development of the fired heterojunction in the fourth example of this invention;

FIG. 30 shows minority carrier lifetime ($\tau$eff) at injection level of $10^{15}$ $cm^{-3}$ as function of the normalized flow ratio between CH4 and total gas flow (i.e. CH4+SiH4+TMB+H2) of the SiCx(p) layer forming the fired heterojunction;

FIG. 31 minority carrier lifetime ($\tau_{eff}$) as function of the minority carrier density for the optimal layer conditions (normalized flow ratio between CH4 and total gas flow of 0.18 for the $SiC_x$ layer) with and without a-Si(i) buffer layer;

FIGS. 32A-32C represent Secondary-ion mass spectrometry (SIMS) measurements of the O, B and C doping profiles expressed in intensity [counts/seconds] as function of the depth, for the SiCx layer forming the passivating and conductive stack of the invention with normalized flow ratio between CH4 and total gas flow of 0.18 in the as-deposited state and after firing step;

FIGS. 32D-32F represent SIMS of the O, B and C doping profiles expressed in intensity [counts/seconds] as function of the depth, for the passivating and conductive stack of the present invention contact formed by the intrinsic buffer layer capped with the SiCx with normalized flow ratio between CH4 and total gas flow of 0.18 in the as-deposited state and after firing step;

FIG. 33A represents scanning transmission electron microscopy (STEM) high-angle annular dark-field imaging (HAADF) image of the c-Si with SiOx/nc-SiCx(p) fired heterojunction, shown alongside an EDX map and a line scan of the Si K and O K and C K edge EDX intensities;

FIG. 33B represents STEM HAADF image and EDX map of the c-Si with SiOx/nc-Si(i)/nc-SiCx(p) double layer forming the fired heterojunction, also shown alongside the corresponding EDX line scan of the Si K and O K and C K intensities;

FIG. 33C represents high resolution transmission electron microscopy (HRTEM) micrograph of the c-Si with SiOx/nc-SiCx(p) fired heterojunction and corresponding Fourier transforms computed in the first 7 nm of the nc-SiCx(p) close to the SiOx (inset i) and in the upper part of the doped layer (inset ii);

FIG. 33D represents HRTEM micrograph the c-Si with SiOx/nc-Si(i)/nc-SiCx(p) double layer fired heterojunction;

FIG. 34 represents Fourier-transform infrared spectroscopy (FTIR) measurements of the of the fired heterojunction formed by a silicon-based doped layer of $SiC_x(p)$ with normalized flow ratio of 0.18% in the as-deposited, fired and fired followed by hydrogenation;

FIG. 35 represents TDS effusion profile of the (m/z=2) of the fired heterojunction formed by a silicon-based doped layer of $SiC_x(p)$ with normalized flow ratio of 0.18 in the as-deposited, fired and fired, followed by hydrogenation;

FIG. 36 represents light soaking under 1-sun illumination for the fired heterojunction employing as silicon-doped layer a SiCx(p) with normalized flow ratio of 0.78, 0.18 with and without buffer layer;

FIGS. 37A and 37B represents sketches of two hybrid solar cell structures involving a-Si(i):H/a-Si(n):H as front side emitter and the presented fired heterojunction with the silicon-doped layer the SiCx(p) or its variation with an a-Si(i)(buffer)/SiCx(p) on the rear side respectively with normalized flow ratio of the SiCx(p) of 0.18;

FIG. 37C represents current density-voltage (J-V) measurements of proof-of concept hybrid cells involving a silicon heterojunction on the front side and fired heterojunction with the silicon-doped layer the SiCx(B) or its variation with an a-Si(i)(buffer)/SiCx(p) on the rear side respectively with normalized flow ratio of the SiCx(p) of 0.18;

FIG. 38 represents light soaking after six consecutive measurements of the cells employing a conventional silicon heterojunction on the front side and the fired heat resistant heterojunction on the rear side A single nc-SiCx(p) with normalized flow ratio of 0.18 fired at two different peak temperatures for a dwell time of 3 sec, B single nc-SiCx(p) as function of the normalized to the max value of the TMB_2% flow; C single nc-SiCx(p) with normalized flow ratio of 0.18 fired at same peak temperatures and different dwell time, D bilayer nc-Si(i)/nc-SiC(p) with normalized flow ratio of of the SiC 0.18 as function of the normalized to the max deposition time of the intrinsic buffer layer.

Figure 39:
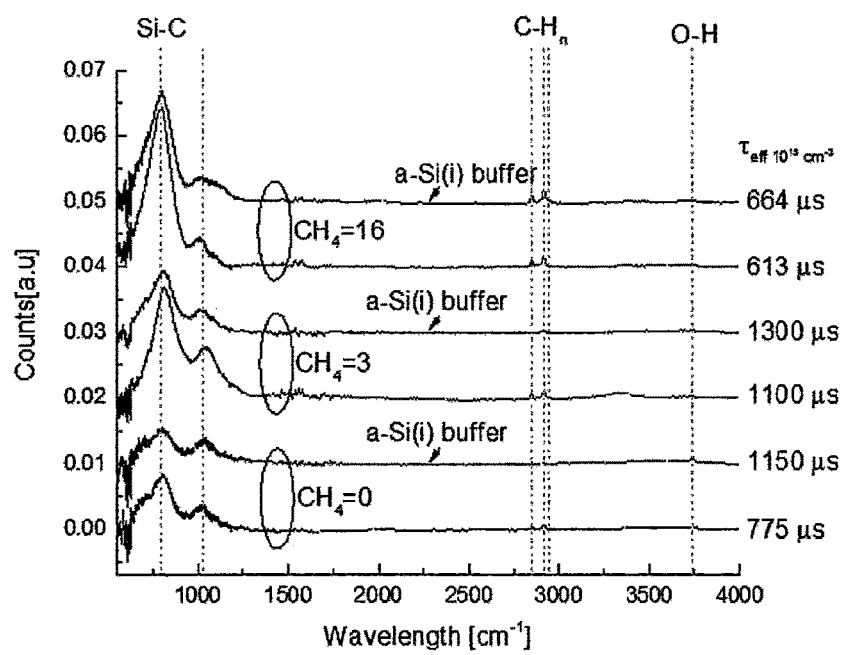
Figure 40:
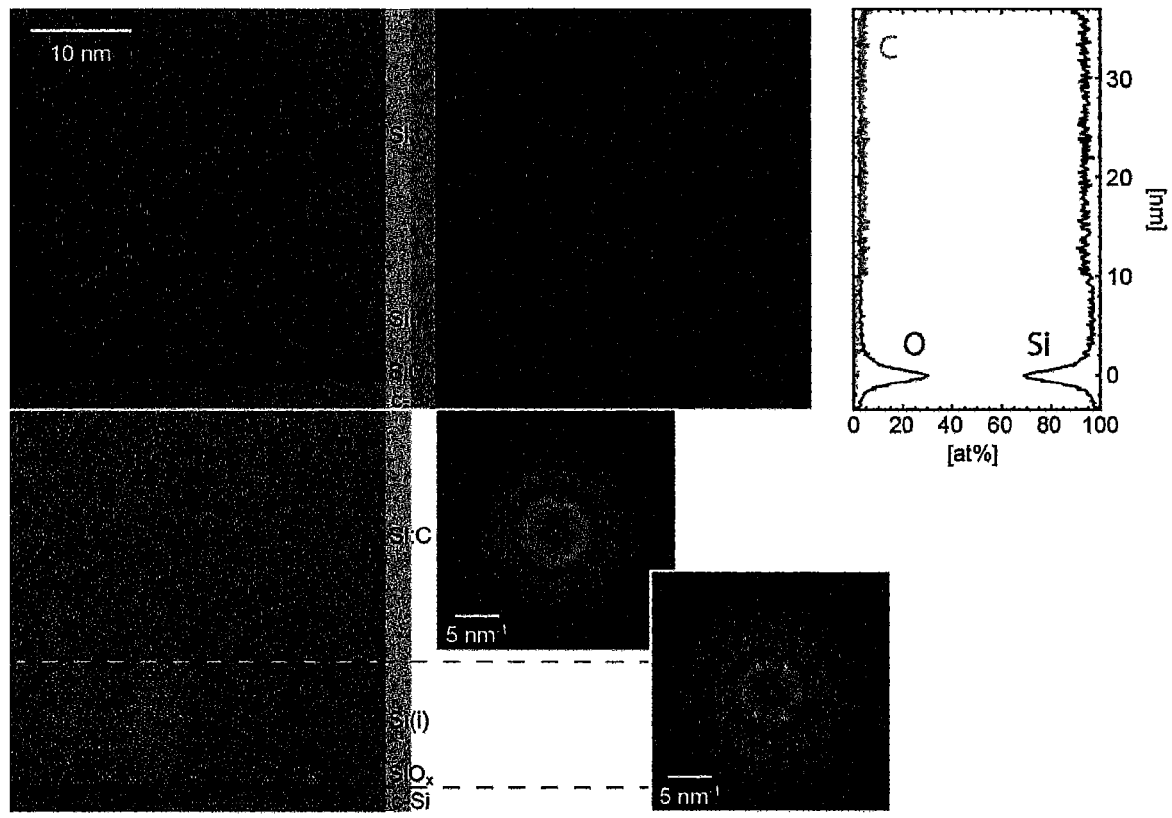
Figure 41:
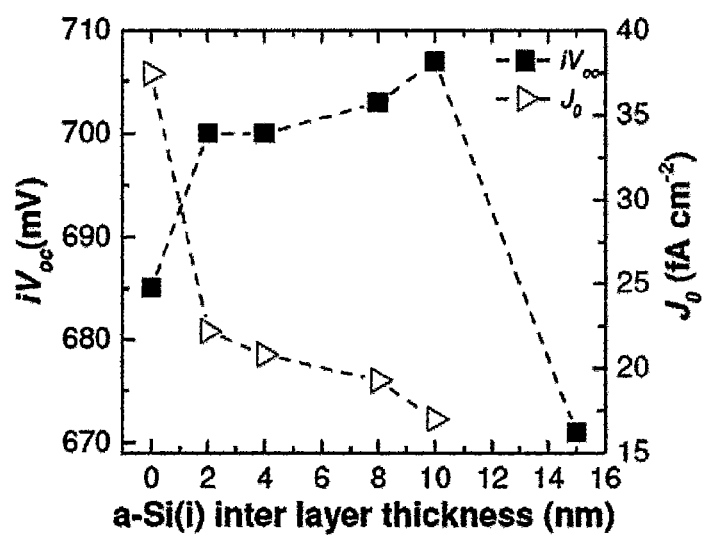
Figure 42A:
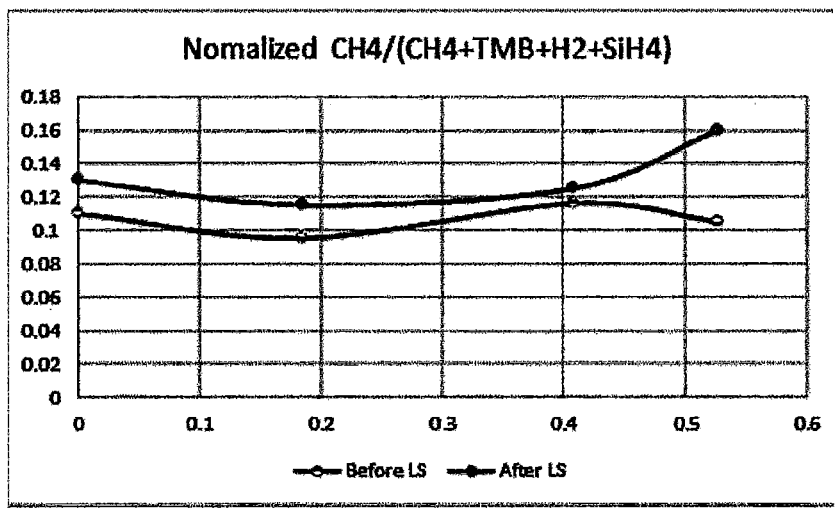
Figure 42B:
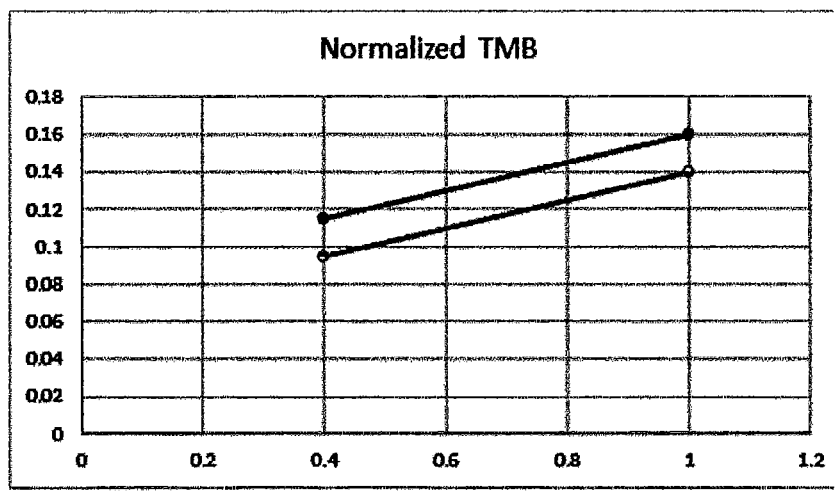
Figure 42C:
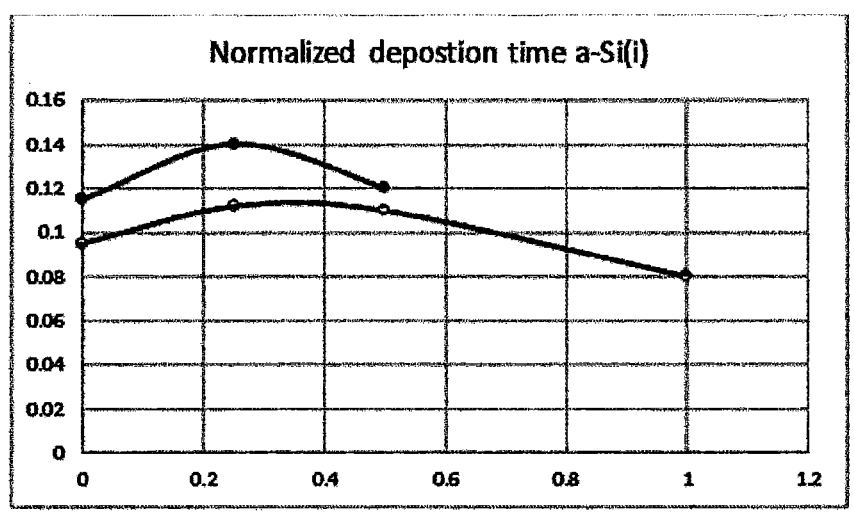

FIG. 39 represents Fourier-transform infrared spectroscopy (FTIR) measurements of the fired heterojunction with employing $SiC_x(p)$ layers with different $CH_4$ flows with and without aSi(i) as buffer layer after firing and hydrogenation. Si—C and C—$H_n$ absorption peaks increase with increasing of the normalized flow ratio $CH_4$ flow;

FIG. 40 represents HRTEM micrograph, STEM HAADF image and EDX map of the c-Si with SiOx/Si/SiCx(p) after thermal annealing;

FIG. 41 represents i-VOC and J0 as function of the thickness of the the a-Si buffer layer forming the a-Si(i)/a-SiCx(p) (in the as-deposited state) after thermal annealing;

FIG. 42 represents surface photo voltage (SPV) measurements of the fired heat resistant heterojunction with single SiCx(p) with several values of the normalized flow ratio before and after in-situ light soaking; SPV of the fired heat resistant heterojunction with single SiCx(p) with different values of the normalized TMB flow ratio before and after in-situ light soaking; SPV of the fired heat resistant heterojunction with bilayer Si(i)/SiCx(p) with different values of the normalized deposition time for the Si(i) buffer layer before and after in-situ light soaking.

Figure 43:
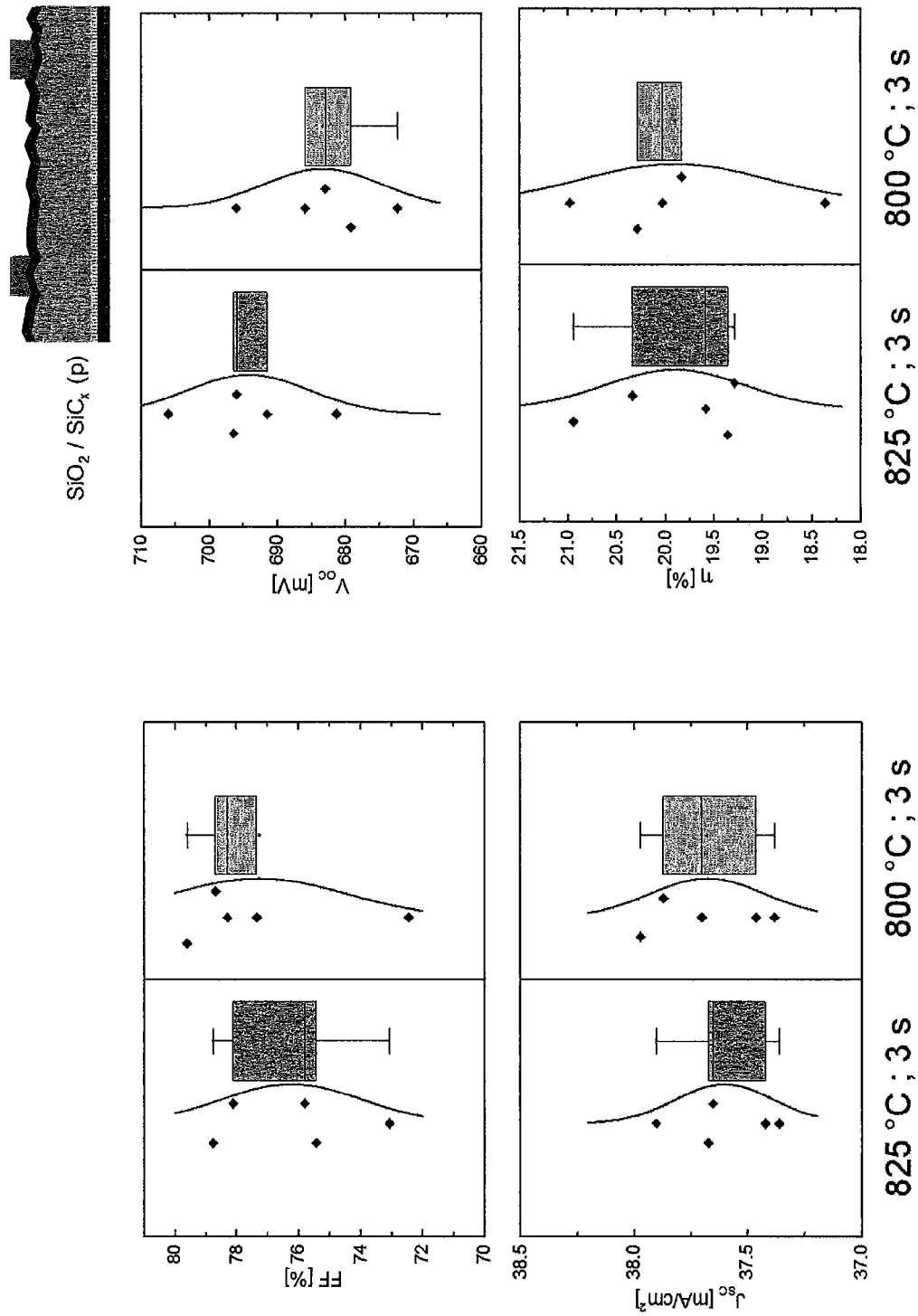
Figure 44:
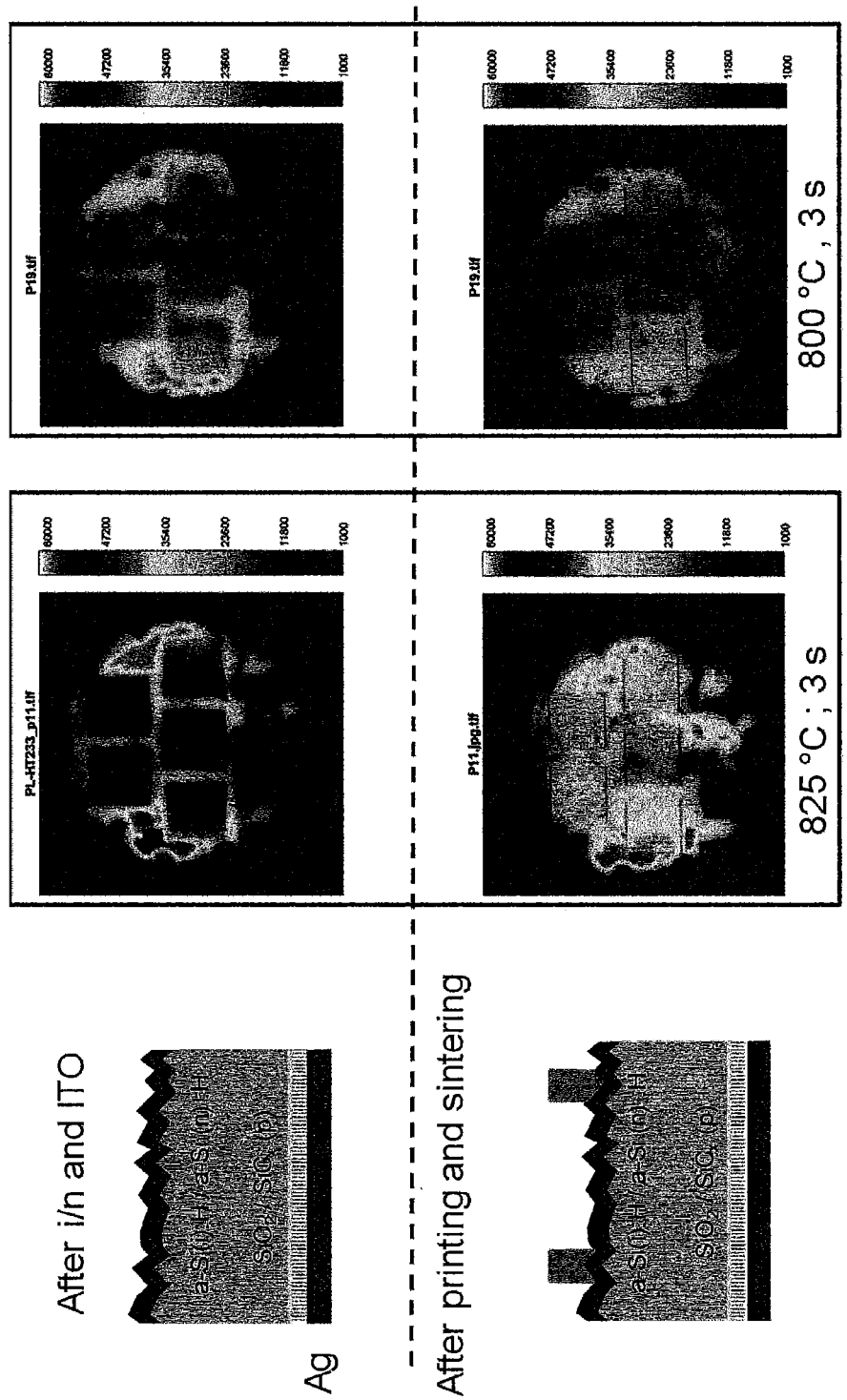
Figure 45:
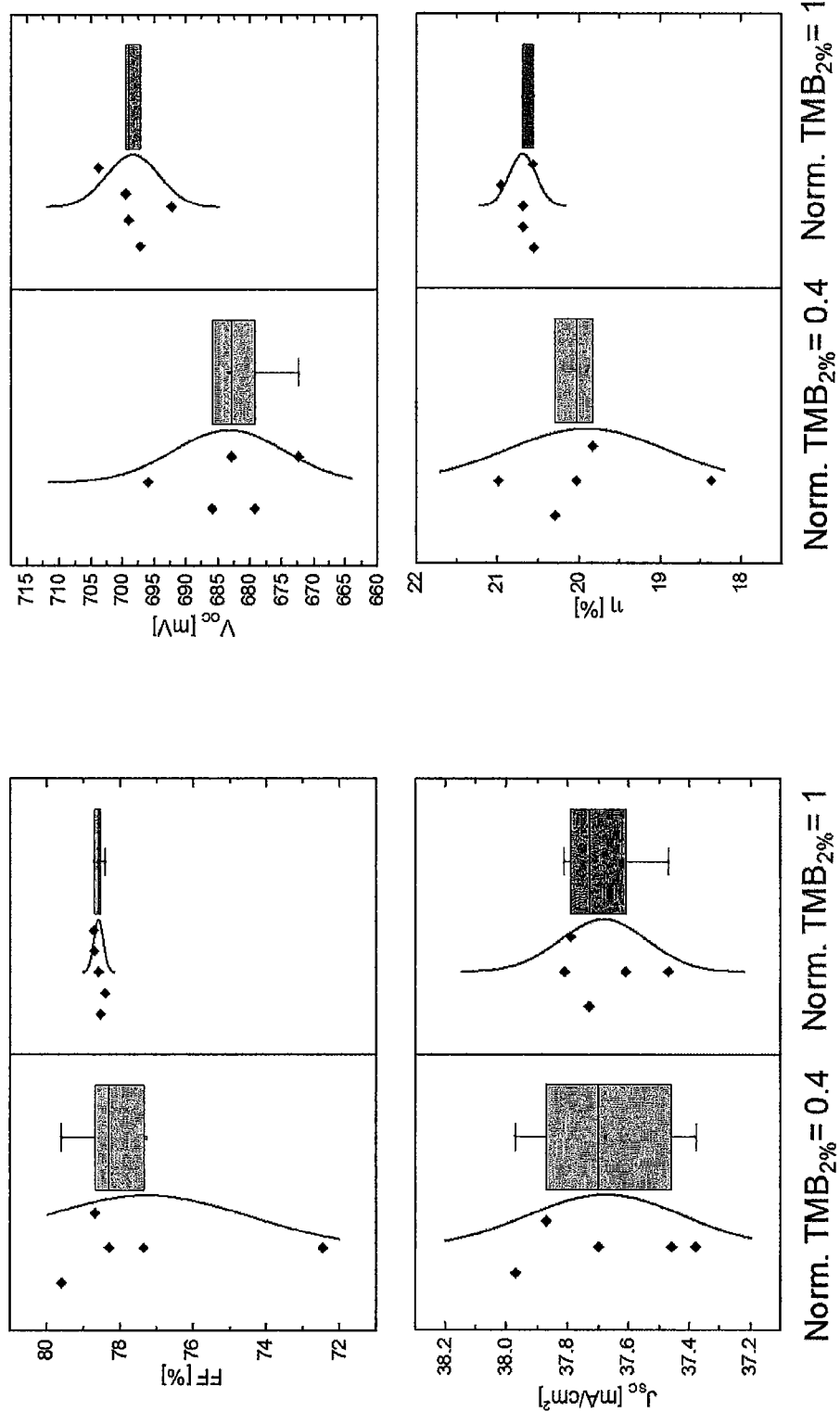
Figure 46:
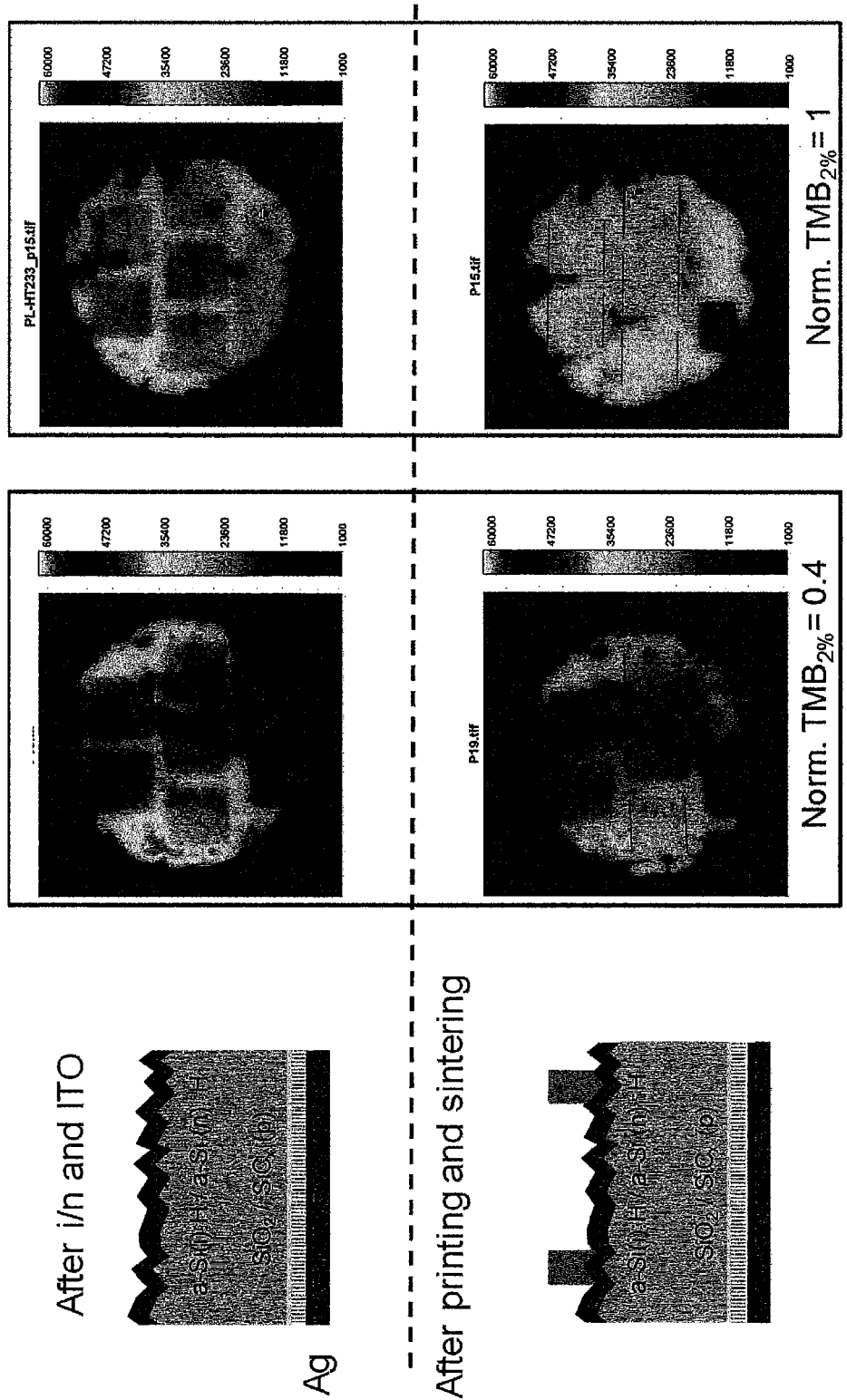
Figure 47:
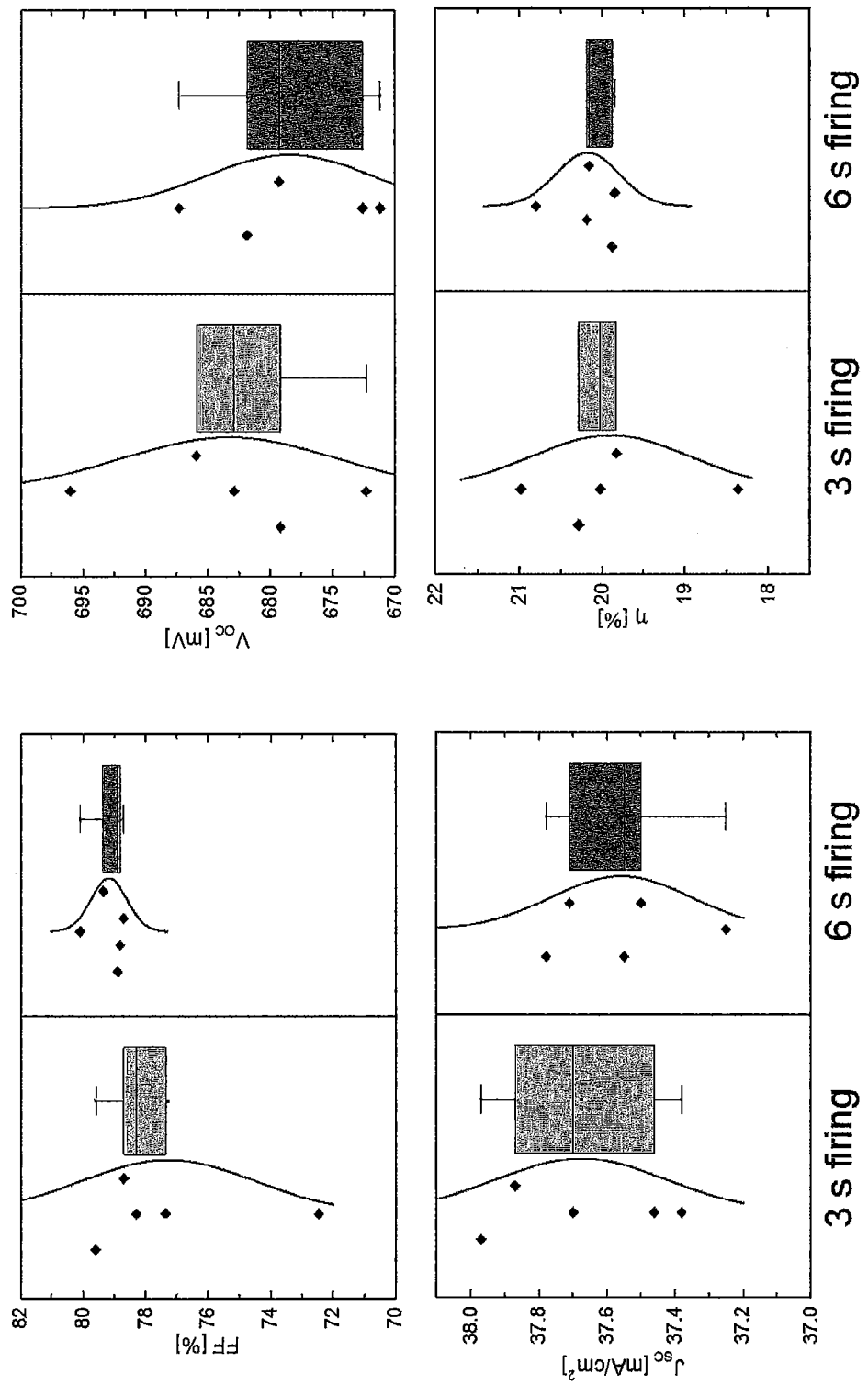
Figure 48:
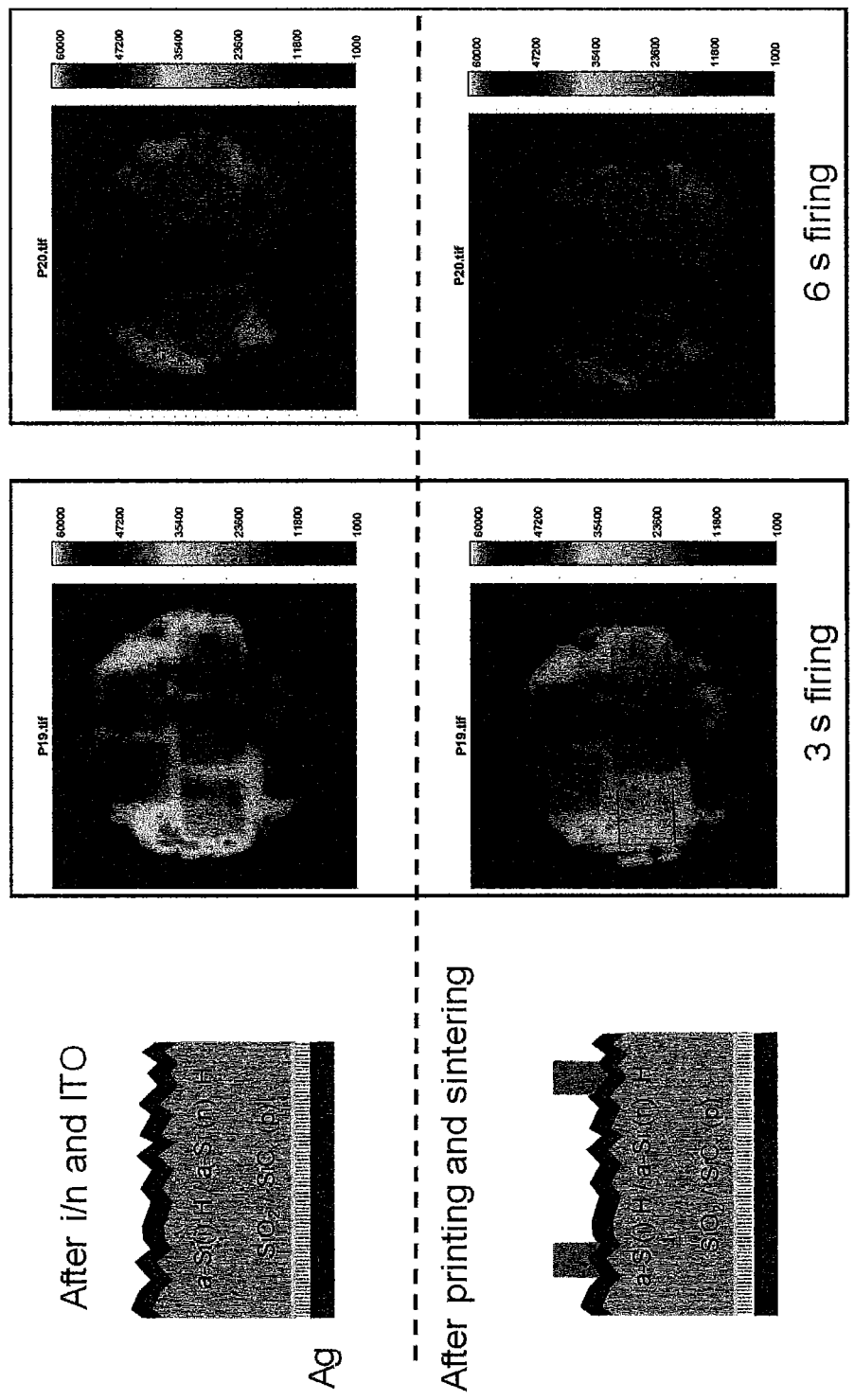
Figure 49:
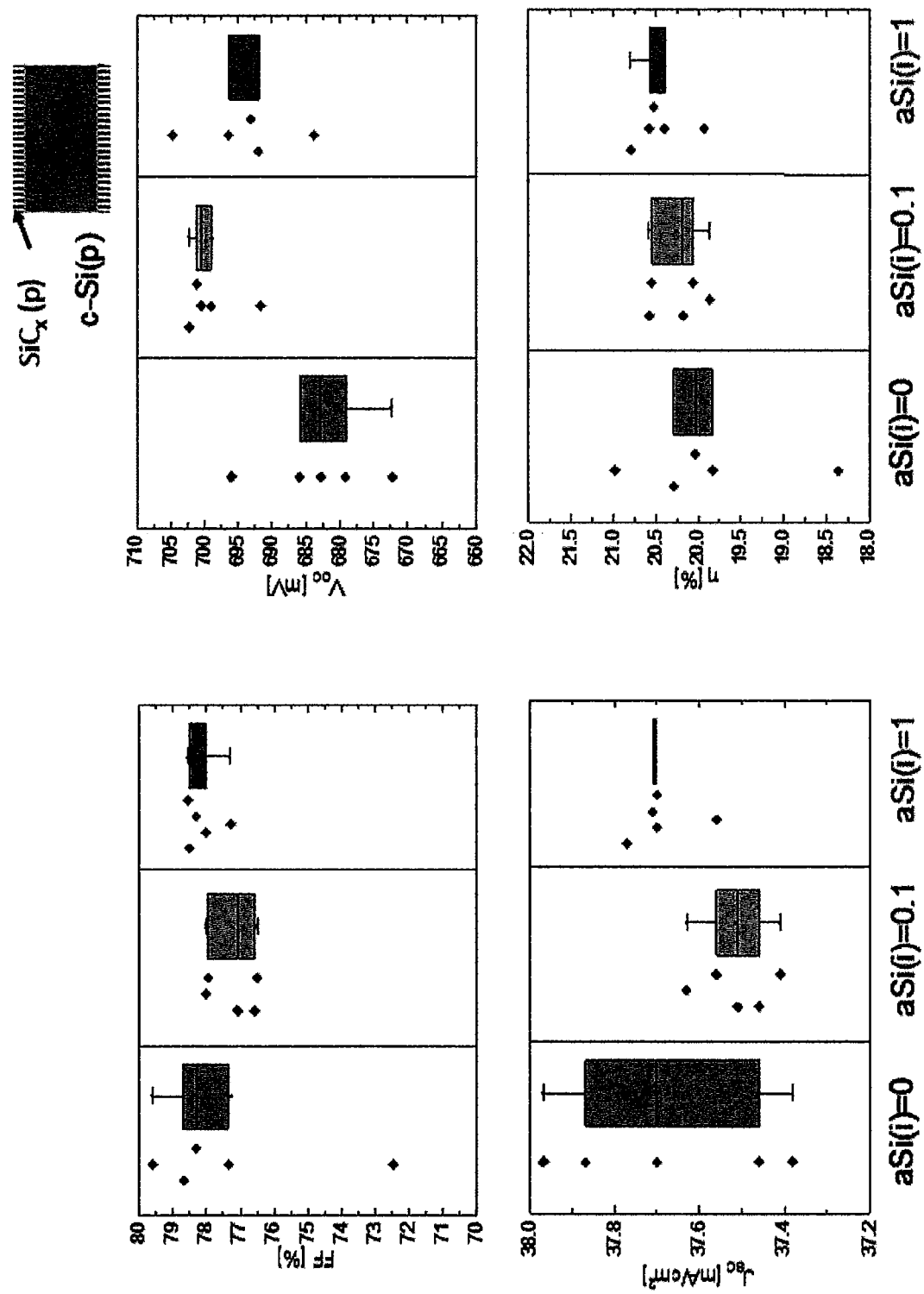
Figure 50:
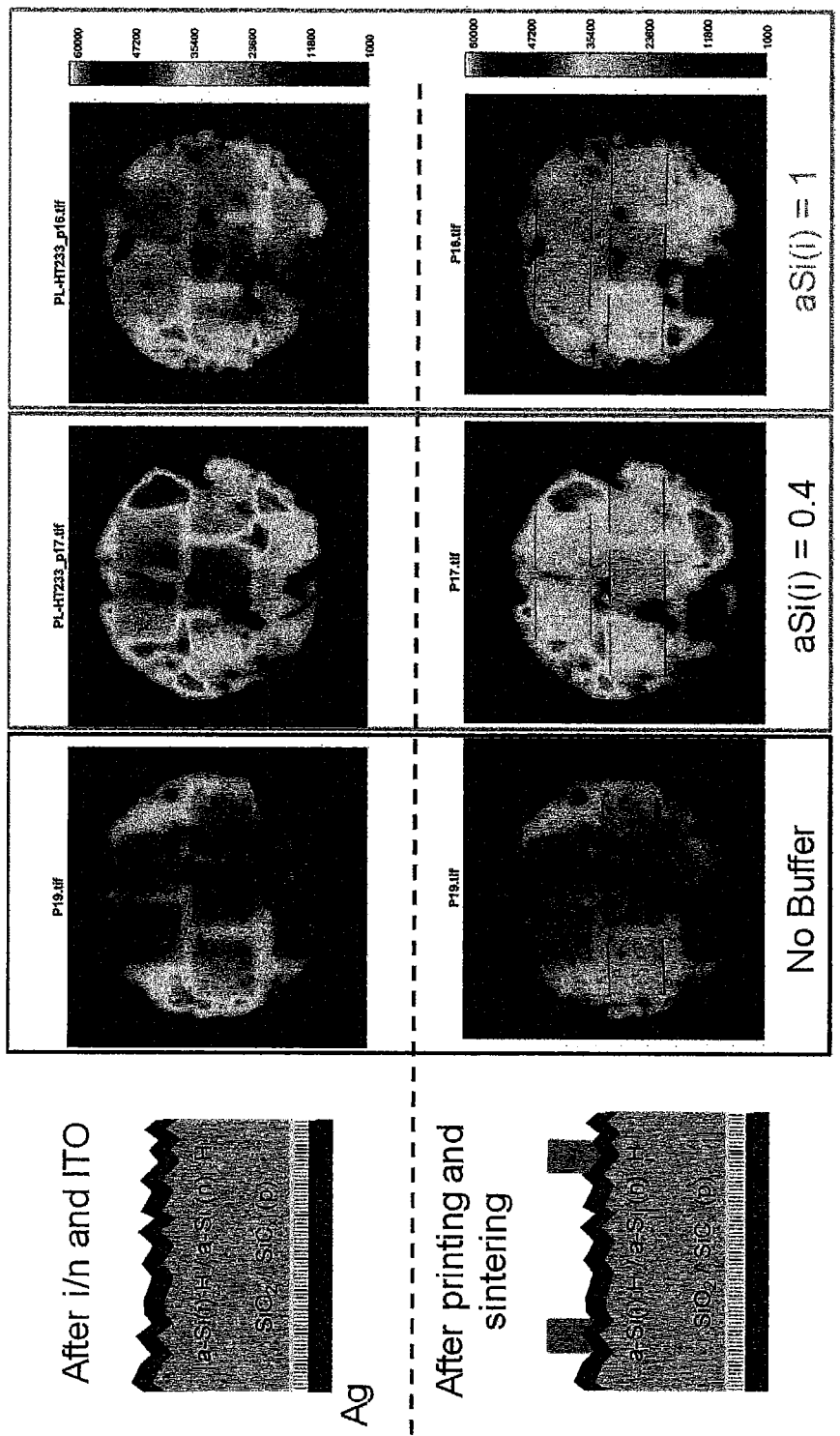
Figure 51:
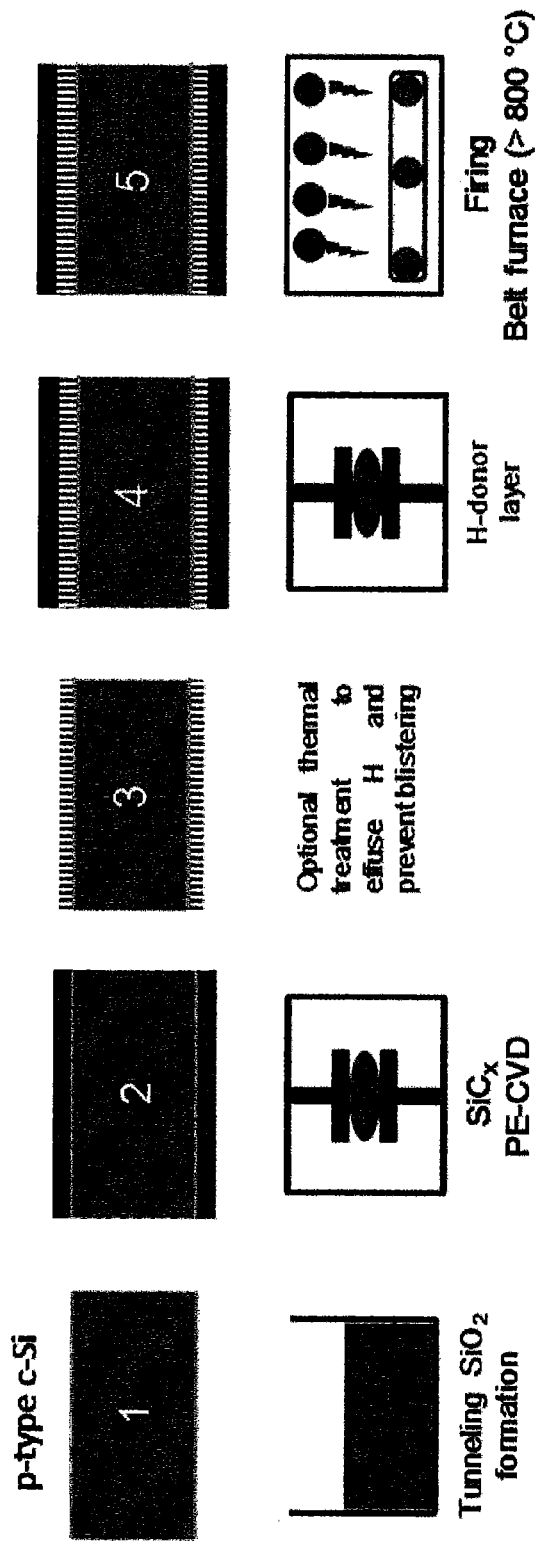
Figure 52:
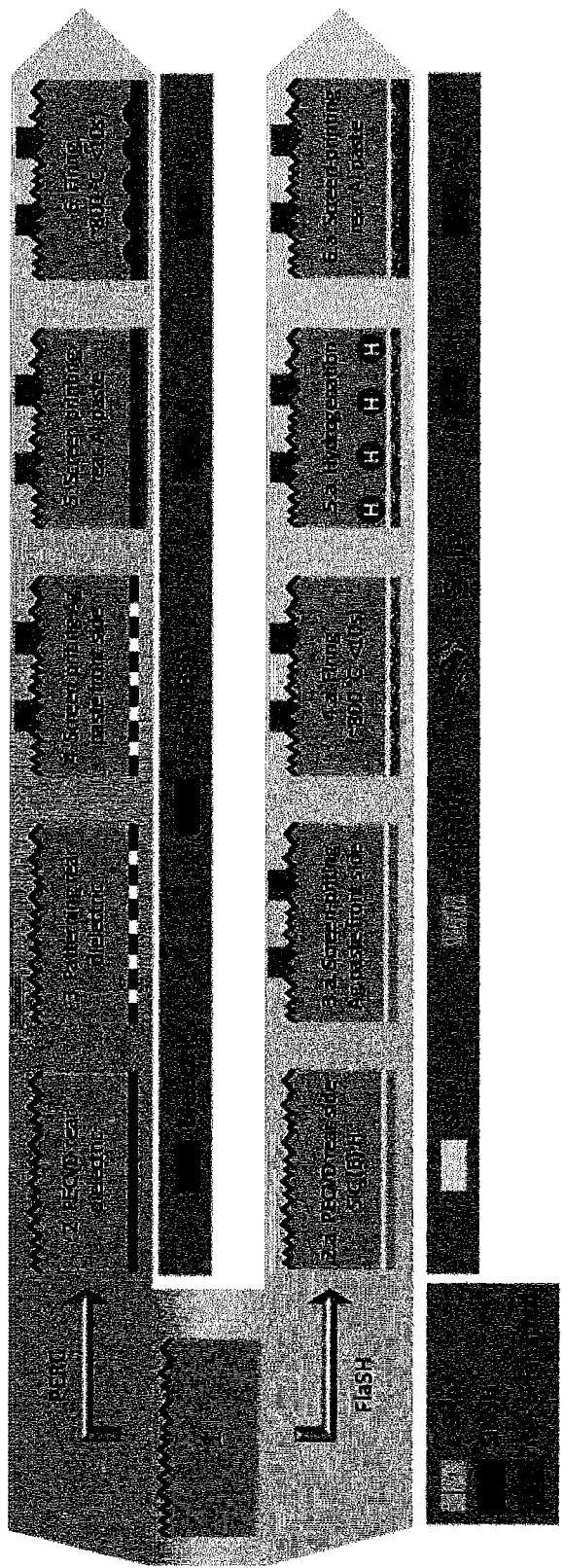

FIG. 43 Represents external parameters (i.e. Jsc, VOC, FF and η) of hybrid cells with different firing temperature of the heat resistant heterojunction;

FIG. 44 represents PLI measurements of hybrid cells with different firing temperature of the heat resistant heterojunction before and after curing of the ITO (i.e. annealing at 210° C. for 30 min);

FIG. 45 represents external parameters of hybrid cells with different doping flow of the heat resistant heterojunction;

FIG. 46 represents PLI measurements of hybrid cells with different doping slow of the heat resistant heterojunction before and after curing of the ITO (i.e. annealing at 210° C. for 30 min);

FIG. 47 represents external parameters of hybrid cells with different firing time of the heat resistant heterojunction;

FIG. 48 represents PLI measurements of hybrid cells with different firing time of the heat resistant heterojunction before and after curing of the ITO;

FIG. 49 represents external parameters of hybrid cells with different thickness of the intrinsic buffer layer of the heat resistant heterojunction;

FIG. 50 represents PLI measurements of hybrid cells with different with different thickness of the intrinsic buffer layer of the heat resistant heterojunction before and after curing of the ITO;

FIG. 51 represents alternative hydrogenation process of the heat resistant heterojunction FIG. 52 represents a process flow for manufacturing p-type PERC (steps 1-6) compared with the inventive FlaSH contact integration (steps 1-6.a).

DESCRIPTION OF PREFERRED EMBODIMENTS

The present invention relates to the provision of improved silicon heterojunction solar cells and methods for the manufacturing thereof.

As will be understood from the following description and the appended figures the solar cell of the invention relies on the provision, in a heterojunction-type solar cell, of a passivating and conductive stack comprising a thin wide band gap material layer, formed of a material such as SiOx for example, as a passivation layer between a light absorbing silicon layer, preferably formed of a silicon wafer and a doped silicon-based layer.

FIGS. 2 to 7 represent a cross section of a heat-resistant heterojunction solar cell HC according to the invention in various embodiments. The heterojunction solar cell HC essentially comprises a light absorbing silicon layer 1, for example consisting of a silicon wafer, a first and a second electrode layers 300, 301 and a passivating and conductive stack PC arranged between said light absorbing silicon layer 1 and at least one of the electrode layers. According to the invention, the passivating and conductive stack PC comprises at least a wide band gap material layer 10 arranged on a surface of the light absorbing silicon layer 1 and doped silicon-based layer 6 arranged on a surface of the wide band gap layer 10. In the context of the invention, the wide band gap material layer 10 is defined as a material having an electronic band gap greater than 1.4 eV, the nature and function of which will be described hereinafter. Optionally, the passivating and conductive stack PC may also comprise a buffer layer 4 and a capping layer 12.

The use of such thin wide band gap material layer 10 in combination with a doped silicon-based layer 6, preferably comprising silicon carbide SiCx, as passivating contact instead of intrinsic hydrogenated amorphous silicon commonly found in standard silicon heterojunction solar cells provides a more homogenous and more temperature stable passivating contact allowing for the heterojunction solar cells of the invention to withstand firing and/or thermal annealing (as defined above) making the inventive solar cell and heterojunction compatible with low cost metallization schemes required for industrialization of heterojunction solar cells.

As opposed to hydrogenated amorphous silicon, the wide band gap material layer 10 avoids epitaxial growth of the doped Si-based layer 6 and allows to achieve high surface passivation after and/or during firing and/or thermal annealing. For example, upon firing of the heterojunction layer stack of the invention a passivating species (i.e. hydrogen, fluorine, nitrogen, or oxygen) contained in doped silicon based layer 6 or another layer forming the passivating and conductive stack, evolve and incorporate in the wide band gap material layer 10 or at the interface between the light absorbing silicon layer 1 and wide band gap layer 10 and reduces the interface state density.

According to the invention, surface passivation of the proposed heterojunction is activated by the thermal treatment process. In case of firing, this allows to make use of co-firing processes which are employed in manufacturing of most industrial wafer based c-Si solar cells to form the front contact and the high quality passivation rear passivating and conductive stack (heat-resistant heterojunction). Additionally, the HC stack ensures full area contact functionalities (i.e. no need for patterning), thus reducing processing steps while increasing conversion efficiency with respect to PERC solar cells.

Passivating species preferably comprise according to the present invention chemical elements such as hydrogen, fluorine, nitrogen, or oxygen. Such passivating species may provide passivation of a surface, as well as of electronic defects, through interfacing between layers and/or chemical reactions.

In the present invention, firing can also be used to hydrogenate the wide band gap material layer 10 and decrease its defect density and the interface with the light absorbing silicon layer 1. For a SiOx wide band gap material layer 10, the optimum temperature for hydrogen incorporation at the Si-SiOx interface is higher than 400° C. compared to 200° C. of a-Si:H, which illustrates the enhanced temperature stability compared to silicon heterojunctions known from the prior art. Hydrogen incorporation can also be achieved by rapid thermal annealing (firing) at temperatures higher than than 600° C., still preferably higher than 750° C. by first providing a hydrogen rich wide band gap layer 10, for example SiNx, and then firing. As demonstrated by the inventors hydrogen can be also incorporated during the firing of the heat-resistant heterojunction.

Depending on the density of defects at the interface electrons or holes injected from the silicon wafer 1 to the wide band gap material layer 10 during device operation or irradiation can be trapped as fixed charges or deactivate fixed charges, resulting in more favourable alignment of the energy bands. This means that the height of the potential barrier for the collected carrier decreases, thus enhancing surface passivation and charge carrier transport.

The charges can be trapped or deactivated at the light absorbing Si wafer 1-wide band gap material layer 10 interface, in the wide band gap material layer 10, at the wide band gap layer-doped silicon based layer 6 interface, or where the passivating and conductive stack PC comprises a buffer layer 4 and/or capping layer 12 in the wide band gap material layer 10-buffer layer 4 interface, or in the buffer layer 4 or in the doped silicon based layer 6, or in the capping layer 12, when a capping layer 12 is provided in the inventive stack as shown in FIGS. 3 and 6 in particular.

As opposed to amorphous silicon interface layers prepared by PECVD and already employed in some SHJ solar cells the wide band gap layer 10, which may be made of SiOx in a preferred embodiment, of the inventive heterojunction does not necessarily passivate the light-absorbing silicon layer 1 surface directly upon application thereon, but only after thermal treatment(s) of the passivating and conductive stack of the heterojunction. The capacity of the inventive heterojunction solar cell HC to undergo and withstand thermal treatment(s) and to provide increased electrical generation efficiency thereafter is thus a central aspect of the of an heterojunction solar cell according to the invention and its manufacturing process.

Such SiOx wide band gap layer 10 furthermore has the advantage of being more transparent than a-Si:H layers, which is advantageous for front side application of the inventive heterojunction.

The wide band gap material layer 10 prevents epitaxial regrowth of the deposited layer during high temperature (T>600° C.) thermal treatment. It is preferably provided as a thin wide band gap material layer 10, i.e. having a thickness of at most 20 nm. When said wide band gap layer 10 is realized from SiOx material, its thickness is usually less than 3 nm, preferably less than 1.5 nm, which allows charge carrier transport through the layer.

Optionally, pinholes are formed in the thin wide band gap material layer 10 during the process, leading to a direct connection between the light-absorbing silicon layer 1 and the doped silicon-based layer 6 and/or any further deposited silicon-based buffer layer 4. The size of the pinholes is typically in the range of the thickness of the dielectric layer, or in the range 0.2 nm to 200 nm, preferably 0.2 nm to 20 nm.

With the heterojunction solar cell HC and firing thermal treatment of the present invention, dopants may not diffuse from the doped silicon-based layer 6 through the wide-band gap layer 10 into the light-absorbing silicon layer 1. In the latter case, a very abrupt, so-called shallow, buried junction is formed i.e. intensity [counts/s] of the dopants decaying over at least one orders of magnitude within a distance of less than 20 nm, preferably less than 10 nm, further preferably less than 5 nm. The advantage of such very abrupt shallow buried junctions is that the total dopant dose in the silicon wafer 1 is much lower than in highly-doped regions employed commonly, which typically have a depth of above 20 nm with a surface doping concentration of more than $5 \cdot 10^{19}$ cm$^3$, because the lower dopant dose reduces, or eventually eliminates completely, Auger recombination and free-carrier absorption.

Preferably, the wide band gap layer 10, the silicon-based buffer layer or the silicon-based doped layer 6 can be doped and act as doping source for the wafer, i.e. the light-absorbing silicon layer 1 during a thermal treatment.

This effect relies on the following physical phenomenon. A segregation coefficient k for the dopant can be ≠1 for the materials in the (A) light-absorbing silicon layer 1 or one of the other layers, and (B) one of the at other layers.

$$k = C_{eq,A}/C_{eq,B}$$

$C_{eq,A}$ is the equilibrium concentration of the dopant in material A, and $C_{eq,B}$ is the equilibrium concentration of the dopant in material B.

For k>1, dopants can be expelled from B to A during a thermal treatment, even if before said thermal they are present in equal concentration is both A and B, resulting in a step in the doping profile. See also [Sze, Semiconductor Devices: Physics and Technology, John Wiley & Sons Ltd, 2012, ISBN 978-0470537947] for a more detailed discussion. This effect can be utilized for instance to expel dopants during a thermal treatment from one of the layers of the layer stack to the light-absorbing silicon layer 1, potentially useful to increase doping concentration in the latter. Consequently, the doping profile in the light-absorbing silicon layer 1 or in the passivation layer stack (formed of all layers on said silicon layer 1) can depend on the properties (composition, doping, thickness, etc.) of the silicon-based doped layer 6 or silicon-based buffer layer 4, also independent of the thermal treatment. The passivating and conductive stack PC can thus be tuned towards achieving a specific doping profile in the wafer 1 or some other adjacent layer without changing the conditions of the thermal treatments.

The wide band gap layer 10 is usually a thin passivating layer, in some embodiments of a dielectric material such as, a thin silicon oxide layer, prepared by chemical oxidation, for example in HNO$_3$, RCA, O$_3$, or HCl.

The wide band gap layer 10 can be tuned for enhanced or reduced diffusion of dopant atoms from the passivation layer stack to the light-absorbing silicon layer 1 for example by adapting its thickness, density, chemical bonding configuration and composition. It is known that for thermal oxidation of silicon the thickness of the grown silicon oxide layer can be controlled precisely by tuning the oxidation temperature, time, ambient, and other process parameters. However, for chemical oxidation of silicon, for example in HNO$_3$, the process is reported to be self-limiting, i.e. after a certain exposure time, for example 60 min, the thickness does not increase further.

Experiments conducted by the inventors have shown, surprisingly, that the thickness of a silicon oxide layer grown by exposure to HNO$_3$ depends on the doping concentration in the light-absorbing silicon layer 1. Choosing an appropriate doping concentration thus permits to control the oxide thickness, and thus also to control diffusion of impurities from the silicon-doped layer through the wide bandgap material into the light-absorbing silicon layer 1.

Diffusion of dopants from the silicon-doped layer to the light-absorbing silicon layer 1 through the wide band gap layer 10 can further be influenced for example by altering the wide band gap layer 10 by plasma, thermal, electrical or chemical treatments.

For example, thin silicon oxide layers 10 can be nitrided by exposure to a nitrogen containing plasma or by annealing in nitrogen, N$_2$O or NO atmosphere, which reduces diffusion of many elements through the silicon oxide layer. Further, silicon oxide layers can be densified by thermal annealing, also reducing diffusion from the silicon-doped layer to the light-absorbing silicon layer 1. The density and composition of the buffer layer can also be influenced by exposure to chemical agents, for example exposing a chemical oxide grown in HNO$_3$ to O$_3$.

A given wide band gap layer 10 can also be restructured with plasma treatments, which can result in a less dense buffer layer 4 where the latter is present in the passivating and conductive stack PC, and which can enhance diffusion of dopants from the silicon-doped layer stack to the light-absorbing silicon layer 1.

According to the invention, the wide band gap layer 10 and the thermal treatment(s) applied to the passivating and conductive stack PC are preferably designed such that dopants which diffuse from the silicon-doped layer stack towards the light-absorbing silicon layer 1 do not reach the light-absorbing silicon layer 1, i.e. do not alter the doping concentration in the light-absorbing silicon layer 1.

Furthermore, the wide band gap layer 10 may contain impurity atoms already prior to the thermal treatment(s). During said thermal treatment(s) these impurity atoms can then diffuse from the wide band gap layer 10 either to the light-absorbing silicon layer 1 or to other adjacent layers of the passivating and conductive stack PC were they can act as dopant impurities. This can be especially useful for aligning the energy bands in the light-absorbing silicon layer 1 and in the passivating and conductive stack PC to enhance charge carrier transport through the buffer layer 4. The wide band gap layer 10 can be amorphous or crystalline.

Transport through the wide band gap layer 10 can proceed via direct classical transport, or, if the buffer layer 10 is a dielectric layer, by hopping or tunnelling for example, or a combination of all mechanisms.

Part of the invention is that highly doped region 100 enhances charge carrier transport from the light-absorbing silicon layer 1 to the passivating and conductive layer stack. In the context of the present invention, "Highly doped" shall mean a concentration of the doping impurity of more than $10^{17}$ cm$^{-3}$, preferably more than $10^{18}$ cm$^{-3}$, still preferably more than $10^{19}$ cm$^{-3}$. This is especially important when the electronic band structure of the passivating and conductive stack PC is not identical to the band structure of the light-absorbing silicon layer 1. This is due to the effect that doping influences band alignment. High doping on both sides of a thin wide bandgap material 10 aligns the maxima of the supply functions in the layers adjacent to the dielectric layer and thus enhances charge carrier transport through the wide bandgap layer.

The terms "Supply function" shall be understood here to the charge carrier distribution at the interface of light-absorbing silicon layer 1 with the dielectric silicon-based doped layer 6 as described in [Sentaurus™ device user guide, Synopsis, Version I-2013, Mountain View (Calif.), USA]. For this reason, the alignment effect of the supply function is especially beneficial for the case of the heat-resistant heterojunction layer stack of the current invention.

Interestingly, for shallow in-diffusion, band alignment can also be caused by fixed charges instead or in addition to a highly doped region. The inventors have surprisingly found that fixed charges can cause band bending such that passivation and/or charge carrier transport is enhanced, especially using fixed charge for influencing the alignment of the charge carrier supply functions. Fixed charges can be stored in any of the layers of the passivation layer stack or at the layers interfaces.

The layers of the passivating and conductive stack and the light-absorbing silicon layer 1 can react with each other during thermal treatment they undergo during their manufacturing process. This is especially possible if adjacent layers of said passivating and conductive stack PC are made of a different materials, such as for example SiOx and SiCx. Reaction is meant as chemical reaction, or in general as any influence of one layer on the other, caused by the presence of the former.

Avoiding such a reaction is one of the roles of the silicon-based buffer layer 4.

Another role of the silicon-based buffer layer 4 can be to adjust diffusion of dopants from the silicon-based doped layer 6 deposited on it towards the wide bandgap material 10 and the light-absorbing silicon layer 1 during the at least one of the thermal treatments. The heterojunction solar cell structure of the present invention can be applied to different morphologies of the light-absorbing silicon layer 1 such as: polished surfaces, shiny-etched surfaces, textured surfaces (alkaline, acidic or via plasma etching) and surfaces that were textured with subsequent surface smoothing or roughening.

Various embodiments of the inventive solar cell structure according to the present invention are represented in FIGS. 2 to 7 as explained below.

FIG. 2A represents of solar cell made from a silicon wafer 1 with a low-cost front side electrode stack ($POCl_3$-diffused emitter 102, SiNx-anti reflection layer 202 and low-cost fired metallization 302) and the inventive full area heat resistant heterojunction on the rear side. The thermal treatment needed for forming the passivating contact of this invention can be accommodated during the thermal annealing (e.g. compatible with $POCl_3$, $BBr_3$, $BCl_3$ for forming the other contact polarity) or during the firing for front side metallization.

In both cases the rear passivating contact stack consists of a thin SiOx layer 10, an optional Si-based buffer layer 4, a doped Si-based (e.g. SiCx) layer 6 and a capping layer 12. The doped Si-based layer 6 is designed to be permissive to hydrogen or other passivating species such that the doped Si-based layer 6 is mechanically stable (i.e. does not blister) even when using firing, and a passivating species-donor layer, deposited after the firing process, does not blister upon annealing or further firing. Additionally, one of the layer forming the passivating and conductive stack might contain passivating species which are released by the thermal treatment (firing of thermal anneal) and driven towards the interface between the wide band gap material and the Si wafer where they passivate defects.

Preferably, as shown schematically in FIG. 2A, solar cells include a surface texture. For the sake of simplicity solar cells are often depicted with planar surfaces as shown in FIG. 2B, as is used in the other representative figures. In any case, every surface can be textured or planar.

A variant of part of the solar cell of FIG. 2 is shown in FIG. 5A, 5B, where the passivating and conductive stack on the silicon wafer 1 comprises a wide band gap material layer 10 and doped silicon-based layer 6 and transparent conductive oxide layer 301 and metallization layer 300 (FIG. 5A), and additionally a Si buffer layer 4 (FIG. 5B).

Alternatively, to the metallization layer 300 consisting of several elements (fingers) as shown in the FIGS. 5A, 5B it can also be applied as full area layer (not shown).

Figure 3C:
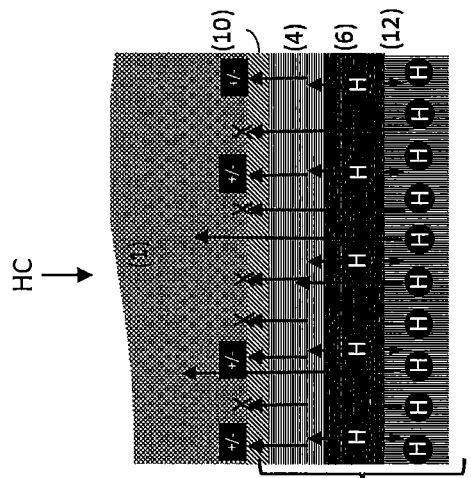
Figure 3B:
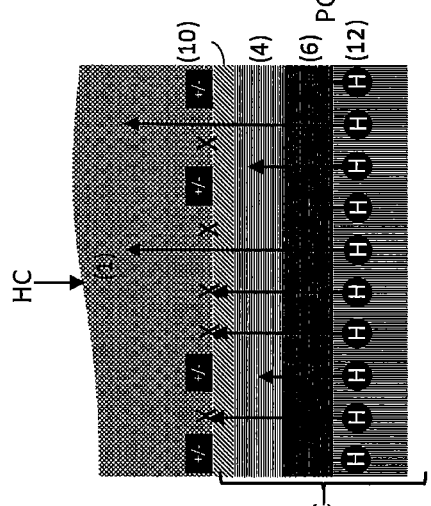
Figure 3A:
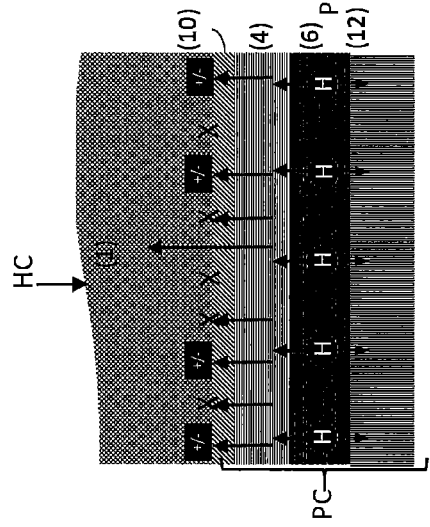

FIG. 3A to 3C show the use of a capping layer 12 in a solar cell as proposed by the invention and shown in FIG. 2A, 2B and further in FIG. 6.

A capping layer 12 is provided to ensure in-situ hydrogenation of the interface between the light-absorbing silicon layer 1 and an adjacent layer, the light-absorbing silicon layer 1 itself or the wide-band gap layer 10 or the silicon-based buffer layer 4 or the doped Si-based layer 6 or to redistribute hydrogen or reconfigure hydrogen bonding configuration in said layers. For this means, the capping layer 12:

reduces the hydrogen effusion from the layers underneath preferably acts as source of a passivating specie The capping layer 12 can be conductive and doped, and possibly be a mixed-phase material. The capping layer 12 can also act as etch-stop and diffusion barrier (e.g. Ag-glass frit penetration during firing), facilitating device integration of the passivating contact.

Indeed, some heterojunction layer stacks, for example heterojunction layer stacks consisting of SiOx and Si layers, are not chemically stable in hydrofluoric acid (HF). HF is used in many process steps in standard silicon solar cell manufacturing. A capping layer with better stability in HF than SiOx (e.g. a Si or SiCx or SiNx layer) can thus protect the heterojunction layer during solar cell processing.

Another frequently used process in solar cell manufacturing is diffusion of impurity dopants (for example phosphorous, arsenic, boron, aluminum) to define highly doped regions in the silicon wafer. Impurity diffusion is usually carried out at elevated temperatures, typically between 700° C. and 1000° C. Frequently, the silicon wafer is exposed to a diffusion source (e.g. $POCl_3$, $BBr_3$, $BCl_3$) which acts on all surfaces of the substrate. The diffusion source and the diffused regions in the silicon wafer need then to be removed after the diffusion process everywhere they are not wanted, typically by etching the diffusion source and also those parts of the silicon wafer. A more elegant solution is to apply a layer to the substrate which reduces the penetration of impurities to the substrate, thus also called diffusion barrier. In that case, the diffusion barrier might be needed to remove afterwards, but the silicon wafer does not need to be etched.

With the capping layer acting as diffusion barrier, it protects the heterojunction layer stack during a diffusion process. Consequently, in the cell manufacture process, it is possible to first prepare the heterojunction layer stack and then the capping layer, and then carry out a diffusion process. This is beneficial because the thermal profile of the diffusion process also acts as thermal treatment for the heterojunction layer stack.

The capping layer can be made of silicon (Si), silicon carbide (SiCx), silicon nitride (SiNx), silicon oxide (SiOx), silicon oxynitride (SiOxNy), silicon oxycarbide (SiOxCy), silicon carbonitride (SiCxNy), silicon oxycarbonitride (SiOxCyNz), which can all be doped p-type or n-type with Boron (B), Aluminum (Al), Gallium (Ga), Indium (In), nitrogen (N), Phosphorous (P), Arsenic (As), Antimony (Sb) and can be hydrogenated (e.g. N-doped SiCx:H). It can also be made of a transparent conductive oxide material such as tin oxide, also doped e.g. with Fluorine (F) or antimony (Sb), gallium oxide (GaOx), Indium Tin Oxide (ITO), Indium Cerium Oxide (ICO), Indium Tungsten Oxide (IWO), Indium Zinc Oxide (IZO), Zinc Tin Oxide (ZTO), indium Tin Zinc Oxide (ITZO), Indium Gallium Oxide (IGO), Indium Gallium Zinc Oxide (IGZO), Indium Tin Gallium Oxide (ITGO), Zinc Oxide (ZnO), Titanium oxide (TiOx), Titanium nitride (TiNx), aluminum nitride (AlNx), Aluminum oxide (AlOx), aluminum zinc oxide (AlZnOx), which can all contain hydrogen, Al, B, Ga, or O. The capping layer can also be a double layer of said materials, for instance SiCx:H/SiNx:H, SiNx:H/ZTO, ZTO/ITO etc. The capping layer 12 may therefore advantageously to prevent passivating species to escape from the buffer layer 4, doped Si-based layer 6, driving them towards the wide band gap material layer 10 and the wafer forming light-absorbing silicon layer 1 where dangling bonds responsible for high recombination are passivated.

As shown in FIG. 3B the capping layer 12 can further serve as passivating species donor layer in case the other layers do not contain large amounts of passivating species, for instance after a first thermal treatment, such as a firing treatment for example. Thus passivating species is reintroduced in the Si-based doped layer 6, the buffer layer 4, the interfacial wide band gap material 10 and the silicon wafer 1.

Finally, as shown in FIG. 3C the capping layer 12 can serve as passivating species donor layer and in addition prevent passivating species contained in layers 4, 6 and 10 from effusion during the firing process.

FIGS. 4 and 5 show embodiments of parts of solar cells according to the invention but which do not comprise any capping layer as described above.

Figure 1A:
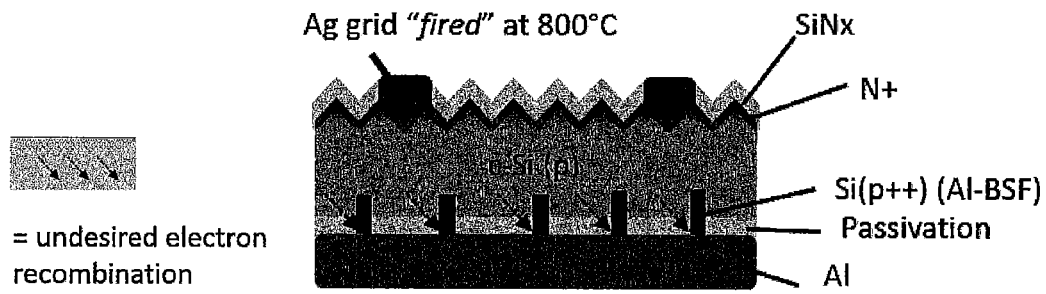
Figure 1B:
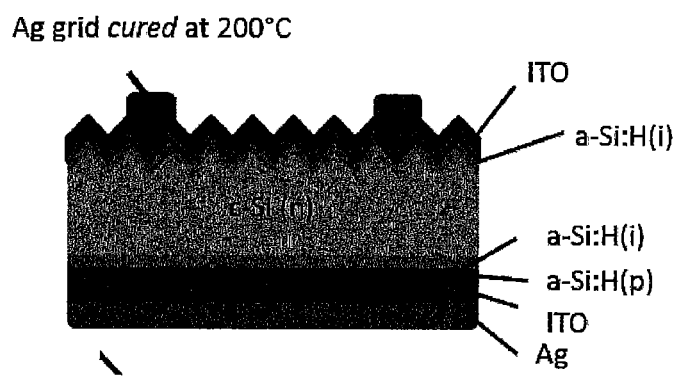

In FIG. 1A the passivating contact stack structure comprises on the light-absorbing silicon layer 1 a wide band gap material layer 10 and doped silicon-based layer 6 and metallization 300 for the rear back electrode, similar to PERC cells known from prior art otherwise. FIG. 1B further shows a similar structure but a Si buffer layer 4.

Figures 4A, 4B, 4C, 4D:
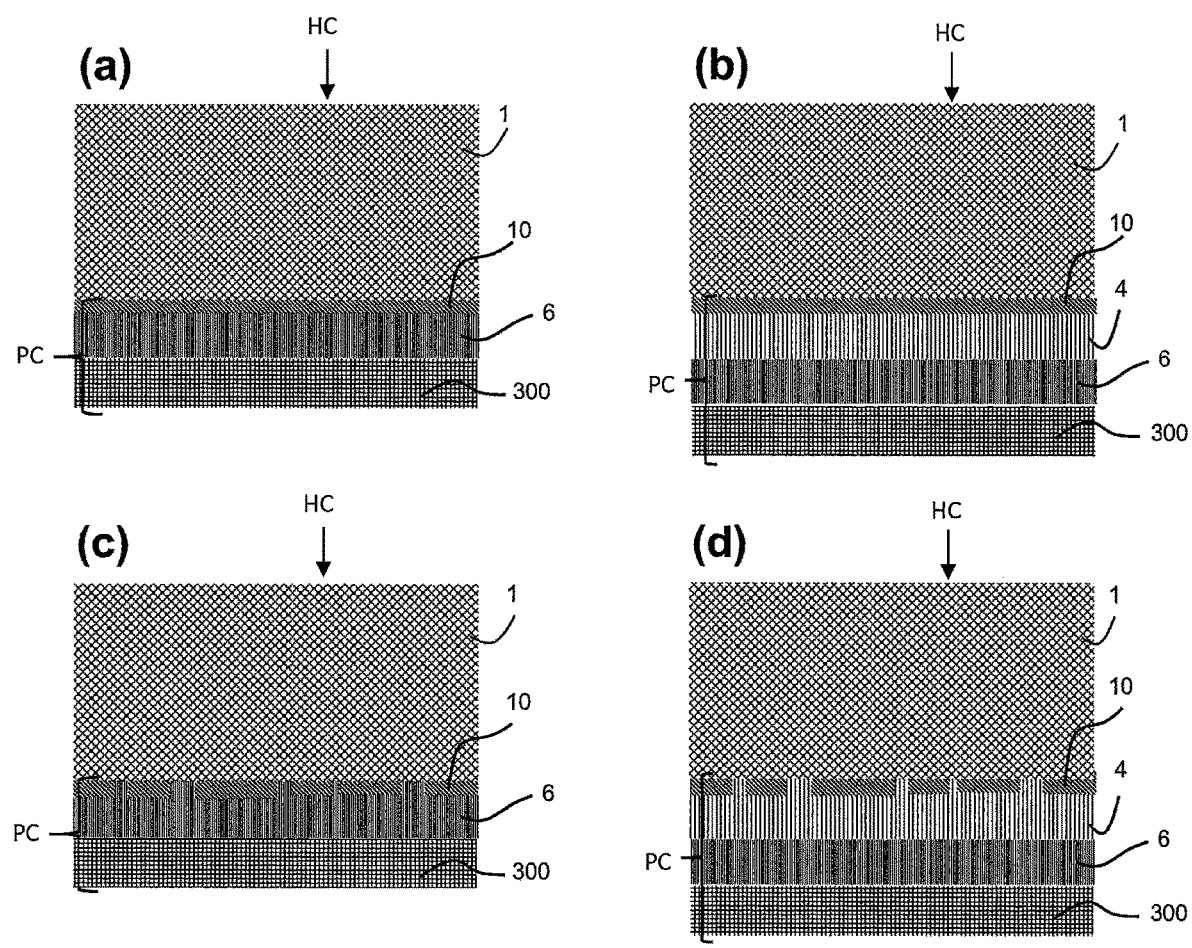
FIG. 4A to 4D represent various alternative constructions of a passivating and conductive stack for a solar cell according to the invention in a second embodiment.

FIG. 4C shows a similar structure to the cell of FIG. 1A but the wide band gap material layer 10 having through holes such that the doped layer 6 is in direct contact with the light-absorbing silicon layer 1. Similarly, FIG. 4D shows a solar cell structure with a wide band gap material layer 10 having holes through which a Si buffer layer 4 is in direct contact with the silicon wafer 1.

Alternatively to full-area the metallization can also consist of several elements (fingers, see FIG. 2).

Figures 6A, 6B, 6C, 6D:
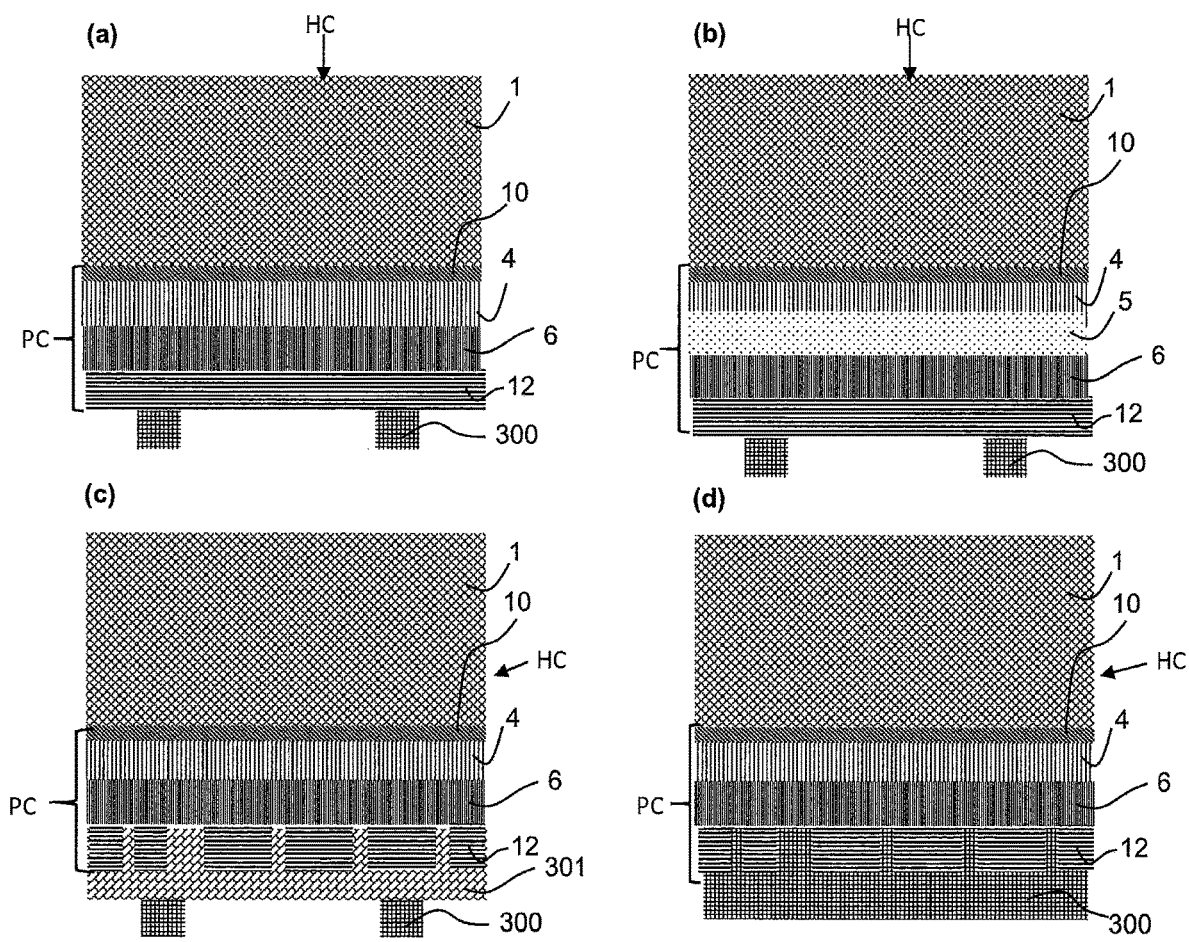
FIG. 6A to 6D represent various alternatives of a passivating and conductive stack for a solar cell structure according to a fourth embodiment of the invention.

FIG. 6A to 6D show alternative structures of a solar cell as shown in FIG. 4A to 4D. FIG. 6A represents a passivating contact structure on wafer 1 consisting of wide band material layer 10, Si buffer layer 4, and Si-based doped layer 6 and capping layer 12 and metallization 300. In FIG. 6B a second Si buffer layer 5 is provided.

In FIG. 6C, the capping layer 12 comprises openings (holes, trenches, cracks) through which the layer on top (here a transparent conductive oxide layer 301) is in direct contact with the doped Si-based layer 6. In FIG. 6D, the metallization 300 is filled in the openings of the capping layer 12.

Alternatively to full-area the metallization can also consist of several elements (fingers, see FIGS. 2 and 5).

Figure 7A:
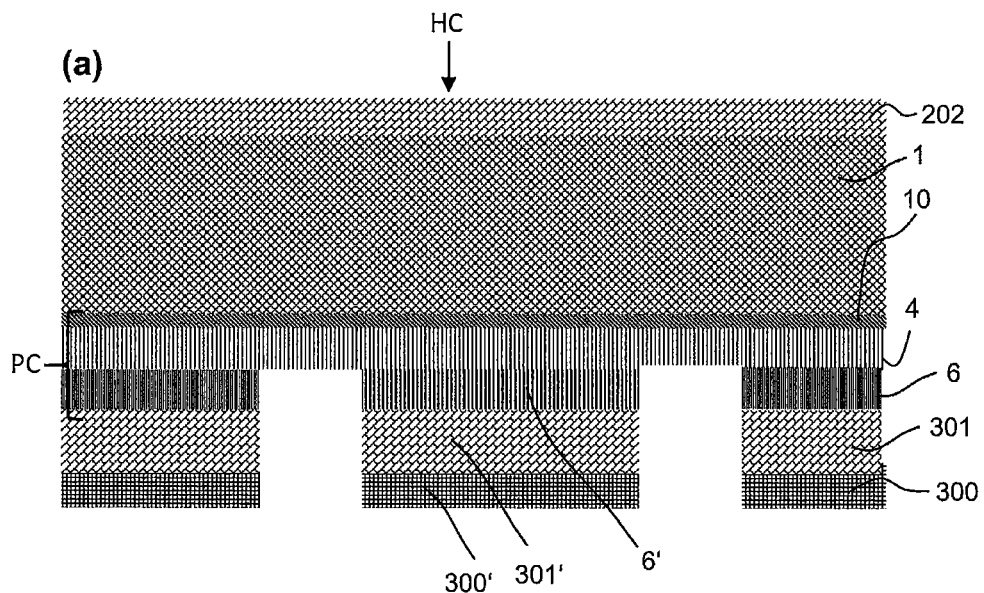
FIG. 7A to 7D represent other embodiments of a solar cell structure according to the invention, where the solar cell is a rear side contacted solar cell.
Figure 7B:
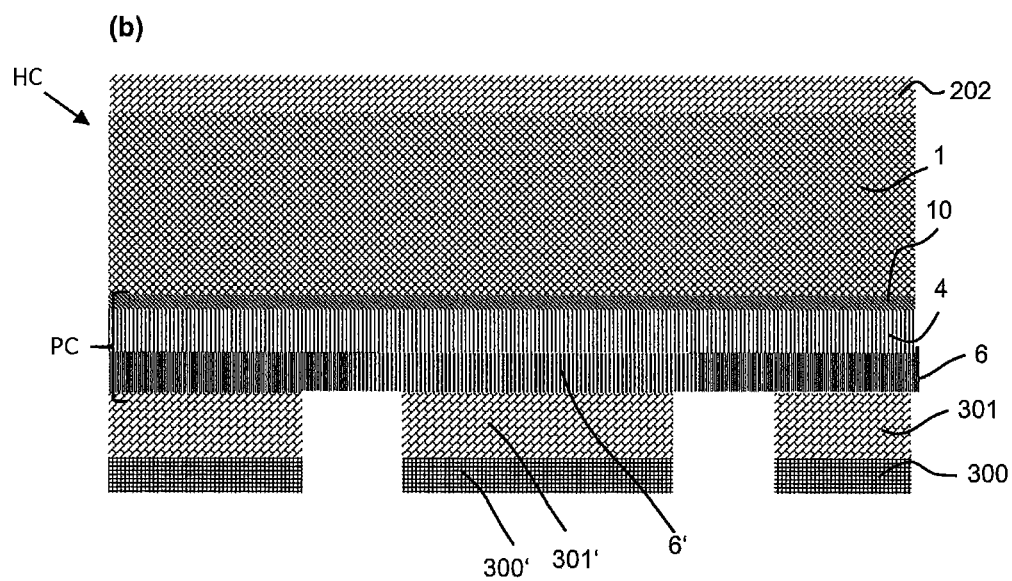
Figure 7C:
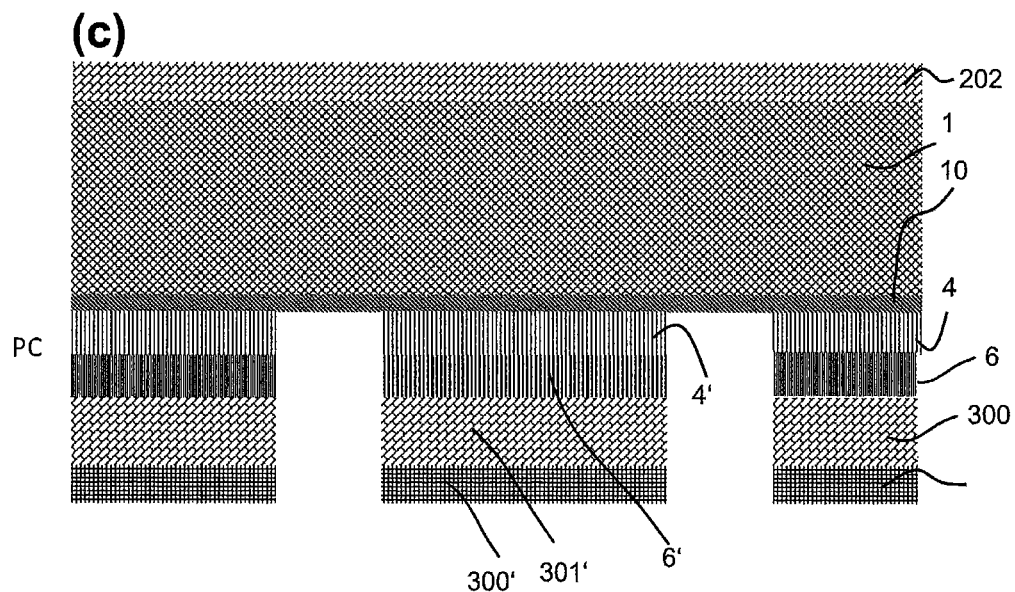
Figure 7D:
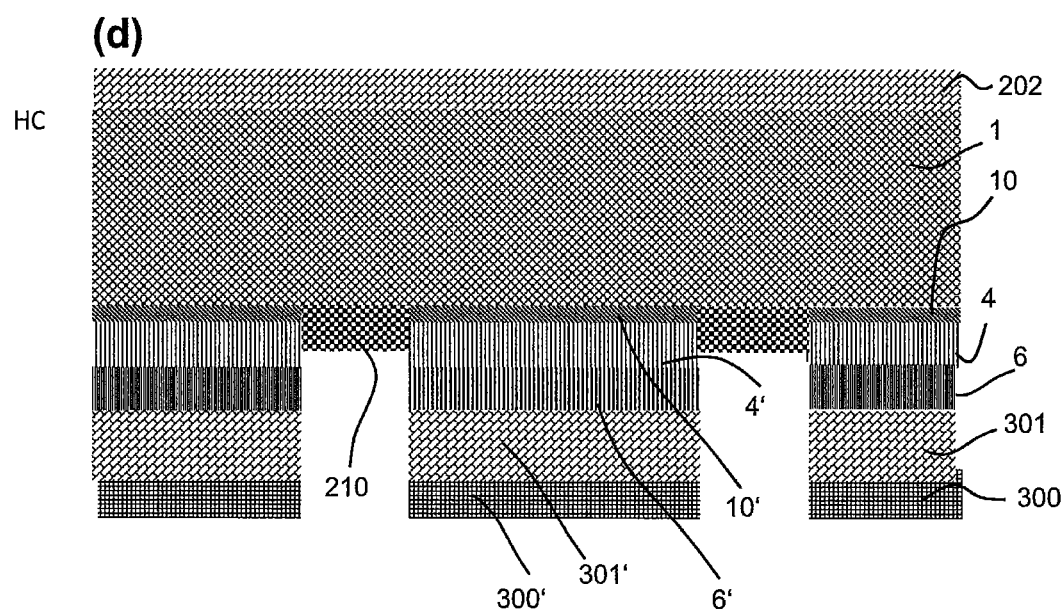

Finally, FIGS. 7A and 7B represent rear-side contacted solar cell structure employing a contact stacks according the present invention for dual polarities.

In FIG. 7A a light-absorbing silicon 202 passivation and anti-reflection layer is applied to a top surface of a silicon wafer 1 while a wide band gap layer 10, and buffer layer 4 are provided on a bottom, rear side of said wafer 1. Additionally, first electrode stack comprising a doped Si-based layer 6 of one polarity, first TCO layer 301, first metal electrode 300, and second electrode stack comprising doped Si based layer 6' of the other polarity, second TCO layer 301', second metal electrode 300' are provided to a rear side of the buffer layer 4.

The layer sequences 6, 301, 300 and 6', 301', 300' form a finger grid over the rear surface, for example an interdigitated grid.

In FIG. 7B rear-side contacted solar cell as sketched to FIG. 7a but with the doped Si-based layers 6 not being structured to accommodate the second polarity pillar.

Whatever embodiment of the solar cell of the invention the manufacturing thereof relies on same principles as described herein after, i.e. the provision of thermal treatment to passivate the contact structure through the wide band gap material layer 10.

Several beneficial effects can be exploited for any of the wide band gap layer 10, the silicon-based buffer layer 4, the silicon-based doped layer 6, and the capping layer 12 contained in the passivating and conductive stack PC of the inventive solar cell structure, These layers 4, 6, 10, 12 can each be a graded layer, i.e. a layer whose physical properties change along the growth direction. For example, this can be the crystallinity or the crystal size, the composition, the doping, the optical properties, or the electrical properties of some components of the layer as a whole. The gradient property can also be created, or be further enhanced, during one of the thermal treatments undergone during manufacturing process of the inventive solar cell.

More specifically, if one or several of the layers 4, 6, 10, 12 is amorphous in the as-deposited state, layers 4, 6, 10, 12 can partially crystallize during the thermal treatment, starting from one side of layers 4, 6, 10, 12, leaving the other side of layers 4, 6, 10, 12 still mainly amorphous. The side were crystallization starts can be the side of layers 4, 6, 10, 12 oriented towards the wafer. This effect can be exploited to reduce junction resistance between the layer and the light absorbing silicon wafer (improving fill factor). The other case, the layer crystallizing only on the other side and the side oriented towards the wafer remaining more amorphous, can be used to obtain a more favourable band bending thanks to band offsets between the wafer and layers 4, 6, 10, 12, but at the same time a crystalline and thus highly conductive nature of layers 4, 6, 10, 12 on its other side, reducing contact resistance there. In a preferred embodiment the structure and composition of the heterojunction layer stack are graded over the layer such that the refractive index is graded, the refractive index attaining higher values towards the side oriented towards the silicon absorber wafers and lower values towards the other side. The layers 4, 6, 10, 12 may contain fluorine or a fluorine compound. During a thermal treatment the fluorine or fluorine compound can diffuse to the interface of the silicon wafer where it can accumulate and passivate electronic defect states. This is especially advantageous as this passivates the interface between the silicon absorber and the passivating and conductive layer stack.

For example, if any of the layers 4, 6, 10, 12 is grown as a silicon-containing layer grown by PECVD, $SiF_4$ can be used as precursor gas as fluorine and silicon source. To give another example, for the growth of boron-doped films $BF_3$ can be used as precursor gas to introduce boron and fluorine. Especially advantageous is the use of a SiOx buffer layer because F accumulates at the Si—$SiO_2$ interface, reducing the interface defect density. FIG. 27 reveals that thermal annealing at 850° C. results in an accumulation of fluorine at the c-Si wafer and chemical SiOx interface which is beneficial to enhance surface passivation. At temperature of 925° C. surface passivation of fluorinated passivating and conductive stack drops again due to out-diffusion of F. FIG. 28A represents cell parameters obtained using fluorinated dopant source ($BF_3$) demonstrating that F can be used to obtain high surface passivation after thermal annealing and without the need of an additional post-hydrogenation step, thus simplifying process steps.

The layers 4, 6, 10, 12 can also be adhesion-promoting layers, also called "sticky layer".

The layers 4, 6, 10, 12 can be amorphous or crystalline. While in prior art the conductive layer is amorphous in its as-deposited state and the thermal treatment used to promote crystallization, it can also be prepared fully crystalline without any additional thermal treatment. "Fully crystalline" refers to a layer which does not crystallize further during the at least one thermal treatments, i.e. does not exhibit larger grain size.

In another advantageous variant the layers 4, 6, 10, 12 can be amorphous before thermal treatment, and no crystallization occurs during the said thermal treatment. Or only a fraction of it crystallizes, for instance only the upper part or only the lower part of the layer, leaving the respective other part amorphous, or only the intermediate part of the layers 4, 6, 10, 12 crystallizes, leaving the upper and lower part amorphous.

Production Method of an Inventive Heterojunction Solar Cell HC:

The heterojunction solar cell HC of the invention is typically prepared by cleaning a silicon wafer 1 in several chemical solutions. Typically, these are solutions in water of one of the following components $H_2SO_3$, $HNO_3$, HF, HCl, $H_2O_2$, $O_3$, $NH_4OH$. After most cleaning steps and after the last cleaning step, the wafer is dipped in HF.

Then, a very thin wide band gap material layer 10 of controlled thickness, for example a SiOx layer, is grown or deposited, for example by exposure to hot $HNO_3$, UV light, $H_2O_2$, $H_2SO_3$ or $O_3$, or by atomic layer deposition (ALD). Optionally a silicon-based buffer layer 4 is grown or deposited on the SiOx layer 10.

Subsequently, a doped Si-based layer 6 is grown or deposited on the buffer layer 4, for example by chemical vapour deposition (CVD), plasma-enhanced chemical vapour deposition (PECVD) or low-pressure chemical vapour deposition (LPCVD) or sputtering. Optionally a capping layer 12 may be grown or deposited then.

Afterwards, the structure is subjected to a thermal treatment treatment at temperatures above 600° C. When combined with a front side homo-junction, the thermal treatment needed for forming the passivating contact can be accommodated during the thermal annealing for the formation of the other contact polarity (e.g. $POCl_3$, $BBr_3$, $BCl_3$) or during the firing to form the Ag-metal grid.

Said capping layer 12 may remain or be removed further to the thermal treatment, in which case a secondary capping layer may be grown, followed by an optional second thermal treatment. Any capping layer 12 is prepared on top of the doped Si-based layer 6 (e.g. SiCx layer) in order to control passivating species out-diffusion or to serve as in-situ passivating species donor layer during one of the thermal treatment(s) (e.g. during firing or a later thermal process).

Any capping layer may preferably be able to release passivating species during the following thermal treatments. passivating species are transmitted by the doped silicon based layer 6 to the wide band gap layer 10 and the silicon wafer 1. Eventually the first capping layer is made such that the passivating species passes through the entire wafer 1, reaching also the wafer side that is opposed to the passivating contact wide band gap layer stack from which the passivating species is released.

The doped silicon-based layer 6 is arranged advantageously to exhibit minimized mechanical stress to avoid blistering during rapid thermal annealing processes (firing). This is achieved by two means:

a. alloying Si with C, N or O or a combination thereof, binding part of the hydrogen to those elements instead of to the Si atoms. The bond energy of H is higher in SiCx than in a-Si, and yet higher in SiOx, and yet higher in SiNx. This is due to the binding energy of the C—H, O—H and N—H bonds increasing in this order. As a consequence, the hydrogen-related bonds feature a broad range of binding energies, and hydrogen evolves over a broad temperature range instead of in a small temperature range. This way, the evolution of free hydrogen per amount of time in the layer is minimized, which facilitates hydrogen diffusion before hydrogen accumulates in blisters.

b. a hydrogen-transmissive layer structure. The network structure of the layer is capable to store or conduct hydrogen through internal nano-voids in order to avoid blistering during rapid thermal annealing processes (firing) and allow hydrogen reintroduction afterwards. Stress that builds up during the thermal treatment can thus be released in-situ by internal hydrogen storage and diffusion of hydrogen to other components In addition, after the thermal treatment(s) the doped silicon-based layer 6 exhibits very low hydrogen content (<5%).

The doping can be graded through the layer and the content of C, N or O of the Si-alloy layer can be graded through the doped silicon-based layer 6. The doped Si-based layer 6 and also the Si-based buffer layer 4 can be doped for example with Al, B, Ga, P, N, As, Sb, O The doped silicon-based layer 6 can advantageously be amorphous or crystalline, or partially amorphous and partially crystalline.

For the case too much hydrogen leaves the layer 6, it can be reintroduced after firing from an external source thanks to the H transmissivity of the doped silicon-based layer.

The passivating and conductive stack PC of the heterojunction solar cell structure of the invention can optionally include at least one silicon-based buffer layer 4 between the thin wide band gap material layer 10 and the doped Si-based layer 6.

The manufacture of the solar cell of the invention relies essentially on the provision of at least one thermal treatment involving temperatures above 600° C. In one embodiment firing are applied to form the passivating and conductive stack PC. Such firing step might be followed by hydrogenation step involving a thermal treatment at lower temperature or an additional firing.

In another embodiment the heat resistant passivating and conductive stack is formed by thermal annealing resulting in the formation of a diffused doped region in the light absorbing silicon with a sheet resistance between 5 and $10^5$ Ω/square. In general, thermal processing at elevated temperatures causes the diffusion of dopant atoms. A central aspect of this invention is, however, that the thermal budget and/or the passivating and conductive stack PC, comprising a wide band gap layer 10 and silicon-based doped layer 6 at least, and preferably a buffer layer 4, are designed such that dopant diffusion to the light absorbing silicon layer 1 is avoided, possibly completely omitted, creating an extremely abrupt, shallow, buried junction with the intensity of the signal of the doping specie, expressed in [counts/s] decaying of more than one order of magnitude within a few nm in the buffer layer 4 or the wide band gap material layer 10 or in the light absorbing silicon wafer 1. This avoids possible degradation of the thin wide band gap material layer 10 due to dopant (for example Boron) penetration and increase of Auger recombination or Moreover, the different layers can crystallize partially during annealing and the different chemical phases can be split further or intermix. More in detail, in a layer consisting of SiCx, annealing can lead to re-structuring of the layer or incorporation of C to the atomic network, i.e. increasing the number of Si—C bonds. Annealing can also lead to partial separation of SiCx to Si and SiC. Annealing can also re-configure hydrogen bonding in the layer, for instance annealing can cause rupture of Si—H bonds but formation of C—H bonds, i.e. influence preferential bonding of hydrogen. Annealing can also change the properties of the buffer layer, for instance the thin silicon oxide layer.

Annealing can also be a local process, for instance laser or microwave annealing, i.e. exposing a local portion of the layer stack to laser or microwave radiation. Part of the invention is to use local annealing to form the heterogeneous layer, or to promote locally the diffusion of dopants from the layer stack to the wafer.

In variants of the solar cell of the invention the latter comprises a capping layer, which is prepared on top of the doped Si-based layer 6 (e.g. SiCx layer) in order to control hydrogen or other passivating species out-diffusion or to serve as in-situ hydrogen or other passivating species donor layer during one of the thermal treatment(s) (during firing or thermal anneal or a later thermal process), as shown in FIG. 51. In preferred embodiments of the inventive solar cell of the invention at least one layer of the heterojunction stack contains hydrogen or other passivating species, and acts as hydrogen or other passivating species donor layer to passivate the interface between the wafer 1 and the wide band gap material layer 10 or the interface between the wide band gap material layer 10 and the buffer layer 4 or the layer stack, or the wide band gap material layer or the buffer layer.

For the sake of completeness of the present description, table I summarizes various preferred material for the essential layers of the heterojunction stack of the solar cell of the invention and their preferred thickness ranges.

TABLE I

| Denomination | Thickness (nm) | Material |
|---|---|---|
| Wide band gap material layer (10) | 0.5-20 (1-2) | SiOx, SiCx, SiNx, SiOxNy, SiOxCy, SiCxNy, SiOxCyNz AlOx, HfOx, AlHfOx, AlNx, TiNx, ZrOx, Y2Ox, AlSiOx, HfSiOx, AlHfSiOx, |
| Buffer layer (4) | 1-100 (2-10) | Si; SiCx, SiNx, SiOx, SiCxNy, SiCxOy, SiNxOy, SiCxNyOz or a combination thereof |
| Doped layer (6) | 1-300 (2-30) | Si, SiC, SiOx, SiCx, SiNx, SiOxNy, SiOxCy, SiCxNy, SiOxCyNz which can all be doped B, Al, Ga, In, N, P, As, Sb, and can contain hydrogen or fluorine (e.g. N-doped SiCx:H) |
| Capping layer (12) | 2-10000 (50-500) | Si, SiCx, SiNx, SiOx, SiOxNy, SiOxCy, SiCxNy, SiOxCyNz, which can all be doped B, Al, Ga, In, N, P, As, Sb, and can contain hydrogen or or fluorine (e.g. N-doped SiCx:H); SnOx,, also doped with F or Sb, GaOx, ITO, ICO, IWO, IZO, ZTO, ITZO, IGO, IGZO, ITGO, ZnO, TiOx, TiNx, AlNx, AlOx, AlZnOx, which can all contain hydrogen, Al, B, Ga, or O; |

TABLE I-continued

| Denomination | Thickness (nm) | Material |
|---|---|---|
| | | metals such as Ti, V, Cr, Mn, Fe, Co, Cu, Zn, Y, Zr, Nb, Mo, Tc, Ru, Rh, Pd, Ag, Cd, In, Sn,, Lu, Hf, Ta, W,, Re, Os, Ir, Pt, Au, Hg, Tl, Pb, Bi, Po and rare earth metals, all of which may contain hydrogen; Metallic hydrides |

EXAMPLES

Example 1: Boron-Doped Silicon Carbide as Passivating Rear Contacts Silicon Heterojunction Contact and Corresponding Solar Cell Example 1 provides optimization of a rear hole contact for p-type solar cells which relies on full-area processes and provides full-area passivation and conductivity. The passivating hole contact is based on a chemically grown thin silicon oxide SiOx and a passivation stack of intrinsic amorphous silicon together with in situ boron doped silicon carbide on top, annealed at 775-900° C. The thickness of the a-Si(i) buffer layer was optimized as shown in FIG. 41. FIG. 40 shows the TEM analysis of the stack after thermal annealing. The Fourier transform analysis in figure, clearly shows that the top SiCx(p) has less crystallinity compared to the SiCx(p). This is related to the fact that adding C to the a-Si network retards its crystallization temperature.

For the optimized passivation stack, after thermal annealing, forming gas annealing increases the effective lifetime from 160 μs to 250 μs, while hydrogenation from a silicon nitride overlayer results in an increase over 1.7 ms. A systematic contact optimization is obtained by tuning the doping concentration, annealing temperature, annealing dwell time and monitoring the implied open circuit voltage (iVoc) and contact resistivity (ρc) in parallel. It is observed that for highly doped layers the optimum annealing temperature for high quality surface passivation is 800° C. while for lowly doped layers the optimum annealing condition shifts to 850° C. Excellent surface passivation and efficient current transport is evidenced by an iVoc value of 718 mV and a ρc of 17 mΩcm$^2$ on p-wafers.

Proof of concept p-type hybrid solar cells with a standard heterojunction front contact prove the excellent efficiency potential of the passivating rear contact by reaching a Voc of up to 709 mV and a FF of up to 80.9%. The best hybrid cell achieves a conversion efficiency of 21.86%, enabling Voc of 708 mV, FF of 79.9% and Jsc of 38.7 mA/cm$^2$ after annealing at 825° C.

Experimental Framework

Passivating hole contacts were first investigated using symmetrical structures based on 250 μm thick chemically polished 4-inch p-type float zone <100> c Si wafers with a resistivity of 2 Ωcm.

After standard wet chemical cleaning, an ~1 nm SiOx wide band gap layer was formed by wet chemical oxidation using HNO3 solution at 80° C., referred to as "chemical SiOx" hereinafter. Subsequently, a layer stack consisting of a 10 nm thick intrinsic silicon [Si(i)] interlayer and a 30 nm thick in situ boron doped silicon rich silicon carbide [SiCx(p)] layer was deposited on both sides by plasma enhanced chemical vapour deposition (PECVD), both layers being amorphous in their as deposited state, i.e. before any thermal treatment.

Following the PECVD step, the samples were annealed in inert gas atmosphere at temperatures between 775° C. and 900° C. with different annealing dwell times using heating and cooling ramps of 10 and 2° C./min, respectively.

This was followed by a hydrogenation process to passivate electronic defects at the Si wafer/chemical SiOx interface, either by annealing at 500° C. for 30 minutes in forming gas (4% H2 in N2) (FGA) or by applying a silicon nitride (SiNx) overlayer as a hydrogen source. For the latter, samples were annealed on a hot plate at 450° C. for 30 minutes to release hydrogen from the SiNx, which is then followed by etch back process in HF to remove this overlayer. For the SiNx deposition, a VHF PECVD tool at the excitation frequency of 81 MHz was used and the substrate temperature was set to 250° C. during the deposition.

The effective minority-carrier lifetime was investigated by photo conductance decay (PCD) technique as a function of the excess minority carrier density giving access to the implied open circuit voltage (iVoc) values. The contact resistivity ($\rho c$) was measured using the transfer length method (TLM) after sputtering ITO/Ag contact pads through a shadow mask on p-type wafers. The samples were dipped in 5% diluted HF for 1 minute right before the sputtering process to remove the surface oxide. The spatial homogeneity of the passivation was analyzed using photoluminescence imaging (PLI). For thickness determination, the deposited layers were characterized using spectroscopic ellipsometry (SE, HORIBA Jobin Yvon, UVISEL). To measure the hydrogen effusion as a function of temperature thermal desorption spectroscopy (TDS) was performed in an EMD☐WA1000S/W system at the National Institute of Advanced Industrial Science and Technology (AIST), Japan. For this measurement, only one-side deposited samples were prepared. Before the measurements samples were kept one hour at room temperature under low pressure to degas as much as possible the water absorbed on the c-Si wafer surface and the chamber walls to reach a base pressure of $5.25*10^{-10}$ Torr.

For the measurement, samples were heated with a halogen lamp from room temperature to 690° C.—substrate temperature—, at a rate of 20° C./min. Effusing species were identified by quadrupole mass spectrometry. The electrochemical capacitance-voltage (ECV) profiling technique was employed to measure the diffusion profiles of boron within the Si-wafer from the SiCx(p) layers using 0.1 molar ammonium fluoride (NH4F) solution as etchant.

For proof of concept hybrid solar cells, the passivating hole contact on the planar rear side of a single-side textured wafer was first prepared. Then a silicon heterojunction electron selective front contact made of intrinsic amorphous silicon (a-Si:H) and phosphorus-doped a-Si:H(n) layers was built. Finally, 70 nm and 200 nm indium tin oxide (ITO) were sputtered onto the front and rear sides of the cells, respectively. The active cell area was defined by depositing the ITO layers through a 2.2 cm×2.2 cm shadow mask. A silver reflector/contact was sputtered onto the rear side and silver paste was screen printed to realize the front metallization grid, followed by curing for 30 minutes at 210° C. in a belt furnace. Detailed information about the fabrication process for the hybrid cells can be found in G. Nogay, J. Stuckelberger, P. Wyss, Q. Jeangros, C. Allebé, X. Niquille, F. Debrot, M. Despeisse, F.-J. Haug, P. Löper, Silicon-Rich Silicon Carbide Hole-Selective Rear Contacts for Crystalline-Silicon-Based Solar Cells, ACS Applied Materials & Interfaces, 8 (2016) 35660-35667. Current voltage (I-V) characteristics of the cells were measured at 25° C. with a source meter (Keithley, 2601A), using an AAA solar simulator (Wacom) calibrated to 100 mW·cm$^{-2}$ with a c-Si reference cell. Additionally, the suns-Voc method was used to obtain the series-resistance-free pseudo I-V curves.

Results

Figure 8A:
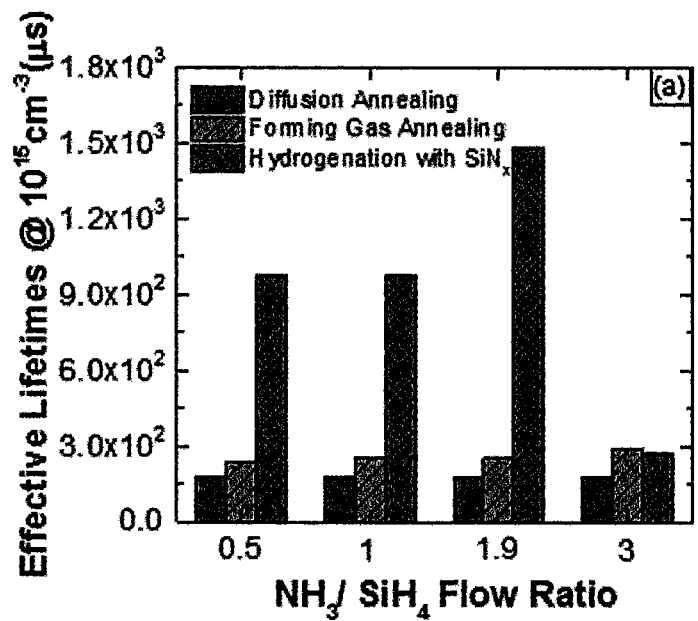
FIGS. 8A and 8B represent the dependence of the value of effective minority charge carrier lifetime values of symmetric sister samples on (a) the $NH_3/SiH_4$ flow ratio during the SiNx deposition, and (b) the SiNx thickness. "Sister samples" means that samples were co-processed in all other process steps.
Figure 8B:
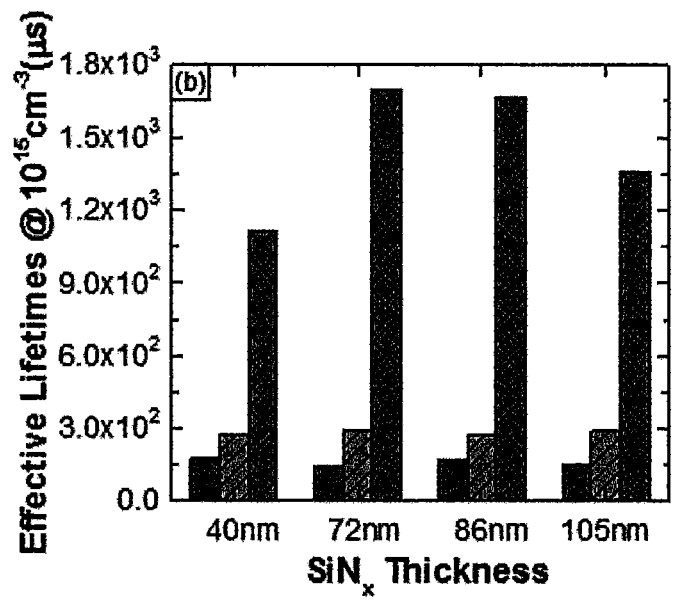

FIGS. 8A and 8B show the evolution of the effective lifetime values of symmetric sister samples after annealing for boron diffusion, after forming gas annealing (FGA) and after application of the different SiNx layer as a hydrogen donor layer, considering (A) the effect of the NH3/SiH4 flow ratio during the SiNx deposition, and (B) the effect of the SiNx thickness when layers are deposited with the NH3/SiH4 flow ratio of 1.9.

Most passivating contacts based on thin silicon oxide layers prepared by chemical passivation require reintroduction of hydrogen after the high-temperature annealing step in order to decrease the interface trap density and attain good surface passivation. FGA is one of the most recognized methods for re hydrogenation of such interfaces and impressively high iVoc values have been reported for n-type poly-Si contacts on n-type Si wafers using this method.

According to the inventive structure annealing in forming gas indeed improves the passivation properties, as evidenced by an increase of the effective lifetime from 160 µs to 250 µs, as seen in FIG. 8A. To explore alternative hydrogenation methods the same samples were used and deposited a SiNx layer as hydrogen source. For the latter, the deposition parameters of the SiNx layer were tuned to improve the hydrogenation quality i.e. the passivation quality. FIGS. 8A and 8B show the evolution of the effective lifetime values along the contact formation process for an inventive contact stack prepared with a TMB flow of 1.5 sccm, at the injection level of $10^{15}$ cm$^{-3}$. After diffusion annealing we observe rather low effective lifetimes around 160 µs. After annealing in forming gas at 500° C. for 30 minutes an improvement in the lifetime is observed, which is, however, is a moderate increase in contrast with other reported values for forming gas annealed boron diffusions passivated by chemical SiO$_2$. Following the FGA, a 60 nm thick PECVD SiNx layer, produced with a NH$_3$/SiH$_4$ flow ratio of 0.5, was applied to both side of the symmetric test structures to investigate the effect of the atomic hydrogenation.

FIG. 8A shows an impressive improvement of the effective lifetime after hot plate annealing at 450° C. for 30 minutes. Note that these values were measured after etching the SiNx with 5% diluted HF solution, ensuring that the observed effect does not originate from field effect passivation caused by fixed charges in SiNx. Consequently, SiNx acts as a hydrogen reservoir and hot plate annealing induces the hydrogen diffusion through the p contact stack to the chemical SiOx/c Si wafer interface.

To investigate the effect of the NH$_3$/SiH$_4$ flow ratio during the SiNx deposition on hydrogenation at 450° C., the ratio was changed from 0.5 (refractive index of 2.5 at 635 nm) to 3 (refractive index of 1.8 at 635 nm). It was found that the optimal ratio of 1.9 resulted in the highest effective minority carrier lifetime for the investigated annealing conditions. It should be noted that the optimum annealing temperature for the layer produced with the ratio of 3 might be higher than 450° C. since with increased NH$_3$ flow, density of the strong N—H bond increases. The SiNx hydrogen donor layer was further optimized by investigating the effect of the thickness, as displayed in FIG. 8B. With increased layer thickness, first the lifetime value increases which can be attributed to the augmented hydrogen reservoir. This trend is then followed by a saturation at around 72 nm and a drop when the layer thickness reaches to the 105 nm, however; the reason for this drop is not yet clear.

FIGS. 9A and 9B show the TDS spectra of the desorbed molecular hydrogen, $H_2$ (M/z=2) and water, $H_2O$ (m/z=18) from (i) an as deposited a SiCx(p) layer, (ii) a SiNx layer deposited directly on bare wafer, and (iii) a SiNx layer deposited on a SiCx(p) layer that was previously annealed at 800° C.

FIG. 9A, 9B shows that the sample with as-deposited a SiCx(p) contact layer effuses hydrogen already at temperatures above 150° C. The effusing species are dominantly $H_2$ molecules, showing a high effusion spectra in the temperature range of 200-500° C. (FIG. 9A). The $H_2$ (M/z=2) effusion is, in fact, almost two orders of magnitude higher than that of $H_2O$ (FIG. 9B). The origin of $H_2$ effusion from the as-deposited a SiCx(p) is linked to the high hydrogen content in the layer [Beyer, Journal of Non-Crystalline Solids, Hydrogen evolution from a-Si:C:H and a-Si:Ge:H alloys, 1983]. The $H_2$ desorption spectra of the SiNx on bare wafer and deposited on SiCx(p) shown in FIG. 9B reveals that irrespective of the substrate, the observed $H_2$ effusion shows the same characteristic up to the 300° C. which is close the SiNx deposition temperature. The high $H_2$ effusion, but slower desorption rate (compared to the SiCx(p)), confirm the role of SiNx as a hydrogen reservoir. Above 300° C., the layer on the SiCx(p) effuses more $H_2$ than the layer on the bare wafer. This can be explained by the additional $H_2$ in the SiCx due to its hydrogenation during SiNx growth, or with a lower diffusivity of $H_2$ in the SiCx layer than the silicon wafer, the SiCx layer thus blocking effusion of $H_2$ from the SiNx layer towards the silicon wafer.

The observed flat plateau after 475° C. for SiNx deposited on annealed SiCx(p) contact and after 500° C. for SiNx on bare wafer can be interpreted as an artefact originated by the $H_2$ saturation in the chamber which cannot be pumped out after certain threshold.

The effect of boron doping concentration in the SiCx(p) layer on the surface passivation and contact resistivity was investigated as a function of annealing conditions. FIGS. 10A to 10C show the iVoc values for samples produced by varying the trimethylboron (TMB) flow during the doped layer deposition from 0.2 sccm to 1.9 sccm and annealed at temperatures range of 775° C. to 900° C. with various annealing dwell times. Annealing dwell times are reported as the total time the temperature is within +/−5° C. of the dwell temperature.

For TMB flows of 1 sccm and 1.5 sccm, optimum passivation is attained annealing at 800° C. with a dwell time of 5 minutes, leading to an iVoc of 718 mV. Whereas, for lower TMB flows such as 0.2 sccm and 0.5 sccm, optimum passivation is reached annealing at 850° C. for 0 minute dwell time, which leads to an iVoc value around 716 mV. This shift in optimum condition can be interpreted by the fact that for decreased doping concentration, a higher annealing temperature is required to obtain boron diffusion through the chemical SiOx to strengthen the field effect passivation. For the samples produced with high TMB flows such as 1.5 sccm and 1.9 sccm, the dwell time does not make a significant difference in iVoc when the samples are annealed at 800° C. and 825° C., whereas for the annealing temperature of 850° C., 15 minutes annealing dwell time degrades the passivating quality drastically. For this dwell time, the longest used in this series, the best performance is obtained for samples produced with lower TMB flows- except the sample with 0.2 sccm and annealed at 900° C. (see FIG. 10C). It is also perceived that with 900° C. annealing, regardless of the annealing dwell time, the iVoc drops drastically, possibly due to the strong boron in diffusion which deteriorates the chemical SiOx/c Si wafer interface and/or due to temperature induced local disruption of the chemical SiOx. We note that the annealing conditions marked with an asterisk were used for processing the hybrid cells presented below.

In FIGS. 10A to 10F the same annealing temperatures are indicated with the same symbols while the symbol fillings are changing with dwell times.

Specific contact resistivities (ρc) were characterized using the TLM method. FIGS. 10D to 10F show the ρc values for the samples produced by varying the trimethylboron (TMB) flow during the doped layer deposition from 0.2 sccm to 1.9 sccm (sccm standing for Standard Cubic Centimeters per Minute, as defined at Tn=0° C. or 273K, Pn=1.01 bar) and annealed at temperatures of 800° C., 850° C. and 900° C. with annealing dwell times of 0, 5 and 15 minutes. For all investigated dwell times, ρc decreases with increased annealing temperatures as expected. This trend can be explained with stronger doping of the wafer next to chemical SiOx by in diffusion of boron from the SiCx(p) layer. For sufficiently high annealing temperature, it was also reported that the chemical SiOx might become disrupted, leading to local thickness variation or pinhole formation which may also provoke the low ρc. Even though there is some discrepancy for some of the samples prepared with TMB flow of 1.5 sccm and annealed at 800° C. for 0 minute (FIG. 10D) and sample prepared with TMB flow of 2 sccm and annealed at 800° C. for 15 minutes (FIG. 10F), in general those figures show that with increasing boron doping density, the ρc decreases irrespective of the annealing dwell times. This mentioned discrepancy observed in some of the samples, might originate from processing inaccuracies during the sputtering through the shadow mask, sometimes resulting in inhomogeneous contact pad widths, and therefore improperly defined pad distances. The lowest ρc reached was 6.84 mΩcm$^2$ with the sample produced with TMB flow of 1 sccm and annealed at 9000° C. for 5 minutes (see FIG. 10E), however, as seen in FIG. 10B, this sample shows very poor passivation quality with iVoc of 650 mV. The highest ρc measured is 97.26 mΩcm$^2$ with the sample produced with TMB flow of 0.2 sccm and annealed at 800° C. for 0 minute (see FIG. 10D). According to FIG. 10A, this sample has a iVoc of 712 mV. The optimal condition for both good passivation quality and low ρc is defined with the sample produced with 1.5 sccm TMB flow and annealed at 800° C. for 5 minutes leading to iVoc of 718 mV and ρc of 17 mΩcm$^2$. Hence, the TLM measurements show that the presented layer stack provides not only an excellent surface passivation but also a promising contact resistivity for a sufficient transport of the majority carriers for full-area contacts.

The presence of dopant diffusion through the thin chemical SiOx within the wafer is essential to selectively allow the transport of one type of carriers. The amount of dopants together with diffusion depth defines the carrier selectivity of the contact. FIG. 11 shows the doping profiles within the p-type c-Si wafer measured by ECV for different annealing dwell temperatures and dwell times for the contact that was produced with the TMB flow of 1.5 sccm on top of chemical SiOx and 10 nm thick intrinsic Si interlayer. Within a surface region of about 30 nm from the chemical SiOx/c-Si wafer interface (not shown here), they reveal a similar behavior for all investigated temperatures with some fluctuations.

These fluctuations in the highly doped contact layers might indicate the fact that the annealing step transformed the layers into poly crystalline material where high impurity concentrations at grain-boundaries and lower concentrations within the grains are probed simultaneously. Beyond that region, they show the expected behavior of deeper in diffusion at higher temperatures, reaching a depth of 70 nm after the annealing at 900° C. As it is expected the sample annealed at 800° C. for 0 minute dwell time shows the lower carrier concentration within the wafer and very shallow diffusion profile.

Additionally, the effect of annealing dwell time for 850° C. annealing is revealed in FIG. 11, and it is observed that with increased dwell time from 0 to 15 minutes, diffusion depth increases approximately 10 nm. Overall, the diffusion profiles in the bulk presented here are comparable with the literature values obtained by applying in-situ boron doped deposited layer as a dopant source, however, distinctively they show a drop with an extremely steep tail to the bulk concentration of ca. $10^{16}$ cm$^{-3}$.

Finally, the hole-selective contact was integrated in full devices to investigate their performance at device level. To this end, the hole-selective junction was prepared on the rear side and finished the solar cells with a SHJ front side as described above. The usage of a heterojunction front side is motivated by assuming that the Voc of the cells will be limited by the rear side.

The obtained output characteristics for the hybrid cells exhibiting the boron doped layer produced with the TMB flow of either 1.5 sccm or 1.9 sccm and annealed at dwell temperatures of 8000° C., 825° C., and 850° C. are presented in FIGS. 12A-12D. The applied annealing conditions are also indicated in FIGS. 12A-12D to compare the iVoc values of the symmetric test samples. FIGS. 12A-12D reveals that the samples produced with 1.5 sccm of TMB flow shows approximately 10 mV higher iVoc values compared with the ones produced with 1.9 sccm for all the annealing conditions performed to realize the hybrid cells.

Figures 12A, 12B, 12C, 12D:
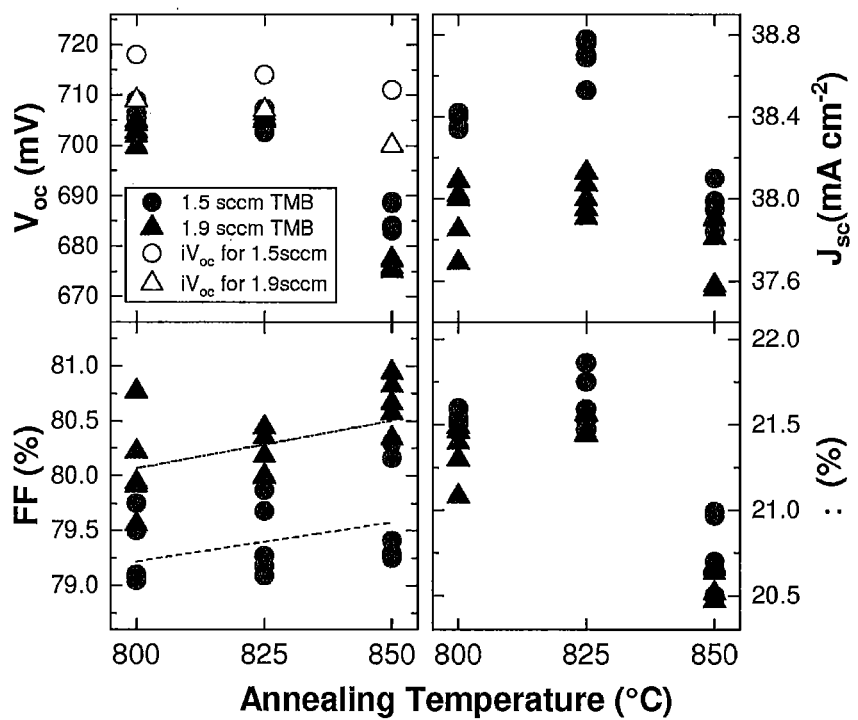

FIG. 12A shows that Voc values are mostly following the presented iVoc trend. For the annealing temperature of 800° C. and 850° C., the Voc of the cells with 1.5 sccm are higher, while for the 825° C. both doping conditions exhibit almost the same Voc values. Overall, for the cells annealed at 800° C. and 825° C., the difference in between iVoc and Voc is changing from 2 mV to 9 mV, for the cells annealed at 850° C. this difference is higher than 20 mV. This variation in between iVoc and Voc arises mostly from the ITO sputtering damage which was also reported by other groups. The best Voc reached is 709 mV with the cell produced by using 1.5 sccm TMB flow and annealing at 800° C.

According to FIG. 12B, the obtained Jsc values are higher for the samples produced with 1.5 sccm TMB flow. Since all the hybrid cells presented here have similar front sides, we presume that the difference is associated with the free carrier absorption which is greater for the samples with higher doping concentration. For the sample with 1.5 sccm TMB flow and annealed at 825° C., the Jsc is much higher compared to the rest. This might be due to the fact that even though we used the same sputtering parameters for the front ITO depositions, we observe some fluctuations in the layer properties from one deposition to another. It can be possible that front ITO is more transparent for this specific cell.

FIG. 12C represents the FF values as a function of annealing temperature for two different TMB flows. It is observed that the cells produced with TMB flow of 1.9 sccm show higher FF for all annealing conditions compared with the 1.5 sccm. For both TMB flows, the FF increases with annealing temperature, in agreement with the trends observed from TLM characterization. The best FF reached is 80.9% with the cell produced by using 1.9 sccm of TMB flow and annealing at 850° C. Overall, the cells produced with 1.5 sccm and 1.9 sccm show similar efficiency, especially for the annealing temperatures of 800° C. and 850° C., since the lower Voc and Jsc values for the hybrid cells produced with 1.9 sccm TMB flow is compensated with the FF gain. The best hybrid cell from this series reaches a conversion efficiency of 21.86%, enabling Voc of 707 mV, FF of 79.9% and Jsc of 38.7 mA/cm2.

In conclusion, the present invention provides a detailed optimization of the thermally stable hole selective rear contact for p-type c-Si solar cells prepared by PECVD with in situ doping followed by thermal annealing. The hydrogenation process is of utmost importance to obtain an optimized chemical SiOx/c-Si wafer interface and a high-quality high low junction after the thermal process necessary for dopant diffusion and recrystallization of the PECVD layer. In addition hydrogenation process using SiNx overlayer is more efficient than the FGA and it leads a drastic improvement in lifetime for the presented SiCx(p) based passivating contact. With symmetric lifetime test sample, an iVoc values of 718 mV and ρc of 17 mΩcm$^2$ is reached after annealing at 800° C. The proof of concept hybrid solar cell, which features the passivating rear contact developed here and a heterojunction front side on a p-type wafer, yields an efficiency of 21.86%, enabling Voc of 708 mV, FF of 79.9% and Jsc of 38.7 mA/cm$^2$.

Replacing TMB with BF3 as gas precursor during the deposition of the silicon-based doped layer was found to be a valid solution to avoid hydrogen reintroduction, thus simplifying process fabrication. As shown in FIGS. 25 and 25 B flow ratio between CH4/(CH4+BF3/SiH4) of 0.1 was found as optimal value between i-VOC and contact resistivity (ρc). FIGS. 26 and 28A demonstrate that high surface passivation can be obtained after thermal annealing without the need of an additional post-hydrogenation step. FIG. 27 reveals that thermal annealing at 850° C. of BF3 doped SiC(p) results in an accumulation of fluorine at the c-Si wafer and chemical SiOx interface which is beneficial to enhance surface passivation. At temperature of 925° C. surface passivation of fluorinated passivating and conductive stack drops again due to out-diffusion of F.

Example 2: Implementation of a Wide-Band Gap Silicon Carbide Layer for Front Side Carrier Selective Contacts In this second example phosphorous doped silicon carbide (SiCx(n)) layers grown on a chemically oxidized textured silicon wafer are considered as window layers for front side high temperature carrier selective contacts. Implied open circuit voltage higher than 735 mV were achieved for carbon-rich SiCx(n) on textured surfaces.

Figures 13A, 13B, 13C, 13D:
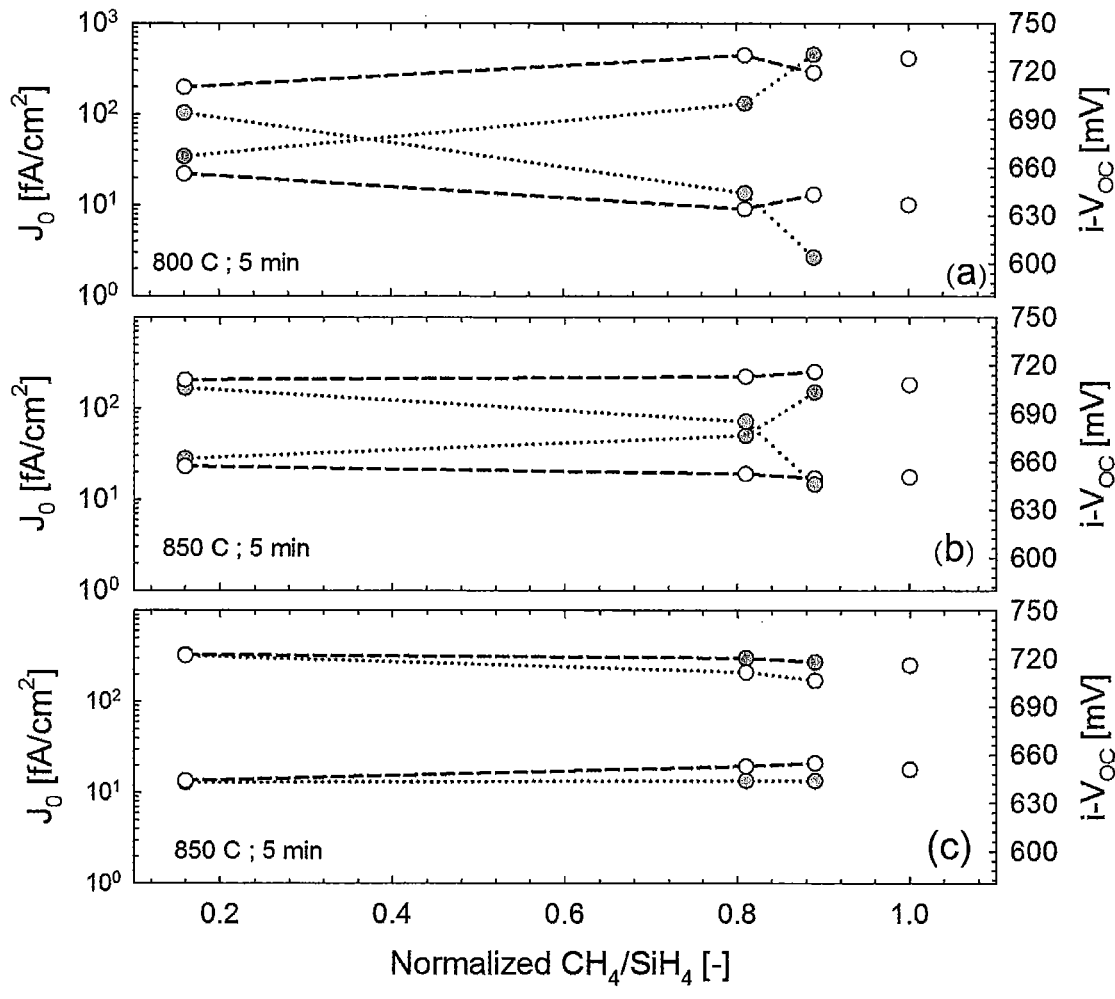

FIGS. 13A, 13B and 13C show photoconductance (PCD) measurements performed with Sinton instrument of recombination current density (J0) (left axis), estimated with Kane Swanson method at injection levels of $10^{16}$ cm-3 and i-VOC (right axis) as function of the normalized to the maximum gas flow ratio defined as the r=CH4/(CH4+PH3+SiH2+H2) of SiCx(n) layers deposited via PECVD on p-type float zone (FZ) double side textured, silicon wafers (sketched in FIG. 13D) with thickness around 250 μm and resistivity between 1-5 Ω cm. The SiCx(n) layer thickness ~13 nm was measured with ellipsometer on polished samples (deposition time scaled on 1.7). A SiOx ~1.4 nm thick was chemically grown prior the PECVD deposition. J0 and iVoc (as function of r after annealing at (A) 800° C. for 5 min and (B) 850° C. for 5 min and (C) 900° C. for 5 min. The empty symbols indicate J0 and iVoc after hydrogenation performed by using a SiNx as H-donor layer.

The figures clearly shows that, J0 increases after thermal annealing with increasing of r. While after hydrogenation J0 decreases with increasing of r, for both thermal annealing at 800 and 850° C. The post-hydrogenation has only a small impact on J0 for the sample with low r but drastically reduces it for the samples with high r. This suggests that recombination rate of the sample with low r is mainly determined by recombination in the in-diffused region. For samples with high r, which are expected to be more defective, hydrogenation enhanced chemical passivation at Si/SiOx interface and passivates layer defects. The SiCx(n) with r=0.8 annealed at 800° C. for 5 min lead to the lowest J0, of ~5 fA/cm2 and highest iVoc of 735 mV. To further enhance layer crystallization higher annealing temperature would preferable. For the samples annealed at 900° C. for 5 min regardless r and hydrogenation high J0 were observed. This would indicate that the recombination rate is dominated by high doping concentration from in-diffusion of P dopant atoms during annealing and/or recombination at Si/SiOx interface due to oxide breakage (TEM and ECV measurements will be performed).

Figures 14A, 14B:
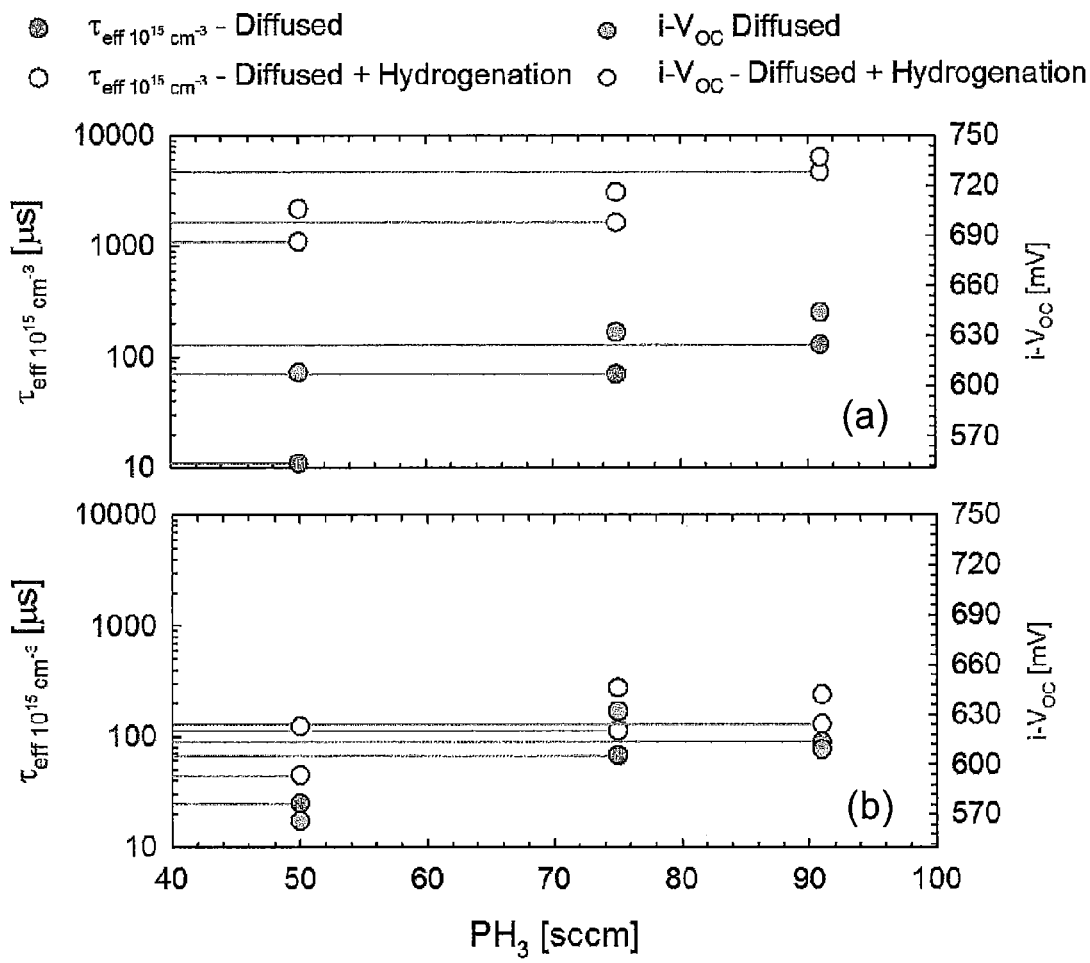
Figure 14C:
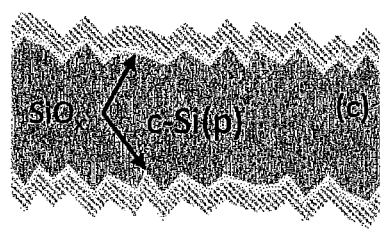
Figure 15A:
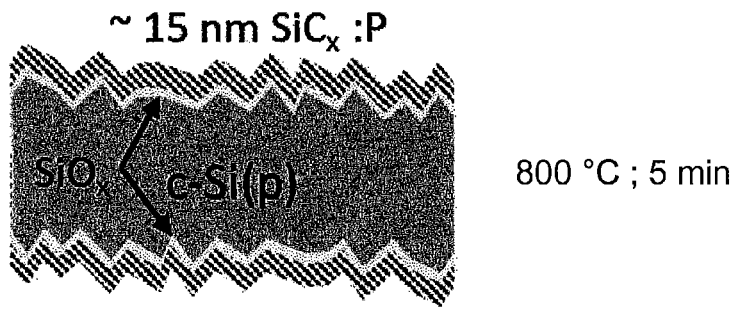
Figure 15B:
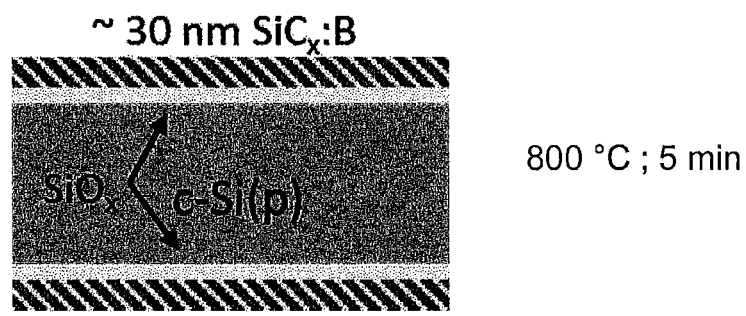
Figure 15C:
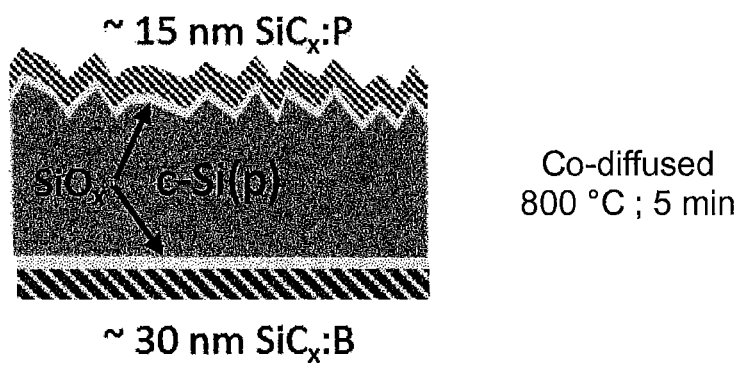
Figure 16:
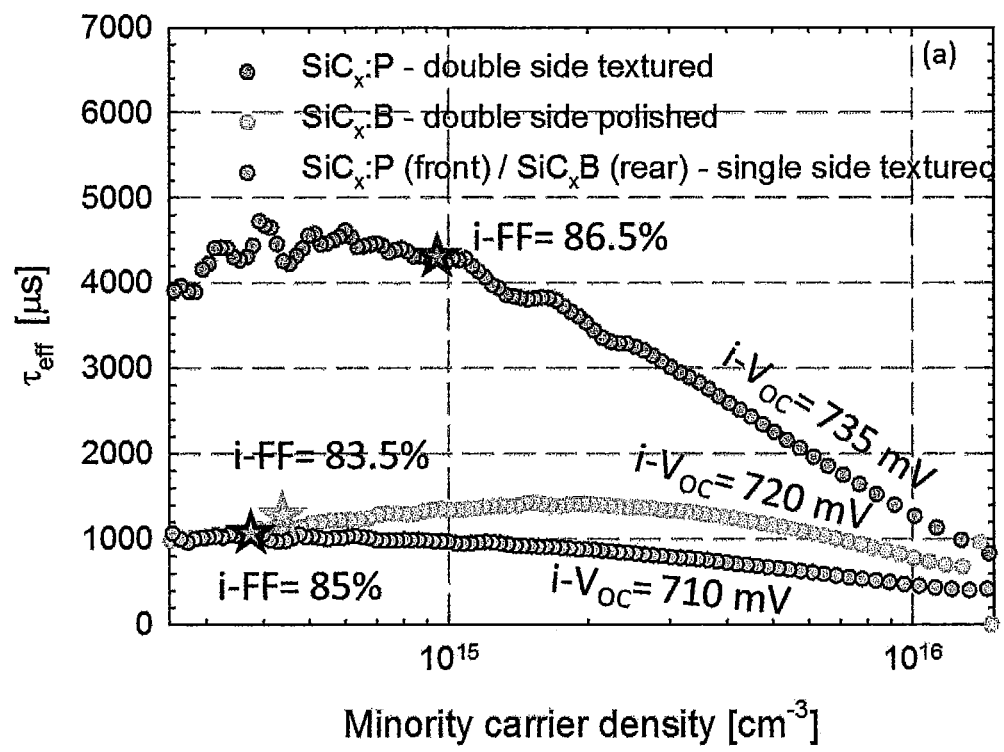

The impact of the PH3 flow on the passivation quality for a given C-content at annealing temperatures of 800° C. and 900° C. for 5 min are shown in FIGS. 14A-14B, respectively for similar SiCx(n) layers deposited via PECVD on p-type float zone (FZ) double side textured silicon wafers (sketched in FIG. 13C).

All SiCx(n) layers were deposited on top of chemically grown SiOx ~1.4 nm thick. The SiCx(n) layer thickness ~15 nm was measured with ellipsometer on polished samples (the deposition time was scaled on 1.7). τeff (and i-VOC as function of PH3 flow after annealing at (a) 800° C. for 5 min and (b) 900° C. for 5 min. Empty symbols represents τeff and i-VOC the after hydrogenation performed via forming gas annealing (FGA) and using SiNx as H-donor layer. For both annealing conditions τeff increases towards higher PH3 flow. This indicates that passivation due to the in-diffused region improves with increasing of the doping level. Once again, the impact of the hydrogenation on τeff is very strong for the samples annealed at 800° C. but less visible for the ones annealed at 900° C. even at low PH3 flow. Together with the observation that the passivation level of the samples annealed at 900° C. is much lower than of the 800° C. annealed samples, this hints at interface recombination due to SiOx breakage at 900° C. rather than recombination in the in-diffused region (TEM measurements are under investigation).

The optical and the electrical properties of the SiCx(n) contact were evaluated using it as front emitter in a p-type c-Si solar cells. As back surface field (BSF), a Si-rich boron doped SiCx(p) doped with BF3 optimized on chemically polished surfaces was used. The main solar cell fabrication steps involved: wafer cleaning, chemical oxidation, PECVD of SiCx(n) (front) and SiCx(n) (rear), co-annealing at 800° C. for 5 min, hydrogenation and metallization. The τeff as function of the minority carrier density is reported in FIG. 16 for the SiCx(n) deposited on double side textured wafer (FIG. 15A), SiCx(p) deposited on double side chemically polished wafer (FIG. 15B) and SiCx(n) on the textured front and SiCx(p) on the polished rear side of the solar cell precursor (see FIG. 15C). The figure also reports the iVoc and implied fill factor (i-FF) for all three cases. The solar cell precursor showed an iVoc of 710 mV and i-FF of 85%.

Figure 17:
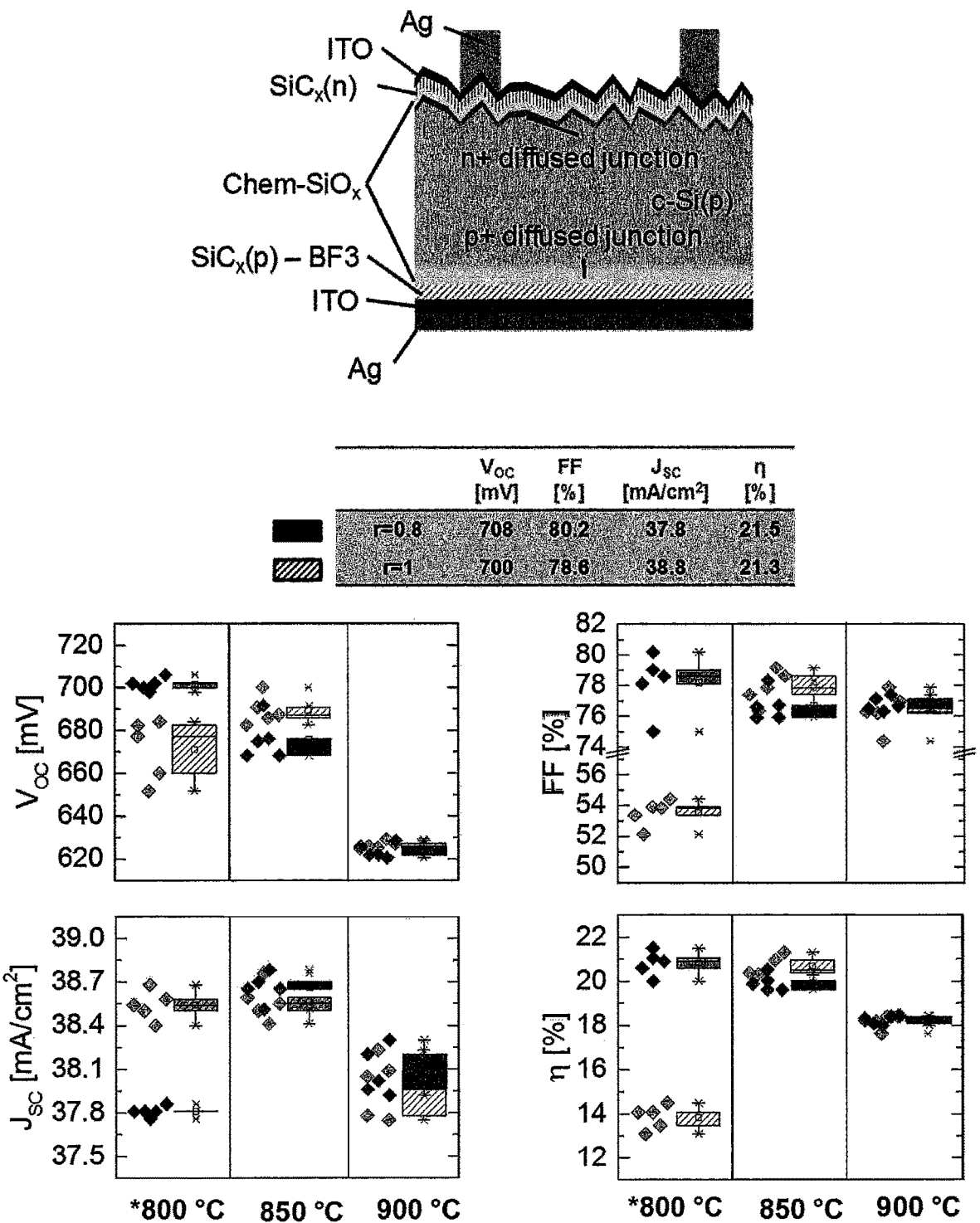

A solar cell demonstrator was prepared as presented in FIG. 17. The demonstrator structure is a typical p-type c-Si solar cell employing the C-rich SiCx(n) (r=0.8 and r=1) on the front side and Si-rich SiCx(p) BF3 doped on the rear side deposited. Both layers were deposited via PECVD on top of chemically grown SiOx layer. Co-annealing at 800° C., 850° C. and 900° C. for 5 min followed by hydrogenation via forming gas annealing and with SiNx as hydrogen donor layer was used. Finally, indium tin oxide (ITO) was sputtered on both sides of the wafer followed Ag sputtering on the rear and screen-printing of Al on the front side.

Solar cells employing co-annealing process based on slow annealing treatments for processing of both passivating contacts on the front and the rear side were prepared, based on SiCx(n) and SiCx(p) respectively. SiCx layers were deposited via plasma enhanced chemical vapour deposition (PECVD) on chemically oxidized Si surfaces of a silicon wafer, and are in-situ doped with PH3 (SiCx(n) with r=1) and BF3 (SiCx(p)) during the deposition process.

Subsequent to deposition, annealing in a tube furnace is performed in order to diffuse dopants and passivating species into the wafer and crystallize the deposited layers. After thermal annealing an hydrogenation step comprising the deposition of a SiNx as H-donor layer followed by an annealing at 450° C. for 30 min is performed.

Fill factor (FF) up to 84% and open circuit voltage (VOC) up 728 mV were demonstrated on planar surfaces as reported in FIGS. 28A and 28B. This indicated that high r value (C-rich layers) do not limit charge carrier transport. For front side textured solar cells the similar process as for the planar cell fabrication was used. For the SiC(n) we tested two different r values of 0.8 and 1. For the r=0.8, VOC up to 710 mV and FF up to 80% with a final efficiency of 21.5% were reached, see FIG. 17. It was however observed that parasitic absorption in the SiCx(n) front contact limits the potential of such solar cells, as C-addition to the Silicon network increases the temperature at which layer crystallization occurs.

Figure 18A:
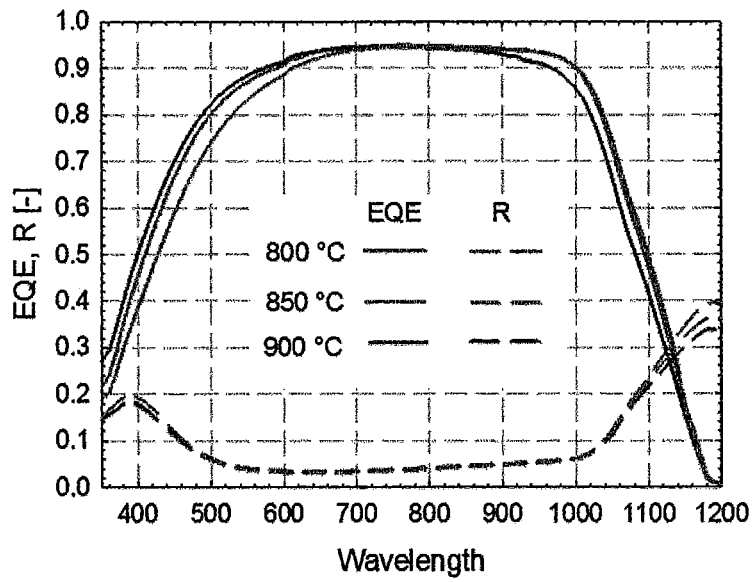
Figure 18B:
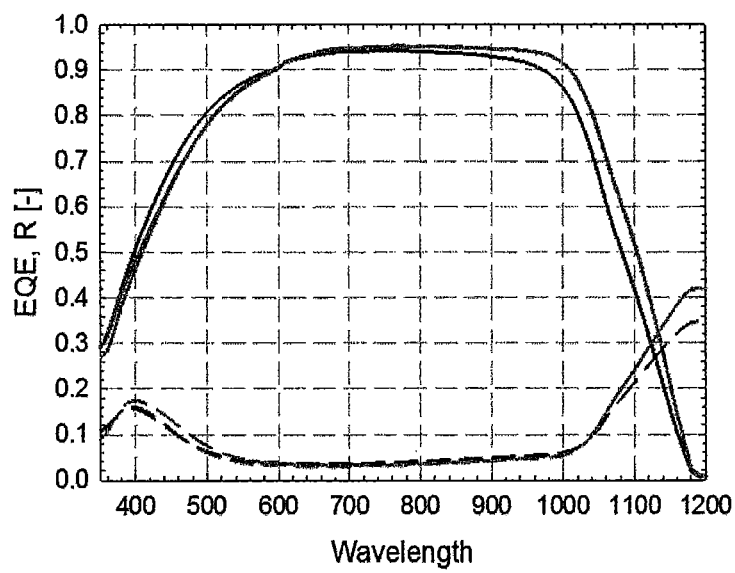

As shown in FIGS. 18A and 18B, layers with lower flow ratio (presumably low C-content) exhibited an external quantum efficiency which increase in the wavelength range between 300 and 500 nm with increasing of the thermal annealing temperature. Such enhanced spectral response is associated to an increase for the layer crystallinity with increasing of the temperature of the thermal treatment. On the contrary the solar cells with high normalized flow ratio exhibited a EQE response in the wavelength range between 300 and 500 nm independent by the annealing temperature. This means that increasing of the C-content of the doped SiCx(n) layer leads to an increase of the temperature at which crystallization occurs leaving the layer amorphous and thus with an indirect bandgap. Such limitation can be tackled by implementation of a micro-crystalline growth regime of the SiCx(n) layer on the front contact. The micro-crystalline silicon carbide (µc-SiCx(n)) layer shows reduced optical absorption, demonstrating the potential of the approach. This means that layers are crystalline already in the as-deposited state and that the thermal treatment further increases layer crystallinity.

To further decrease parasitic absorption (especially at short wavelengths) of the front side contact we are investigating PECVD deposited phosphorous doped micro-crystalline µc-SiCx:P layers. Having a crystalline layer structure already in the as-deposited state would strongly foster full crystallization even in case of moderate annealing temperature of 700° C. to 900° C.

Figure 19A:
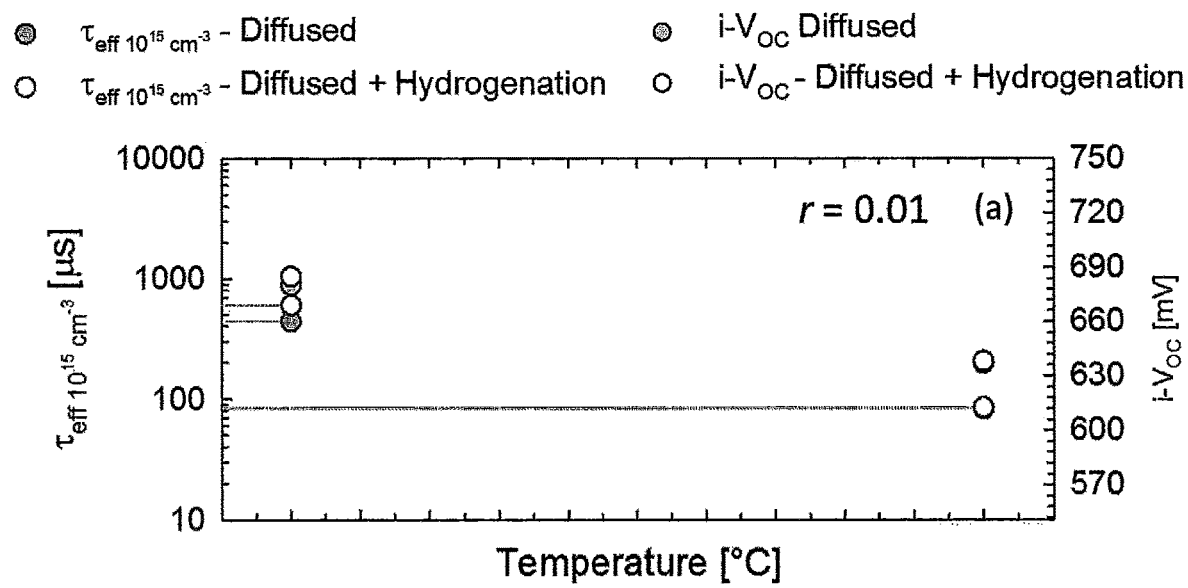
Figure 19B:
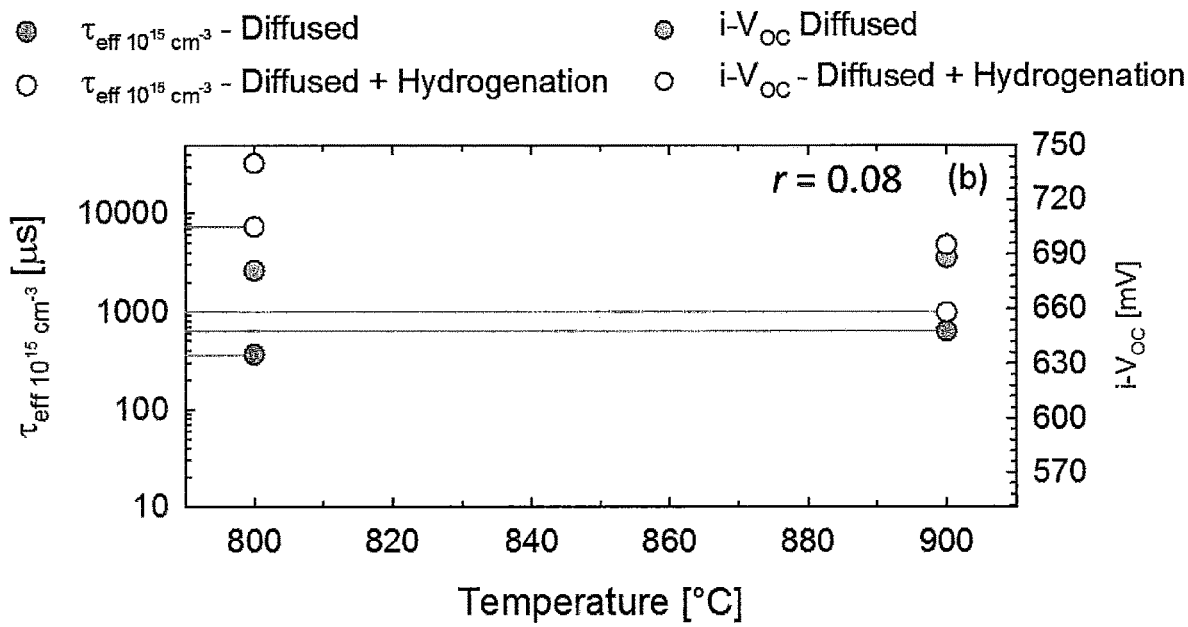
Figures 22A, 22B:
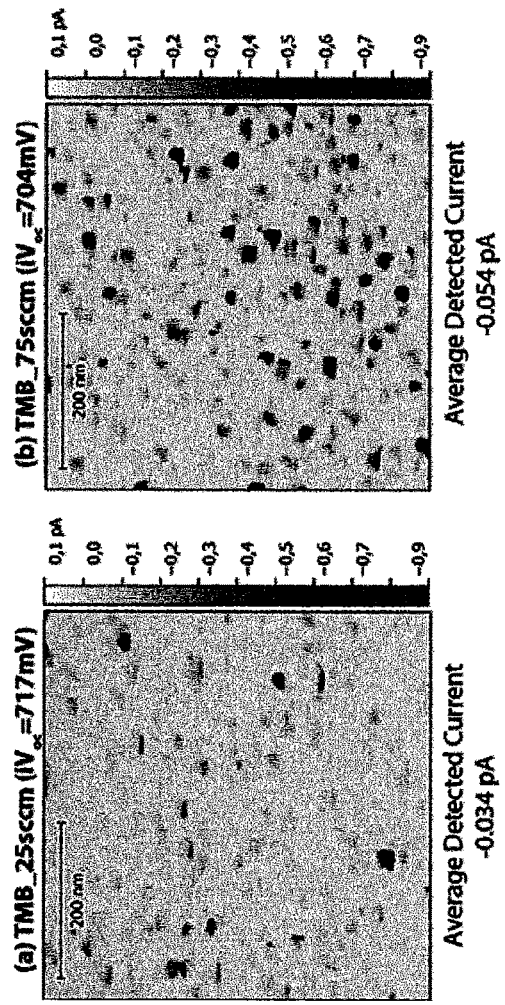

FIGS. 19A and 19B show PCD measurements of τeff at injection level of $10^{15}$ cm-3 (left axis) and i-VOC (right axis) as function of the annealing temperature (dwell time constant 5 min) of PECVD µc-SiCx:P (r=0.1) and PECVD SiCx:P layer (r=0.8) deposited on chemically oxidized c-Si p-type FZ wafers (thickness 280 μm and resistivity between 1-5 Ω·cm) double side polished, detailed in FIGS. 19C and 19D, respectively. The layer thicknesses measured with ellipsometer are also reported. Filled (empty) circles indicate τeff and i-VOC after annealing (hydrogenation). Hydrogenation was performed via forming gas annealing (FGA) and using a SiNx as H-donor layer. For the SiCx:P (r=0.8) the highest best passivation was achieved with annealing at 800° C. for 5 min, τeff>8 ms and i-VOC of 740 mV. For the μc-SiCx:P (r=0.01) the highest performance were achieved after annealing at 800° C. for 5 min, τeff>0.5 ms and i-VOC of 690 mV. The impact of the hydrogenation is very strong for SiCx:P at both 800 and 900° C. For the μc-SiCx:P the hydrogen reintroduction leads to a small improvement of the surface passivation. This is most luckily related to the stronger P-diffusion for μc-SiCx:P compared with SiCx:P limiting the overall recombination rate.

The refractive index spectra (n,k) of the μc-SiCx:P layer after annealing are reported in FIG. 20A-20B, which respectively represent the real and imaginary parts of the complex refractive index measured for SiCx:P with r=0.8 annealed at 800° C. (squares), 900° C. (circles) and μc-SiCx:P annealed at 800° C. (triangles) and 900° C. (diamonds). These graphs clearly shows that higher annealing temperature improve layer crystallinity decreasing parasitic absorption.

Example 3: Locally Conductive Transport Channel Formation in High Temperature Stable Hole Selective Silicon Rich Silicon Carbide Passivating Contact Stack This third example provides a detailed optimization and characterization of a high temperature stable hole selective passivating contact based on a chemically grown thin silicon oxide (chem-SiOx) and boron doped silicon carbide (SiCx(p)) layer prepared by plasma enhanced chemical vapour deposition (PECVD). The developed contact can be implemented at the rear side of industrial p type solar cells to update existing manufacturing lines. Excellent surface passivation and efficient current extraction were observed.

A proof of concept p-type hybrid solar cell featuring this passivating rear contact and a standard heterojunction front side was prepared (see FIG. 21). Conductive atomic force microscopy (c-AFM) was used in order to elucidate whether majority carrier conduction proceeds locally (possibly through pinholes or local disruption of the chem-SiOx formed in the SiOx during thermal treatment), or over the full area by tunneling. The c-AFM analysis reveals the formation of non-uniformly distributed locally conductive areas caused by the thermal process.

Additionally, it is observed that increasing the annealing temperature increases the density of these conductive areas, which correlates to deteriorated passivation quality. These findings present strong experimental evidence that the SiOx buffer layer becomes disrupted, leading to local SiOx thickness variation. C-AFM current maps taken at −100 mV with for the sample prepared with TMB flow of (a) 0.2 (b) 0.5, (c) 1 and (d) 1.5 sccm, annealed at 850° C. show that with increasing doping concentration (FIG. 22A-22D), density of the conductive spots are increasing, which correlates with deteriorated passivation quality and decreased specific contact resistivities. FIG. 23A to 23D further show c-AFM current maps at −100 mV for the samples deposited with the TMB flow of 1.5 sccm (a) as deposited, (b) annealed at 800° C., (c) 850° C. and (d) 925° C. The average current is again increasing with increased annealing temperature together with density of the conductive spots represented with black color. For annealing temperature above 925° C. a severe drop of the surface passivation quality occurs (iVoc of 645 mV against iVoc of 715 mV for the samples annealed at 800° C.). TEM and EDX map on FIG. 24 A of the samples annealed at 850° C. shows no disruption of the interfacial SiOx. On the contrary, as FIG. 24 B indicates the sample annealed at 925° C. exhibits the formation of local breakage of the tunneling SiOx (wide bandgap layer) also known as pinhole.

Example 4: c-Si Solar Cells with Fired Silicon-Based Heterojunction as Hole Collector—FLASH Heterojunction A fired silicon heterojunction contact (FlaSH) according to the invention and SHJ with open circuit voltage above 700 mV and conversion efficiency above 21% was prepared and tested.

This novel contact scheme allows overcoming practical integration issues (tailored annealing process or thermal instability) and physical limitation (Auger recombination and parasitic absorption of the in-diffused region) of existing carrier selective contacts, representing a cost-effective solution for next generation of high efficiency industrial c-Si solar cells.

The FlaSH contact is fabricated according to sequence described in FIG. 29. An ultra-thin (~1.4 nm) $SiO_x$ layer is wet chemically grown and capped with a-SiCx(p):H deposited via plasma enhanced chemical vapor deposition (PECVD).

The FlaSH Concept:

The FlaSH contact described in the following is fabricated according to the process sequence depicted in FIG. 29. After wafer cleaning, a thin SiOx is chemically grown followed by plasma enhanced chemical vapor deposition (PECVD) of an a-SiCx(p):H or alternatively a a-Si(i):H/a-SiC(p):H layer stack. The overall structure undergoes a firing and hydrogenation process. We used PECVD as deposition technique for the FlaSH contact as it offers a multitude of possibilities to prepare layer stacks with unique properties, more difficult to achieve with other techniques (e.g. with low-pressure chemical vapor deposition (LPCVD) of polysilicon followed by ion implantation or doping diffusion). Having tunable properties of the layer stack opens the way for the design of contact solutions that, for instance, can undergo pre-established thermal processes, such as firing. Additionally, this deposition technique enables single side wafer processing and in-situ doping introducing large flexibility in terms of process integration. A robust mechanical stability against fast thermal processes (e.g. 50° C./s) at elevated temperature (e.g. 800° C.) typical of firing defines the first requirement for the FlaSH contact. In fact, during the firing process, fast hydrogen effusion process and thermal stress in the a-Si:H layer can result in layer blistering and delamination. Owing to the higher bonding energy of the C—H compared to the Si—H bonds, hydrogen effusion is retarded to higher temperatures as carbon is added to the amorphous silicon network. Consequently, SiCx layers are more resilient against blistering when deposited on SiOx compared to a-Si:H, hence motivating their employment as carrier selective layers in the FlaSH stack. Additionally, SiCx films are chemically stable to wet solutions commonly used for c-Si solar cell processing. The short duration of the thermal process leads to a partial re-crystallization of the deposited a-SiCx(B):H into a nano-crystalline (nc) nc-SiCx(p), i.e.

crystalline silicon grains in the range of few nanometers to few micrometers within the amorphous silicon phase, and its doping activation.

Full-area charge carrier selectivity in "conventional" intrinsic/doped a-Si:H heterojunction contacts, is achieved via saturation of surface dangling bonds by hydrogen and the amorphous silicon network and band bending in the c-Si wafer induced by the highly doped a-Si:H layer resulting in a depletion of minority charge carriers from the Si surface. The former passivation mechanism is known as chemical passivation and is typically expressed in terms of defect density of states (Dit) at c-Si/passivating layer interface. The latter is called field effect passivation and is set by the work function difference between the highly doped a-Si:H layer and the lightly doped c-Si wafer. When exposed to temperatures above 250° C., hydrogen effusion from the a-Si:H leads to a strong degradation of the chemical passivation 16. Surface passivation can be recovered (or at least partially) by employing hydrogenation process if the annealing is below 350° C. On the contrary, for annealing above 450° C., degradation becomes irreversible. Poly-Si-based passivating contacts are thermally more stable than SHJ as they are fabricated at elevated temperatures (800-1000° C.) and for rather long time (>10 min). As result of the thermal treatment a buried junction (typical depth <200 nm) at c-Si surface with a moderate surface doping concentration (in the order of $10^{19}$ cm-3) is formed. The role of this doped region is to increase the density of the selected carrier-type in front the SiOx, enabling: (i) high tunneling probability through the SiOx, resulting from the better alignment of the valence band energy positions (e.g. hole selective contact) in the c-Si and in the heavily-doped poly-Si layer, and (ii) an efficient surface passivation by field effect, as the density of minority carriers (e.g. electrons for a hole selective contact) and consequently their Shockley-Read-Hall (SRH) recombination rate is reduced without excessively increasing Auger recombination. Because of the latter mechanism, poly-Si based passivating contacts exhibit junction properties more resilient against variation of the Dit.

As a second requirement, the FlaSH contact has to be able to deliver high surface passivation and charge carrier transport upon the application of firing. The combination of thermal treatment and layer stack configuration (ie. SiOx/nc-SiC or SiOx/nc-Si(i)/nc-SiC) are designed to prevent the formation of doping in-diffusion into the Si wafer. Therefore, full-area contact functionalities are provided by: (1) high chemical passivation of the c-Si/SiOx interface, analogously as for a-Si:H heterojunction, and (2) a strong field effect enabling to drive the c-Si surface in accumulation conditions. As consequence, a region with high density of majority carriers is induced in front the thin SiOx, which similarly to the buried junction of a diffused poly-Si based passivating contact enables to reduce SHR recombination and to foster quantum tunneling of majority carriers through the thin SiOx.

To fulfill criteria (1), we placed a thin SiOx layer in between the c-Si and the deposited SiCx(p) exploiting the functionalities of: preventing epitaxial re-growth of the deposited layer on the c-Si wafer during firing, an effect responsible for additional surface defects; physically displacing structural defects (i.e. within the deposited SiCx(p) and/or at the SiCx(p)/metal interface) from the c-Si surface; profiting of the nature of the Si-SiOx interface, which can attain very low defect densities after high temperature thermal treatment and post-hydrogenation. To satisfy criteria (2) we developed high work function nano-crystalline silicon carbide (nc-SiCx(p)) as hole selective contact. Such layer was obtained by depositing highly-doped a-SiCx(p):H and fostering its crystallization into a nc-SiCx(p), during the firing process. The resulting highly-crystalline film can, in fact, accommodate a larger number of active dopants and thus exhibit a higher work function compared to only amorphous layers.

To induce surface band bending in a similar way as provided by in-diffused region, fixed charges trapped at SiOx/Si interface can also be used.

Surface passivation of the FlaSH contact technology was investigated on symmetrical test structures as sketched in FIG. 30. Recombination parameter such as effective minority carrier lifetime (τeff), implied open circuit voltage (i-VOC) and dark saturation current density (J0) were measured with photo-conductance decay method (PCD). The curves depict τeff at an injection level of $10^{15}$ cm-3 ($\tau\text{eff}_{@}10^{15}$ cm$^{-3}$), as function of the normalized CH4 over total gas flow ratio used for depositing of the a-SiCx(p):H layers. The figure reveals an increase of τeff with decreasing of the normalized flow ratio, until reaching an optimum value $\tau\text{eff}_{@}10^{15}$ cm$^{-3}$=1100 μs beyond which it decreases again. The poor surface passivation for high flow ratio SiCx(p) layer (i.e. high C-content) might be attributed to several reasons: (i) C released from the SiCx-layer during firing reacts with oxygen from the SiOx layer, reducing the ability of the SiOx layer to passivate the surface. An increase of the defect density and a decrease of the doping efficiency in amorphous and nano-crystalline layers are expected at high C-content. The former effect is responsible for additional recombination of minority charge carriers in the defective SiCx layer, or trapping of free charge carriers by the defect states in the SiCx layers, which might further reduce effective doping in C-rich SiCx(p) and thus additional decrease of the work function. As result, recombination rate increases as surface band-bending and thus repulsion of minority carriers from the Si surface becomes less effective. For the normalized flow ratio of 0.18 we achieved excellent τeff@$10^{15}$ cm-3 above 1100 μs and i-VOC of 707 mV corresponding to J0 of ~15 fA/cm2. To suppress eventual detrimental effects resulting from the interaction between C and B atoms of the SiCx(p) layer with the chemical SiOx layer, we replaced the first 10 nm of the SiCx(p) layer by an a-Si(i):H buffer layer, as sketched in FIG. 30.

As FIG. 30 indicates, the a-Si(i) buffer layer efficiently fosters surface passivation, boosting the i-VOC voltage for all conditions. Interestingly, the impact of this layer on the passivation quality is only minor for samples with high C-content, whilst it is more significant for samples with low C-content. We speculate that the benefits of the intrinsic buffer layer become evident when a sufficient band-bending at c-Si interface is provided by the nc-SiCx(p). For the FlaSH contact based on the nc-Si(i)/nc-SiCx(p) stack with normalized flow ratio of 0.18 (for the SiCx(p)) we achieved τeff@ $10^{15}$ cm-3>1300 μs and i-VOC of 715 mV and a J0 of ~12 fA/cm2. Without carbon alloying (i.e. normalized flow ratio equal to zero) the entire layer stack blistered during the fabrication sequence, for both with and without buffer layer.

This illustrates that C incorporation within the Si network is an essential feature of the FlaSH contact as it allows obtaining layers that are mechanically stable to firing. To conclude, FlaSH contacts based on SiCx(p) with and without intrinsic buffer layer showed J0 equal or below 15 fA/cm2, compared to 35 fA/cm2 reached for world record PERC cells. The transport properties of the FlaSH contact were evaluated by means of contact resistivity (ρc) measured via transfer length method (TLM). The measured ρc strongly increased towards higher C-content for both nc-SiCx(p) and nc-Si(i)/nc-SiCx(p) stack, as reported 30. Interestingly, for low C-content, the additional nc-Si(i) buffer layer does not have a strong impact on ρc. This result can be explained by the fact that the nc-SiCx(p) induces a band-banding which effectively renders the nc-Si(i) buffer layer p-doped. Reasonably low ρc of 65 mΩ·cm2 and 73 mΩ·cm2 for the nc-SiCx(p) and nc-Si(i)/nc-SiCx(p) stacks, (with normalized flow ratio of 0.18 for the nc-SiCx(p)) deposited on the SiOx, were respectively achieved.

The passivation and transport results here reported, demonstrate that the FlaSH contact is capable to deliver high carrier selectivity while being fabricated by using firing thermal process.

As shown in FIG. 31, the buffer layer drastically decreases the carrier recombination rate of the contact. Excellent injection behavior of the contact layer is demonstrated by the high implied fill factor (i-FF).

FIG. 32A to 32F represent secondary-ion mass spectrometry (SIMS) measurements of the O, B and C doping profiles expressed in intensity [counts/seconds] as function of the depth. The SIMS depth profiles were obtained using a CAMECA SC-Ultra instrument with O2+ primary ions with 1 keV impact energy. The primary ion current was set to 2 nA. The ion beam was scanned over an area of 250 µm×250 µm and the signal was acquired from inner area 60 µm in diameter. The acceptance energy window was 19 eV. The mass resolving power was set to 1200 in order to eliminate the contribution of 10B1H+ on 11B+ signal. The secondary ions collected were: 11B+, 12C+, 16O+ and 28Si+ (not shown here). All the depth profiles were acquired with the same instrumental settings and analytical conditions such that the profiles can be compared directly. The depths of the SIMS sputtering craters were measured post-acquisition with a KLA-Tencor P17 profilometer. The sputtering time was converted to depth in nanometers assuming a linear erosion rate through the different layers.

FIGS. 32A to 32C firstly show, for the as-deposited and fired states, that the intensity of the B signal in the c-Si, i.e. after the oxygen peak defining the SiOx/c-Si interface, decays of more than one order of magnitude within 5 nm depth. The firing step mostly influences the B signal into the SiOx compared to the as-deposited state. In the as-deposited state, a B signal within the first 5 nm of the c-Si wafer is also observed. Because no doping diffusion is expected for the as-deposited state (processing temperature did not exceed 200° C.), the B signal into the c-Si for the as-deposited state is due to the limited depth resolution of the SIMS measurement. These measurements clearly highlight one of the novelty of the invention, which is the combination of passivating and conductive layer stack and the thermal treatment preventing the formation of an in-diffused doped region at light-absorbing silicon wafer surface.

Additionally, as shown in FIG. 32D to 32F an intrinsic Si-based buffer layer, lowers the intensity of the B signal in the SiOx layer which is beneficial to reduce surface defect density at SiOx/c-Si interface and in an enhanced passivation as shown in FIG. 26 and by the cell results in FIG. 37C. The intensity of the B and O peaks at c-Si/SiOx interface are reported in the tables on the right side of FIG. 32.

Further investigations were also carried out by the inventors at microstructural level to understand the phenomena occurring in the new FlaSH contact structure of the present invention.

The microstructure of the single nanocrystalline nc-SiCx(p) and bi-layer nc-Si(i)/nc-SiC(p) stacks forming the FlaSH contact, was investigated after firing by high resolution transmission electron microscopy (TEM). In all cases, the normalized flow ratio of the SiCx layers was set to 0.18. Scanning TEM images, which were acquired using a high-angle annular dark-field (HAADF) detector, are shown alongside energy-dispersive X-ray spectroscopy (EDX) maps for the two contact architectures in FIGS. 33A and 33B, wherein the arrowhead marks the position of the interface between the intrinsic and doped regions. These micrographs and chemical maps highlight clearly the 1 to 2 nm (in projection) passivating SiOx layer at the c-Si surface. In the case of the bi-layer stack, the evolution of the Si K, O K and C K edge EDX intensities along the vertical axis enable to distinguish the start of the doped region about 10 nm from the c-Si surface (arrowhead in FIG. 33B).

High-resolution TEM (HRTEM) images demonstrate a difference in crystallinity between the two contact architectures (FIGS. 33C and 33D). The crystallinity of the nc-SiCx(p) single layer stack appears homogenous, with no significant difference in the number of Si reflections observed in the Fourier transforms computed from the first part of the layer (the first 7 nm near the SiOx buffer layer, inset i) or the rest of the layer (inset ii). On the other hand, Fourier transforms computed at the position of the intrinsic layer (the first 7 nm near the SiOx buffer layer, inset iii) shows more Si reflections than the Fourier transform taken at the position of the nc-SiC(p) layer (inset iv). The presence of C hence appear to inhibit the crystallization of Si. In the case of the double layer nc-Si(i)/nc-SiC(p) stack (FIG. 33D), the presence of the underlying intrinsic layer may slightly increase the crystalline fraction in the upper boron-doped layer by promoting epitaxial growth of Si crystals across the interface during firing. Indeed, an inverse Fourier transform of the Si<111> reflection highlighted in FIG. 33D shows that large crystals spanning all the way across the two layers may form during firing, hence alleviating to some extent the negative influence of the intrinsic layer on carrier transport across the contact. Overall, only Si reflections were indexed in the Fourier transforms of both contact structures. The small amount of C is not sufficient to result in the formation of silicon carbide crystals (on the order of 2 at %, estimated using the Cliff-Lorimer method [Cliff, G. & Lorimer, G. W. The quantitative analysis of thin specimens. J. Microsc. 103, 203-207 (1975)], a value influenced by C surface contamination in the microscope chamber). It should also be mentioned that the use of shiny-etched wafers, which exhibit a small roughness, results in a sight blurring of the interfaces as these are observed in projection.

FIG. 34 shows FTIR measurements of the SiCx(p) with flow ratio of 0.18 before firing (as-deposited), after firing and after firing followed by a hydrogenation treatment. For these three samples, the FTIR measurements depicted in FIG. 34 reveal the presence of various peaks. The first one is centered at 630 cm-1 and is associated to Si—H wagging or rocking modes followed by the one centered at 780 cm-1 reveals Si—C stretching mode while at Si—O stretching modes appear at 1050 cm-1, Si-Hn (with n=1, 2, 3) stretching modes appear in the band centered at 2050 cm-1. Finally, the absorption band between 2800 and 3000 cm-1 is associated to stretching modes of C-Hn (n=1, 2, 3) groups in sp2 and sp3 orbital configurations. For the as-deposited sample, the intensity of the C-Hn signal is weaker compared to that of the Si—H and Si-Hn bonds. This indicates that most of the H incorporated in the a-SiCx(p):H, is bonded to Si rather than C. As expected after firing, H weakly bonded to Si effused out from the sample. As shown by the FTIR measurement reported FIG. 34 for the fired nc-SiCx(p) the Si-Hn modes are absent. Interestingly, the more temperature stable C-Hn stretching modes exhibit a reduced intensity, compared to the as-deposited state but are still present.

Additionally, for the fired nc-SiCx(p) a strong increase of the Si—C peak is observed compared to the as-deposited a-SiCx(p), suggesting the additional Si—C bonds are built upon the thermal treatment. The shift of Si—C vibrational mode towards higher wavenumber is a clear signature for the occurrence of the phase transition from amorphous to crystalline state of the film due to firing. The structural properties of the chemical SiOx also seems to be influenced by the firing process as the Si—O peak moves towards higher wavenumber indicating the formation of a more stoichiometric layer. The effect of the hydrogenation, shown in FIG. 34 appears as an increased intensity for the C-Hn band returning on the value assumed in the as-deposited state. Eventual Si-Hn bonds resulting from the hydrogenation process are not visible, most luckily because below the sensitivity of the measurement system.

FIG. 39 reports FTIR measurements for SiCx(B) samples prepared with different $CH_4$ flows, with and without buffer layer after firing and hydrogenation. The carbon content increases monotonously with the $CH_4$ flow in the gas mix, higher CH4 flow resulting in higher carbon concentration. The figure clearly shows that the intensity of the Si—C peak and C—$H_n$ groups increase when going to higher $CH_4$ flows. To this phenomena is also associated a reduction of the passivation quality. The presence of the buffer layer leads to a slight reduction of the intensity of the Si—C peak and C—$H_n$ groups compared to the case where no buffer is present.

For a deeper understanding of the H-evolution during the fabrication sequence of the FlaSH contact we have performed TDS measurements. As reported in literature H-effusion spectra are strongly depending on the microstructural properties of the a-Si:H layer. Typically, two effusion processes can be observed, one at high temperature (HT) (i.e. >500° C.), and one at low temperature (LT) (<400° C.) [Beyer, W. Diffusion and evolution of hydrogen in hydrogenated amorphous and microcrystalline silicon. Sol. Energy Mater. Sol. Cells 78, 235-267 (2003)]. The HT peak is attributed to diffusion of mono-hydride (atomic hydrogen) through the layer network. The LT peak is associated to H2+ desorption due to simultaneous rupture of two Si—H bonds forming di-hydride (molecular hydrogen) that effuses out through internal voids or layer rupture. Diffusion of atomic H is the dominant mechanism of hydrogen transport in materials with a dense network, thus limiting effusion rate. On the contrary, for materials with a microstructure formed of interconnected voids, H2 effusion through the network becomes dominant. Effusion spectra showing the presence of both phenomena are explained by a reconfiguration of the internal Si—Si bonds, occurring during the heating process, transforming the network of voids in a more compact one. The position and intensity of both HT and LT peaks can be further influenced by the composition of the a-Si alloy. For instance, the intensity of the LT peak is reported to increase with adding carbon to the Si network due the formation of a higher density of voids. In addition, LT and HT effusion peaks are Fermi-level dependent as its energy position influences the rapture energy of the Si—H bonds. For this reason, a-Si:H(p) show a strong shift of both effusion peaks towards lower temperature compared to intrinsic a-Si(i):H. Mass separated ions (m/z) m/z=2 associated to H2 effusion for the FlaSH contact composed by the SiCx(p) with a normalized flow ratio of 0.18 were measured in the as-deposited, fired and after hydrogenation.

As shown in FIG. 35, the a-SiCx(p):H (in the as-deposited state) shows a broad H2+ effusion spectra indicating the presence of both effusion peaks with the LT at 275° C. and HT at 550° C. which appears as a shoulder or plateau. The presence of the LT peaks is a signature of H2 desorption through interconnected voids within the a-SiCx(p):H layer. The decrease of the effusion rate towards higher temperatures is associated to the collapse of the void network in favor of a more compact one where diffusion of atomic H becomes dominant, thus limiting the effusion rate. Upon firing at 800° C., H effusion form the nc-SiC(p) is, as expected, much lower compared to the as-deposited a-SiCx(p):H (FIG. 35). An increased desorption is observed towards higher temperatures and might be associated to the rupture of the more temperature-stable C—H bonds (see FTIR measurements in FIG. 35). The m/z=2 spectra reported for the hydrogenated nc-SiCx(p) sample, shows a higher H-effusion with respect to after firing proving that H is indeed reintroduced. Additionally, the effusion signal exhibits a weak LT peak at ~350° C. and a slight increase towards higher temperatures. Such LT effusion process is shifted towards higher temperature compared to the one in the as-deposited state. This effect might be explained by two phenomena: hydrogen is mainly reintroduced at SiOx/Si interface and possibly forms O—H bonds that are more thermally stable than Si—H; and/or the more compact network of the nc-SiCx(p) compared to the as deposited a-SiCx(p):H, limiting H2 effusion rate.

The effect of light soaking was also investigated. A remarkable character for symmetrical samples is that they show an improvement of the surface passivation quality after light exposure.

Three samples with SiCx(p) layers with flow ratio of 0.78 and 0.18 with and without Si(i) as buffer layer were light soaked at 1 sun illumination. After light soaking the samples were stored in dark for 1 month. As FIG. 36 clearly indicates, $\tau_{\mathit{eff}}$ and i-Voc strongly increases after the first 2 seconds of light soaking. For longer exposure time no substantial changes in the surface passivation is observed. After storing the samples in the dark for one month, $\tau_{\mathit{eff}}$ and i-Voc were mostly unchanged.

Therefore, the light soaking effect is most likely to affect the density of charges at SiOx/Si during illumination. In more detail, dangling bonds at SiOx/Si interface lead to trap states. Their energy distribution consists of two different peaks located within the Si band gap. In particular, traps energetically located above the energy of the intrinsic Fermi in Si ($E_{fi}$) level can act as donor state, and are neutral when empty, and negatively charged when filled by an electron. On the contrary, trap states located at energies below $E_{fi}$, act as acceptor states and positive when empty, and neutral when filled by an electron. This makes the charge state of the interfacial traps to be dependent on the Fermi level position. For the FlaSH contact of the invention, empty donor states and H2+ at Si/SiOx interface are responsible for positive charges. Such positive fixed charges attract electrons towards the interface increasing the Shockley-red-hall recombination rate. Electrons injected during illumination can fill empty donor states of deactivate H2+ reducing the density of fixed charges which results in a beneficial band bending.

This light soaking effect also indicates that the band-bending provided by the work function of the SiCx(p) and fixed charges is stronger than the one provided by the ultra-shallow doping in-diffusion region. The change of surface band bending before and after light soaking was also measured by surface photo voltage measurements as reported in FIG. 42. From such measurements can be derived that after light soaking, the density of positive fixed charges decreases.

Figure 38A:
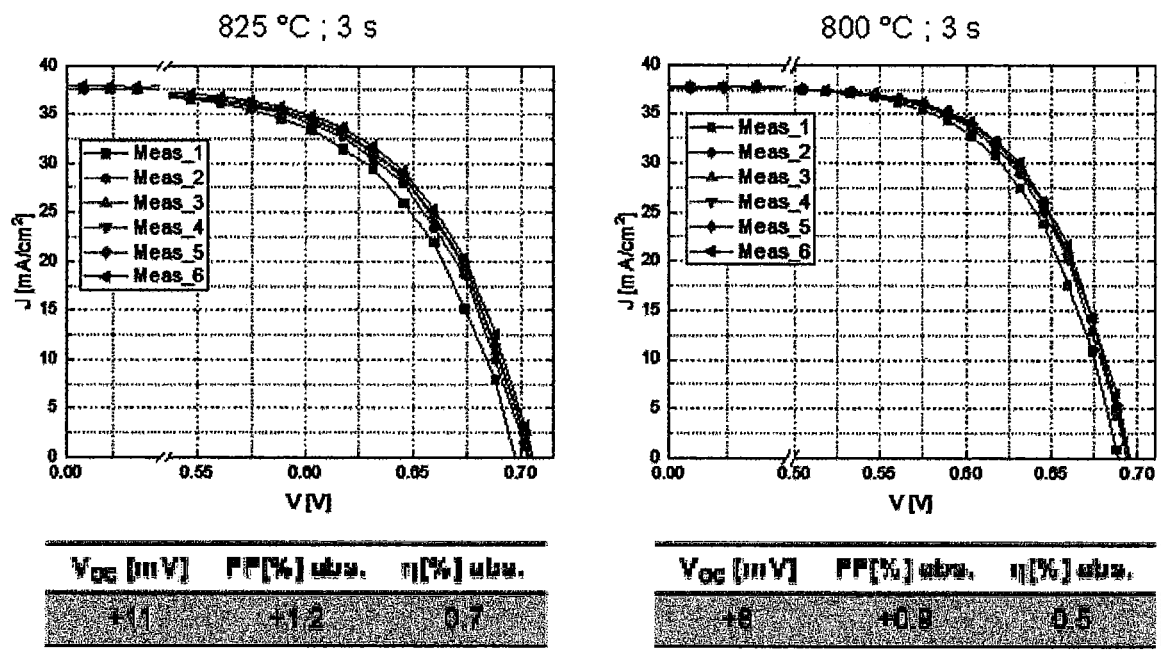
Figure 38B:
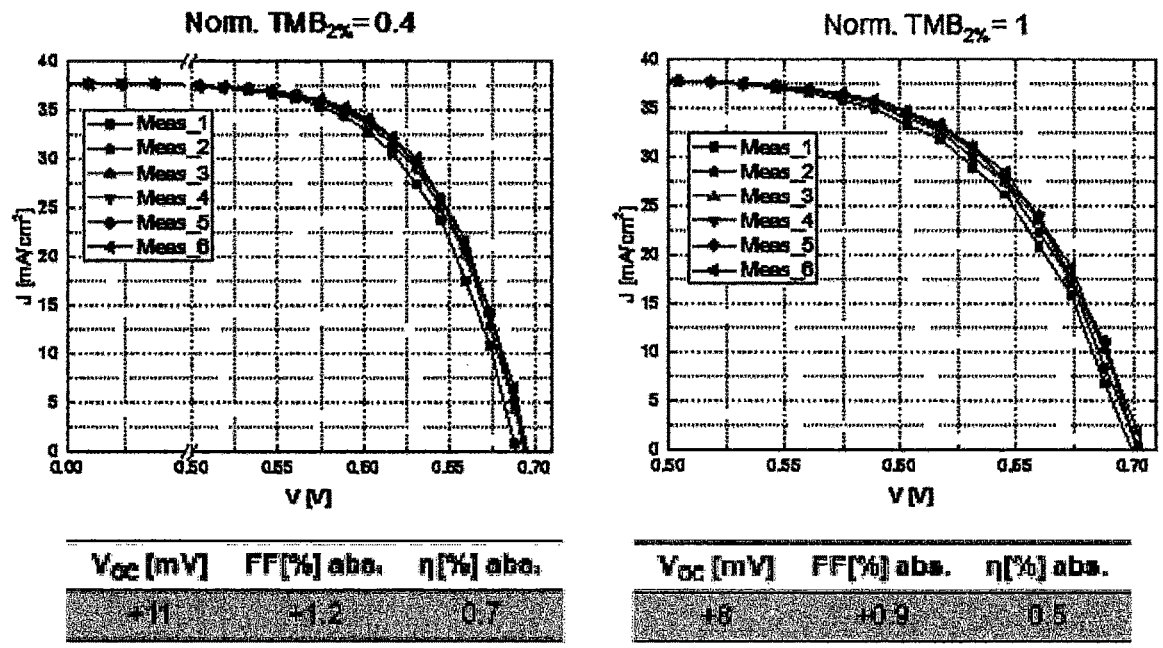
Figure 38C:
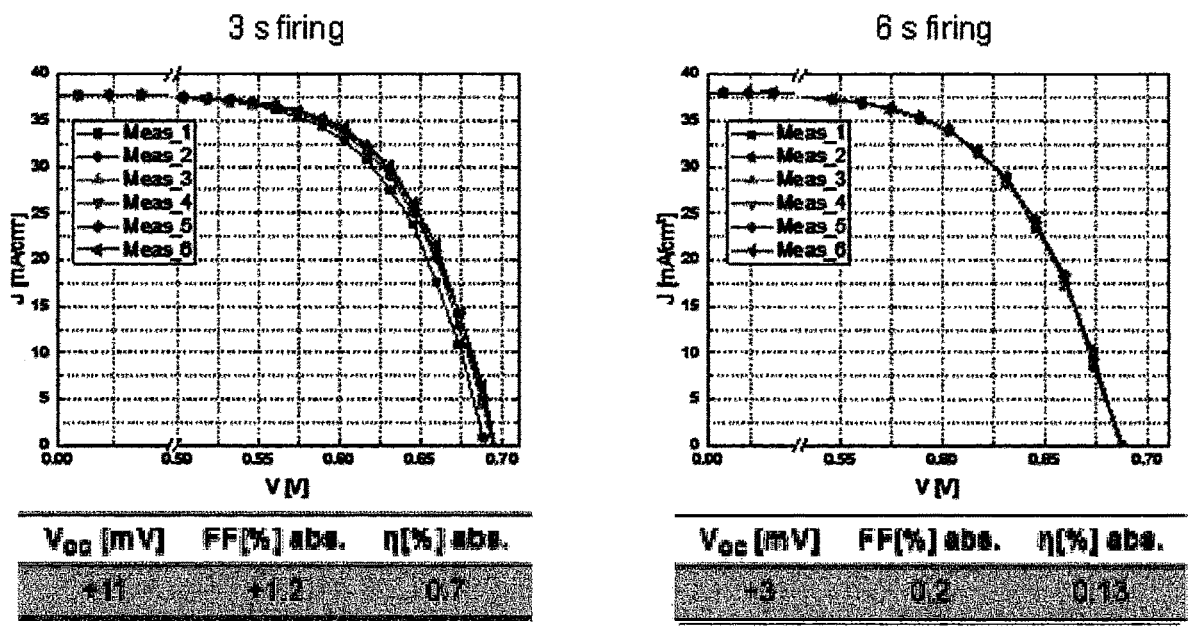
Figure 38D:
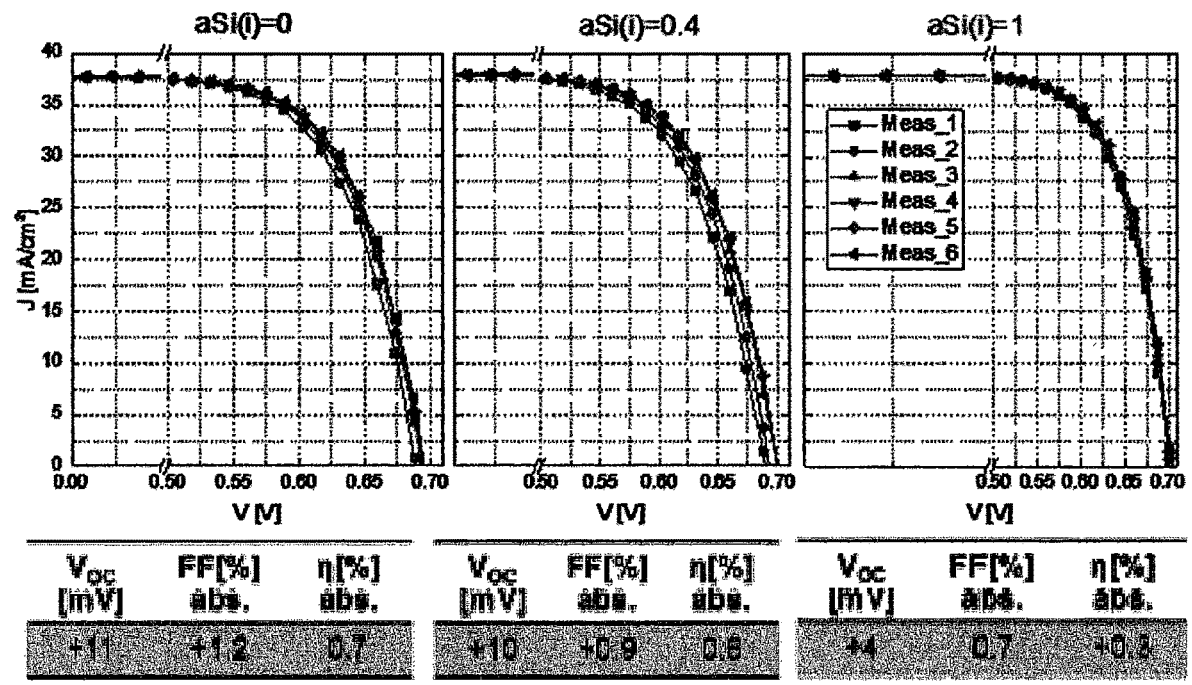

Hybrid solar cells demonstrators were built to show the working potential of the FlaSH heterojunction contact of the present invention, including hybrid cells involving single stack SiCx(B) (FIG. 37A) or a-Si(i)/SiCx(B) (FIG. 37B) as hole selective contact on the rear side and involving a-Si(i):H/a-Si(n):H as front side emitter. FIG. 38C represents J-V measurements of the hybrid cells involving single stack SiCx(B) or a-Si(i)/SiCx(B) as hole selective fired contact on the rear side. Table 2 below shows a summary of the external parameters of the hybrid cells in each case:

TABLE 2

|  | $J_{SC}$ [mA/cm$^2$] | $V_{OC}$ [mV] | FF [%] | η [%] | p-FF [%] |
|---|---|---|---|---|---|
| nc-SiC$_x$(p) | 38.3 | 697 | 79.6 | 21.3 | 81.6 |
| nc-Si(i)/nc-SiC$_x$(p) | 38.2 | 705 | 78.5 | 21.1 | 81.8 |

Light soaking of the hybrid cells was conducted at 1-sun illumination by consecutive measurements with sun simulator. As shown in FIG. 38 A-D, for solar cells a strong increase of the Voc is observed after 6 consecutive measurements under AM 1.5 conditions. This result is in line with the results already obtained on symmetrical samples, see FIG. 36. In addition to the Voc increase the cells also showed an increase of the FF. As previously discussed, it is considered that the density of positive charges at Si/SiOx is reduced after illumination. This effect, leads to an increases of the potential barrier for the electrons and thus reducing their recombination rate and at the same time decreases the potential barrier for the holes thus better transport.

The effect of the peak firing temperature (i.e. 800 and 850° C.) for the single SiCx(p) with normalized flow ration of 0.18 and constant firing time of 3 sec was evaluated on hybrid cells and is presented in FIG. 43. The final conversion efficiency was found to be quite stable with the peak firing temperature. In FIG. 44 we report the impact of the sputtering damage evaluated by PLI, the device fabricated at lower temperature showed a lower sputtering damage before and after curing of the ITO (i,e, annealing at 210° C. for 30 min).

The effect of the layer doping expressed by the normalized to the max value of the TMB$_{2\%}$ for the single SiCx(p) with normalized flow ration of 0.18 fired at 800° C. for 3 sec was evaluated on hybrid cells and is presented in FIG. 45. The final conversion efficiency was found to increase with the normalized TMB$_{2\%}$. In FIG. 46 we report the impact of the sputtering damage evaluated by PLI, the device with higher TMB$_{2\%}$ showed a lower sputtering damage before and after curing.

The effect of the peak firing time (i.e. 3 and 6 sec) for the single SiCx(p) with normalized flow ration of 0.18 and constant firing peak temperature of 800° C. was evaluated on hybrid cells and is presented in FIG. 47. The final conversion efficiency was found to be quite stable with the peak firing time. In FIG. 48 we report the impact of the sputtering damage evaluated by PLI, both devices showed similar sputtering damage before and after curing of the ITO (i,e, annealing at 210° C. for 30 min).

The effect of the thickness of the intrinsic buffer layer expressed by the normalized to the max value of the deposition time for the bilayer nc-Si(i)/nc-SiCx(p) with normalized flow ration of 0.18 fired at 800° C. for 3 sec was evaluated on hybrid cells and is presented in FIG. 49. The final conversion efficiency was found to increase towards thicker buffer layer. In FIG. 46 we report the impact of the sputtering damage evaluated by PLI, the device with intrinsic buffer layer showed a lower sputtering damage before and after curing. In conclusion doping, firing process and buffer layer also play a role on the sputtering damage of the heat resistant-heterojunction. In FIG. 53 alternative process fabrication of the heat resistant heterojunction including hydrogenation during firing from a capping layer is shown. The results of the single and bilayer stack with bilayer with normalized flow ratio of the SiCx(p) of 0.18 of the fired heat resistant heterojunction fabricated according to the process sketched in FIGS. 29 and 52, respectively are shown in Table 3. Similar i-VOC could be reached for both layers and both processes, however, having the hydrogenation included during the firing process has the advantage of further reducing process complexity. Additionally the C-content of one of the layers composing the heat resistant heterojunction can be optimized in order to prevent Ag-frit penetration during firing.

TABLE 3

| Processed according to: | Layer stack | i-V$_{OC}$ [mV] |
|---|---|---|
| FIG. 29 | nc-SiCx(p) | 705 |
| FIG. 29 | nc-Si(i)/nc-SiCx(p) | 715 |
| FIG. 51 | nc-SiCx(p) | 700 |
| FIG. 51 | nc-Si(i)/nc-SiCx(p) | 716 |

FlaSH Cell Integration

Industrial p-PERC solar cells are typically fabricated according to the process reported in top panel of FIG. 52. After texturing and cleaning of the wafer, an emitter is fabricated by phosphorous diffusion followed by SiNx:H deposition on serving as surface passivation and antireflection. A Si etch-back of the rear side including also a planarization of the rear surface is then performed. For simplicity, this step is not reported in the fabrication sequence. The structure of the resulting cell precursor is depicted in step 1 of FIG. 52. Next, a dielectric layer (or stack of dielectrics) is deposited on the rear side, see steps 2, and subsequently patterned as sketched in step 3. After screen-printing of Ag and Al pastes, respectively on the front and rear side of the cell (steps 4 and 5), a firing step is applied (step 6). Upon firing, the front Ag-based paste sinters through the SiNx:H and establishes electrical contacts with the underlying emitter, while on the rear side local Al-doped Si regions are formed (step 6). As already discussed in the FlaSH represents an evolutionary upgrade of the rear side contact of a PERC cell as it can be integrated with only few changes of the existing process flow. As depicted in the bottom panel of FIG. 52, the process flow of an industrial cell architecture employing the FlaSH contact on the rear side, employs the same cell precursor as for standard p-PERC (see step 1). The growth of the thin SiOx can be performed during a cleaning step in hot HNO3 performed after rear side planarization. Afterwards, the SiCx(p)-based forming the FlaSH contact is deposited via PECVD on the rear side (step 2.a). Because the FlaSH contact combines the functionalities of passivation and charge carrier transports, patterning of the rear contact is unnecessary. An Ag-based grid is then screen-printed on the front side (step 3.a), and the solar cell is then fired. As result an electrical contacts between the Ag paste and the front emitter is established while on the rear side crystallization of the FlaSH contact takes (a-SiCx(p):H partially crystalizes into a nc-SiCx(p)) as depicted in step 4.a. Hydrogenation is then carried out in order to enhance surface passivation (step 5.a) and alternatively can be performed during the firing process. Finally, the rear side could be metallized by screen-printing of Al paste or with a low cost TCO/metal stack (step 6.a).

The investigation of the optimal deposition conditions of the hole-selective contact was done on symmetrical test structures fabricated according to the process flow presented in FIG. 29. Boron doped float zone (FZ) 4-inch silicon wafers shiny etched, (100) oriented, with thickness of 250 µm and resistivity ~2 Ω·cm were used. After cleaning using standard wet chemistry, a thin $SiO_x$ layer (~1.2 nm) was grown by wet chemical oxidation in hot nitric acid also referred to as "chemical $SiO_x$". Afterwards, a-$SiC_x$(B):H or bilayer a-Si(i):H/a-$SiC_x$(B):H were deposited via plasma enhanced chemical vapor deposition (PECVD) on both sides of the wafer. A rapid thermal annealing process (RTA) emulating the firing process of industrial c-Si solar cells was applied. After the firing process, all samples were coated on both side with a hydrogen donor layer deposited via PECVD. The effective minority carrier lifetime was measured by photo-conductance decay (PCD) and the method of Kane and Swanson was applied to extract the emitter saturation current density at an excess carrier density of $10^{16}$ $cm^{-3}$. The spatial homogeneity of the passivation was analyzed using photoluminescence imaging (PLI). For electrical characterization, coplanar ITO/Ag contacts were sputtered, and the specific contact resistivity was measured using TLM.

Hybrid c-Si solar cells employing conventional silicon heterojunction on the front side and the fired hole selective contact on the rear side were fabricated. The process flow of the fabricated solar cell is shown in FIG. 29. For the fabricated device we used FZ p-type wafers with resistivity ~2 Ω·cm. Single side surface texturing was performed by using a sacrificial SiNx layer on the rear side. As the figure clearly describes, after cleaning and chemical oxidation, the a-$SiC_x$(B):H or the bilayer a-Si:H/a-$SiC_x$(B):H where deposited via PECVD deposition. Solar cells were then fired at T=800° C. for 3 seconds, and hydrogenation as described in the previous section was employed. After stripping of the hydrogen donor layer in wet chemical solution, wafers were cleaned. Front side heterojunction formed by a-Si(i):H/a-Si (n):H was deposited on the front side by means of PECVD. Transparent conductive oxide (ITO) was sputtered on both sides of the wafers in order to enhance lateral conductivity and optics (i.e. antireflection coating and internal rear reflectance) of the solar cells. Finally, Ag was sputtered on the full rear side, while Ag metal fingers were screen printed on the front side. Solar cell I-V measurements were performed by using a Wacom solar simulator calibrated with reference cells measured at Fraunhofer ISE.

The invention claimed is:

1. A heterojunction solar cell comprising:
a first electrode layer,
a second electrode layer comprising a metallic contact layer,
a light-absorbing silicon layer, and
a passivating and conductive stack arranged between said light-absorbing silicon layer and at least one of the first and second electrode layers,
wherein said passivating and conductive stack comprises a wide band gap material layer having an electronic band gap greater than 1.4 eV and at least one doped silicon-based layer,
wherein said wide band gap material layer being applied on a surface of the light-absorbing silicon layer between said light-absorbing silicon layer and said at least one doped silicon-based layer to form a heat-resistant heterojunction,
wherein said heat resistant heterojunction being arranged for at least maintaining its passivating and conductive properties after thermal treatment thereof above 600° C.,
wherein an interface between said passivating and conductive stack and the light-absorbing silicon layer has a very abrupt distribution of doping profile in which the intensity of dopants in said light-absorbing silicon layer decays over at least one order of magnitude within a distance of less than 5 nm from said interface, and
wherein said passivating and conductive stack and thermal treatment being configured to prevent dopants from diffusing from the passivating and conductive stack to the light-absorbing silicon layer.

2. The solar cell according to claim 1, wherein the wide band gap material layer has a thickness of at most 20 nm, preferably between 0.5 and 2 nm.

3. The solar cell according to claim 1, wherein said wide band gap material layer comprises any of the following materials: $SiO_x$, $SiC_x$, $AlO_x$, $HfO_x$, $AlHfO_x$, AlN, TiN, $SiN_x$.

4. The solar cell according to claim 1, wherein said doped silicon-based layer has an atomic hydrogen concentration of less than 5%, defined as the number of hydrogen atoms per unit volume divided by the total number of all atoms per unit volume of the doped silicon-based layer.

5. The solar cell according to claim 1, wherein said doped silicon-based layer is a doped-silicon carbide based layer $SiC_x$.

6. The solar cell according to claim 2, characterized in that it further comprises at least one buffer layer arranged between said wide band gap material layer and said doped silicon-based layer, said buffer layer being arranged to tune the density of dopants diffusing from the silicon-doped layer into the wide band gap material layer and light absorbing silicon layer.

7. The solar cell according to claim 6, wherein said buffer layer is made of at least one of the materials chosen among a silicon layer Si, $SiC_x$, $SiN_x$, $SiO_x$, $SiC_xN_y$, $SiC_xO_y$, $SiN_xO_y$, $SiC_xN_yO_z$ or a combination thereof.

8. The solar cell according to claim 1, wherein a transparent conductive oxide layer is arranged between said doped silicon layer and said metallic layer.

9. The solar cell according to claim 1, wherein the surface of the light absorbing silicon layer whereupon the wide band gap material layer is applied is structured.

10. The solar cell according to claim 9, wherein said wide band gap material layer comprises through-holes extending from a first surface to a second surface.

11. The solar cell according to claim 1, wherein a capping layer is arranged between said doped silicon-based layer and said metallic contact layer.

12. The solar cell according claim 1, wherein the first electrode layer is a front layer and the second electrode layer is a back layer, said light absorbing silicon layer, said doped silicon-based layer and said wide band gap layer being arranged between said first and second electrode layers.

13. The solar cell according to claim 1, wherein the first and the second electrode layers are arranged on a same one side of said light absorbing silicon layer.

14. The solar cell according to claim 11, wherein the passivating and conductive stack and/or the capping layer comprise(s) passivating species to passivate defects within the said passivating and conductive stack and/or at the interface between said passivating and conductive stack and said light absorbing silicon layer, said passivating species being releasable upon said thermal treatment.

15. A heterojunction solar cell comprising:
a first electrode layer,
a second electrode layer comprising a metallic contact layer,
a light-absorbing silicon layer, and
a passivating and conductive stack arranged between said light-absorbing silicon layer and at least one of the first and second electrode layers,
wherein said passivating and conductive stack comprises a wide band gap material layer having an electronic band gap greater than 1.4 eV and at least one doped silicon-based layer,
wherein said wide band gap material layer being applied on a surface of the light-absorbing silicon layer between said light-absorbing silicon layer and said at least one doped silicon-based layer to form a heat-resistant heterojunction,
wherein said heat-resistant heterojunction being arranged for at least maintaining its passivating and conductive properties after thermal treatment thereof above 600° C.,
wherein the light-absorbing silicon layer comprises a doped region with sheet resistance between 1 and $10^5$ ohm/square at an interface between said passivating and conductive stack and the light-absorbing silicon layer,
wherein said doped region being obtained by diffusion of dopants from any of the layers forming the passivating and conductive stack into to the light-absorbing silicon layer during said thermal treatment,
wherein the wide band gap material layer has a thickness of at most 20 nm,
wherein said wide band gap material layer comprises $SiO_x$, $SiC_x$, $AlO_x$, $HfO_x$, $AlHfO_x$, AlN, TiN or $SiN_x$,
wherein said at least one doped silicon-based layer has an atomic hydrogen concentration of less than 5%, defined as the number of hydrogen atoms per unit volume divided by the total number of all atoms per unit volume of the at least one doped silicon-based layer,
wherein said heterojunction solar cell further comprises at least one buffer layer arranged between said wide band gap material layer and said at least one doped silicon-based layer,
wherein said at least one buffer layer being arranged to tune the density of dopants diffusing from the at least one doped silicon-based layer into the wide band gap material layer and the light-absorbing silicon layer,
wherein said at least one buffer layer is made of at least one material chosen from Si, $SiC_x$, $SiN_x$, $SiO_x$, $SiC_xN_y$, $SiC_xO_y$, $SiN_xO_y$, $SiC_xN_yO_z$ or a combination thereof,
wherein said at least one doped silicon-based layer is a doped-silicon carbide based layer $SiC_x$, and
wherein said at least one doped silicon-based layer further comprises fluorine.

16. A method for manufacturing a solar cell according to claim 1, comprising the steps of:
Providing a light absorbing silicon layer, and
Forming a passivating and conductive stack on a surface of the light absorbing silicon layer, said passivating and conductive stack comprising a wide band gap material layer deposited on a surface of the light absorbing silicon layer and a doped silicon based layer on said wide band gap material layer, arranged between said doped silicon-based layer and said metallic contact layer and,
thermally treating the passivating and conductive stack at above 600° C., in order to releases passivating species from the said passivating and conductive stack and/or at an interface between said passivation stack and said light absorbing silicon layer.

17. A method according to claim 16, wherein the thermal treatment comprises a firing step at temperatures above 600° C. and with at temperature ramp rates of more than 20° C./s and dwell time at maximum temperature below 10 s.

18. A method according to claim 16, wherein the wide band gap material layer is made of $SiO_x$ deposited via chemical, plasma, gas-phase or light-excited methods, with x being chosen between 0.5 and 2.

19. A method according to claim 16, wherein further comprising the steps of:
forming a capping layer between said doped silicon-based layer of the passivating and conductive stack and said metallic contact layer; and
thermally treating the passivating and conductive stack and the capping layer in order to release passivating species from any of the passivating and conductive stack and the capping layer to passivate defects within the said passivating and conductive stack and/or at the interface between said passivating and conductive stack and said light absorbing silicon layer.

20. A method for manufacturing a solar cell according to claim 15, comprising the steps of:
Providing a light absorbing silicon layer, and
Forming a passivating and conductive stack on a surface of the light absorbing silicon layer, said passivating and conductive stack comprising a wide band gap material layer deposited on a surface of the light absorbing silicon layer and a doped silicon based layer on said wide band gap material layer, arranged between said doped silicon-based layer and said metallic contact layer and,
thermally treating the passivating and conductive stack at above 600° C., in order to releases passivating species from the said passivating and conductive stack and/or at an interface between said passivation stack and said light absorbing silicon layer.

21. A method according to claim 20, wherein the thermal treatment comprises a firing step at temperatures above 600° C. and with at temperature ramp rates of more than 20° C./s and dwell time at maximum temperature below 10 s.

22. A method according to claim 20, wherein the wide band gap material layer is made of $SiO_x$ deposited via chemical, plasma, gas-phase or light-excited methods, with x being chosen between 0.5 and 2.

23. A method according to claim 20, wherein further comprising the steps of:
forming a capping layer between said doped silicon-based layer of the passivating and conductive stack and said metallic contact layer; and
thermally treating the passivating and conductive stack and the capping layer in order to release passivating species from any of the passivating and conductive stack and the capping layer to passivate defects within the said passivating and conductive stack and/or at the interface between said passivating and conductive stack and said light absorbing silicon layer.

* * * * *